(12) United States Patent
Liang et al.

(10) Patent No.: US 12,520,559 B2
(45) Date of Patent: Jan. 6, 2026

(54) SEMICONDUCTOR DEVICE

(71) Applicant: Taiwan Semiconductor Manufacturing Company, Ltd., Hsinchu (TW)

(72) Inventors: Chia Ming Liang, Taipei (TW); Chih-Pin Tsao, Hsinchu County (TW); Ting-Huan Hsieh, Hsinchu (TW); Ta-Wei Lin, Chiayi County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 717 days.

(21) Appl. No.: 17/891,097

(22) Filed: Aug. 18, 2022

(65) Prior Publication Data

US 2024/0063287 A1 Feb. 22, 2024

(51) Int. Cl.
*H10D 64/66* (2025.01)
*H01L 21/28* (2025.01)
*H10D 30/01* (2025.01)
*H10D 30/62* (2025.01)

(52) U.S. Cl.
CPC ..... *H10D 64/667* (2025.01); *H01L 21/28088* (2013.01); *H10D 30/024* (2025.01); *H10D 30/6211* (2025.01)

(58) Field of Classification Search
CPC .. H10D 30/62; H10D 30/6211; H10D 30/024; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 64/017; H10D 84/853; H10D 84/0193; H01L 21/8238; H01L 2924/13067; H01L 27/092; H01L 21/28088; H10B 12/36; H10B 12/056
See application file for complete search history.

(56) References Cited

U.S. PATENT DOCUMENTS

| | | | |
|---|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |

(Continued)

*Primary Examiner* — Wael M Fahmy
*Assistant Examiner* — Thomas Wilson McCoy
(74) *Attorney, Agent, or Firm* — JCIPRNET

(57) ABSTRACT

A semiconductor device includes a substrate, an interlayer dielectric layer, spacer structures, a gate insulating layer, a first work function metal layer and a metal gate. The interlayer dielectric layer is disposed above the substrate. The spacer structures are located in a trench of the interlayer dielectric. The gate insulating layer is disposed between inner sidewalls of the spacer structures. The gate insulating layer includes a first region doped with dipole dopant and second regions without the dipole dopant. The first region is connected with the second regions. The first region is horizontally located between the first work function metal layer and the spacer structures. The metal gate is disposed above the first work function metal layer. The metal gate is disposed between and in contact with the second regions.

20 Claims, 47 Drawing Sheets

(56) References Cited

U.S. PATENT DOCUMENTS

| | | |
|---|---|---|
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 10,304,835 B1 * | 5/2019 | Tsai .................. H01L 21/02318 |

* cited by examiner

SEMICONDUCTOR DEVICE

BACKGROUND

As the semiconductor devices keep scaling down in size, three-dimensional multi-gate structures, such as the fin-type field effect transistor (FinFET), have been developed to replace planar CMOS devices. A characteristic of the FinFET device lies in that the structure has one or more silicon-based fins that are wrapped around by the gate to define the channel of the device. The gate wrapping structure further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 26A are perspective views illustrating various stages of a method of manufacturing a semiconductor device in accordance with some embodiments of the disclosure.

FIG. 1B to FIG. 26B are cross-sectional views illustrating various stages of the method of manufacturing the semiconductor device in accordance with some embodiments of the disclosure.

DETAILED DESCRIPTION

Figure 1A:
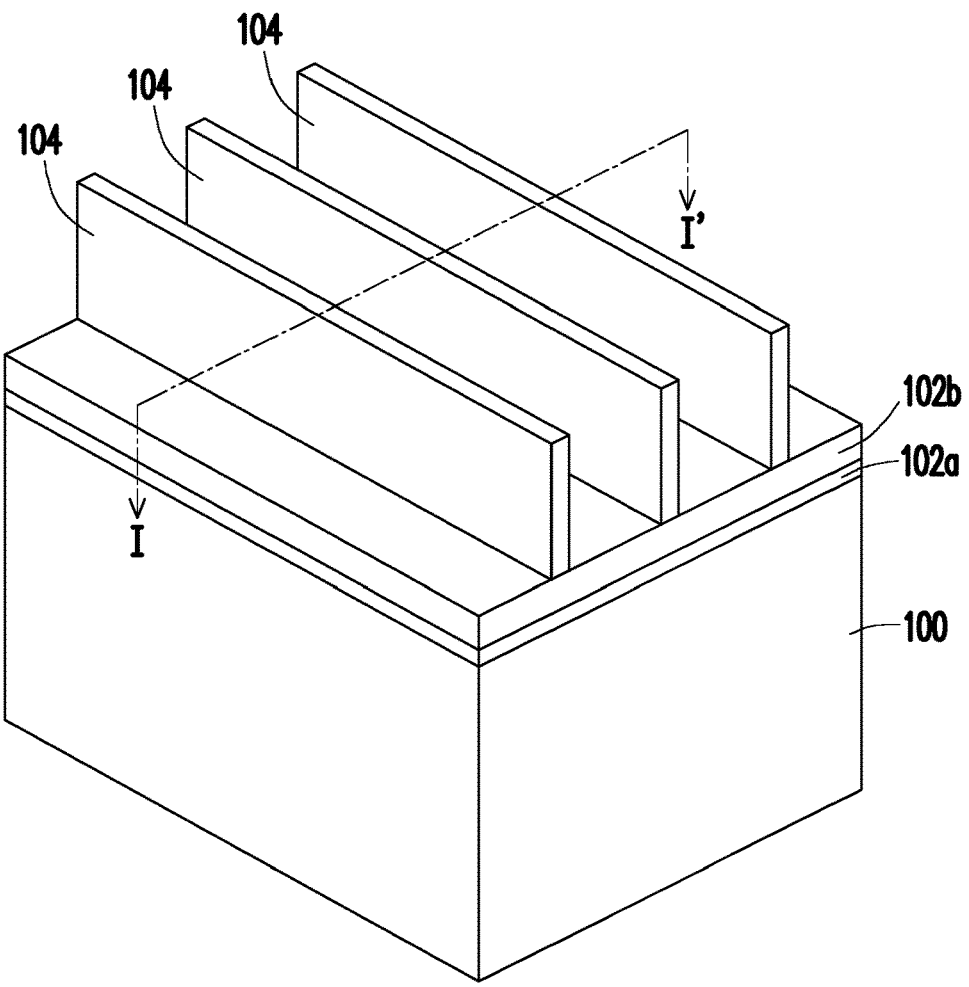

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A to FIG. 26A are perspective views illustrating various stages of a method of manufacturing a semiconductor device 10 in accordance with some embodiments of the disclosure. FIG. 1B to FIG. 26B are cross-sectional views illustrating various stages of the method of manufacturing the semiconductor device 10 in accordance with some embodiments of the disclosure.

Figure 1B:
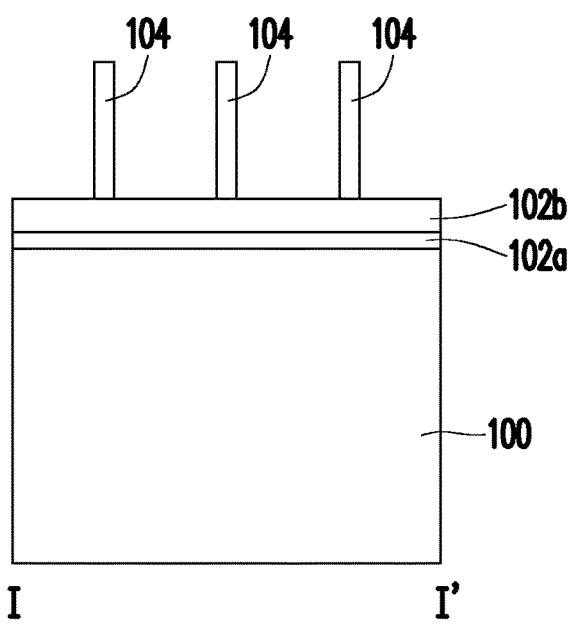

FIG. 1B is a cross-sectional view taken along line I-I' of FIG. 1A. Referring to FIG. 1A and FIG. 1B, a semiconductor substrate 100 is provided. In some embodiments, the semiconductor substrate 100 may be a bulk semiconductor substrate, a semiconductor-on-insulator (SOI) substrate, or the like. Generally, an SOI substrate is a layer of a semiconductor material formed on an insulator layer. The insulator layer may be, for example, a buried oxide layer, a silicon oxide layer, or the like. The insulator layer is provided on a substrate, typically a silicon or glass substrate. Other substrates, such as a multi-layered or gradient substrate, may also be used.

In some embodiments, the semiconductor substrate 100 includes a crystalline silicon substrate (e.g., wafer). In some alternative embodiments, the semiconductor substrate 100 may be made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP. The semiconductor substrate 100 may include various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or $BF_2$; n-type dopants, such as phosphorus or arsenic; and/or a combination thereof. Depending on the dopant type, an n-type FinFET or a p-type FinFET may be formed on the semiconductor substrate 100 in the subsequent processes. In some embodiments, the dopant concentration in various doped regions may be different.

In some embodiments, a pad layer 102a and a mask layer 102b are sequentially formed on the semiconductor substrate 100. The pad layer 102a may be a silicon oxide thin film formed by, for example, a thermal oxidation process. In some embodiments, the pad layer 102a may act as an adhesion layer between the semiconductor substrate 100 and the mask layer 102b. In some embodiments, the pad layer 102a may also act as an etch stop layer for etching the mask layer 102b. In some embodiments, the mask layer 102b may be a silicon nitride layer formed by low-pressure chemical vapor deposition (LPCVD) or plasma enhanced chemical vapor deposition (PECVD). In some alternative embodiments, the mask layer 102b may be formed by thermal nitridation of silicon. The mask layer 102b is used as a hard mask during subsequent photolithography processes. A patterned photoresist layer 104 having a predetermined pattern is formed on the mask layer 102b.

Figure 2A:
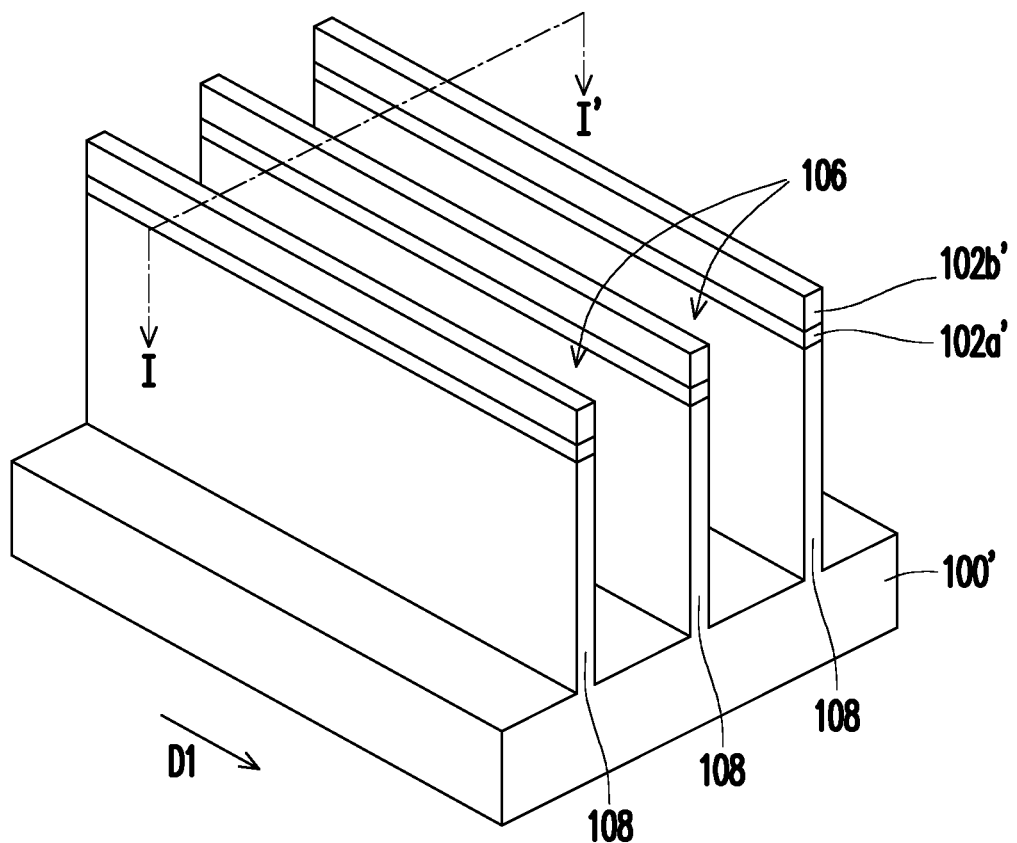
Figure 2B:
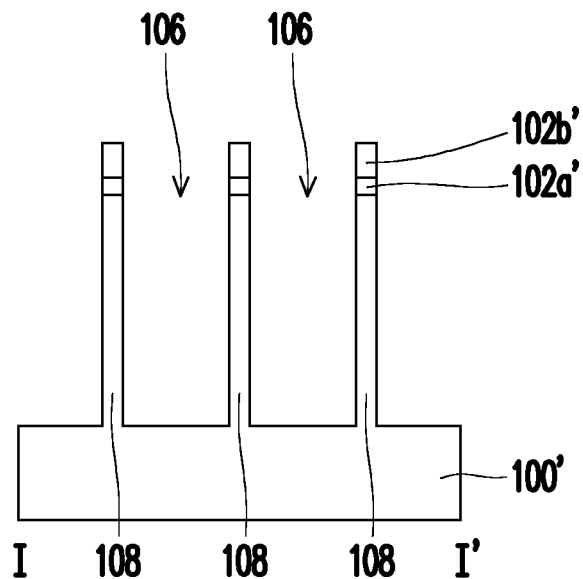

FIG. 2B is a cross-sectional view taken along line I-I' of FIG. 2A. Referring to FIG. 2A and FIG. 2B, portions of the mask layer 102b and the pad layer 102a not covered by the patterned photoresist layer 104 are sequentially etched to form a patterned mask layer 102b' and a patterned pad layer 102a'. The patterned mask layer 102b' and the patterned pad layer 102a' expose the underlying semiconductor substrate 100. By using the patterned mask layer 102b', the patterned pad layer 102a', and the patterned photoresist layer 104 as a mask, exposed portions of the semiconductor substrate 100 are etched to form a plurality of trenches 106 and define a plurality of semiconductor fins 108 located between the trenches 106. In some embodiments, the semiconductor substrate 100 may be etched (or patterned) through an anisotropic etching process to form the trenches 106. For example, the semiconductor substrate 100 may be etched through a reactive ion etch (RIE), a neutral beam etch (NBE), the like, or a combination thereof. In some embodiments, the fins 108 are formed from the semiconductor substrate 100, and the fins 108 and the semiconductor substrate 100 are made of the same material. After the etching process, the patterned semiconductor substrate 100' is formed with the semiconductor fins 108 upright-protruded there-from, and the semiconductor fins are extending along a first direction D1 (as shown in FIG. 2A). Although FIG. 2B illustrated that the semiconductor fins 108 have vertically straight profiles, the configuration merely serves as an exemplary illustration. In some embodiments, the semiconductor fins 108 may have non-straight profile(s). In other words, in some embodiments, the semiconductor fins 108 have slanted sidewalls or partially slanted sidewalls. In some embodiments, P wells (not shown) or N wells (not shown) may be formed in the semiconductor fins 108 or the semiconductor substrate 100'.

After the trenches 106 and the semiconductor fins 108 are formed, the patterned photoresist layer 104 is removed. Thereafter, a cleaning process may be performed to remove native oxides of the semiconductor substrate 100' and the semiconductor fins 108. The cleaning process may be performed using diluted hydrofluoric (DHF) acid or other suitable cleaning solutions.

Figure 3A:
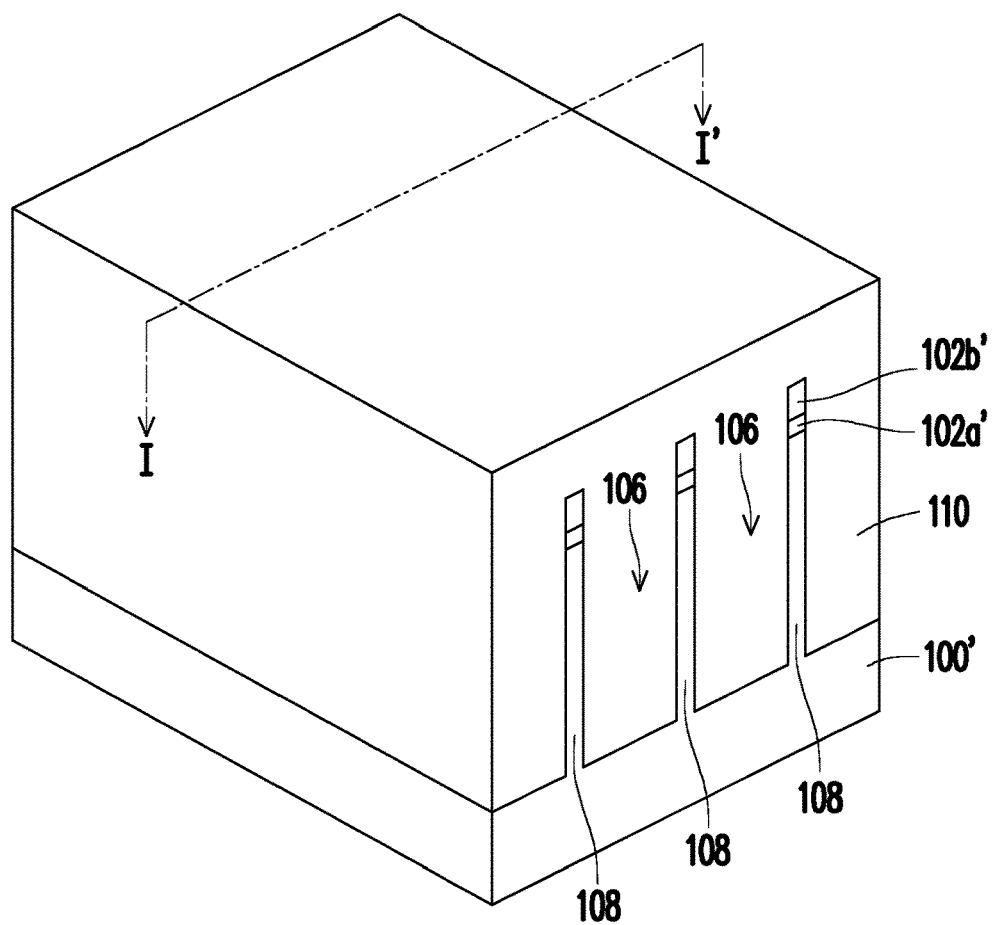
Figure 3B:
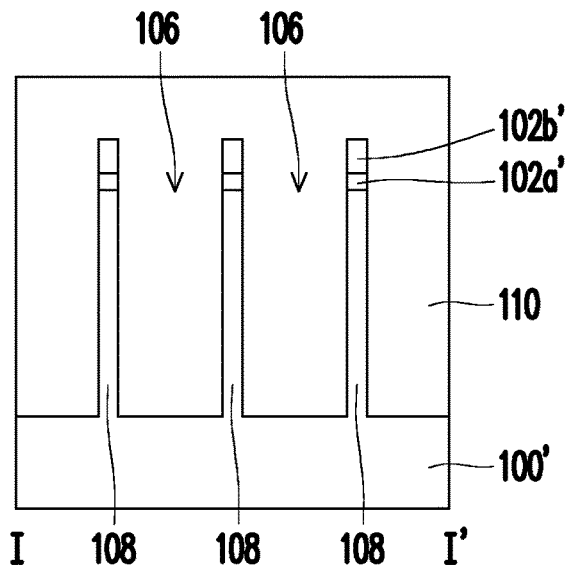

FIG. 3B is a cross-sectional view taken along line I-I' of FIG. 3A. Referring to FIG. 3A and FIG. 3B, an insulating material 110 is formed over the semiconductor substrate 100'. In some embodiments, the insulating material 110 fills up the trenches 106 and covers the semiconductor fins 108, the patterned pad layer 102a', and the patterned mask layer 102b'. The insulating material 110 may include silicon oxide, silicon nitride, silicon oxynitride, a spin-on dielectric material, or other dielectric materials. The insulating material 110 may be formed by high density plasma chemical vapor deposition (HDPCVD), sub atmospheric chemical vapor deposition (SACVD), spin-on, or other suitable processes.

Figure 4A:
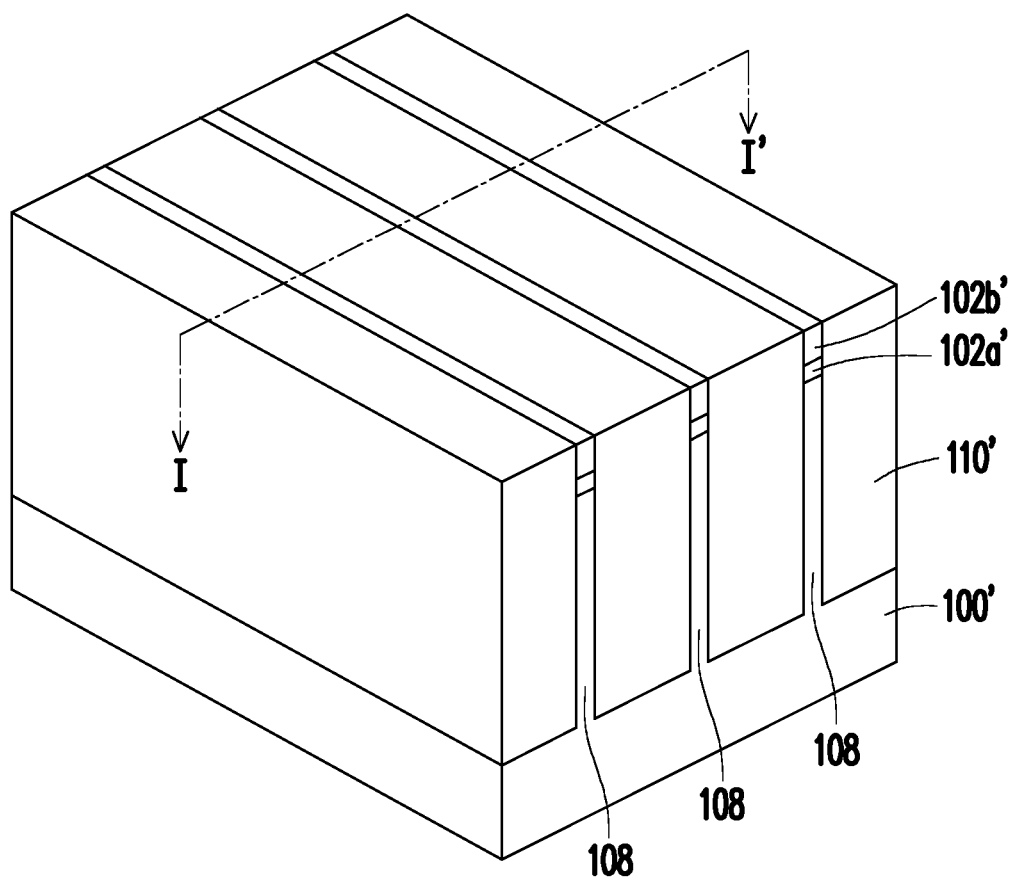
Figure 4B:
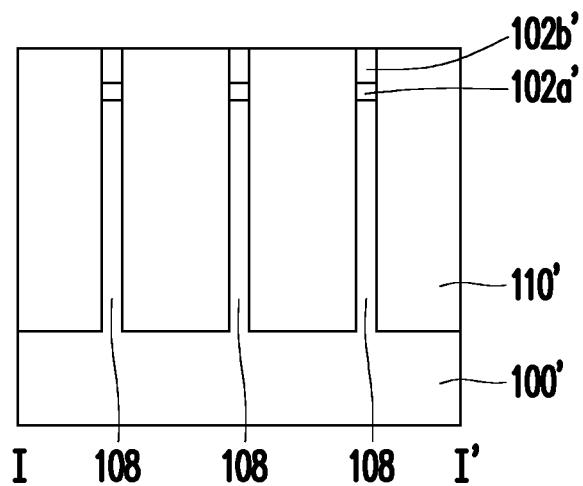

FIG. 4B is a cross-sectional view taken along line I-I' of FIG. 4A. Referring to FIG. 4A and FIG. 4B, a planarization process is performed on the insulating material 110. In some embodiments, a portion of the insulating material 110 is removed to form a polished insulating material 110'. The planarization process includes, for example, a chemical mechanical polish (CMP) process, an etch back process, combinations thereof, or the like. In some embodiments, after the insulating material 110 is planarized, a top surface of the polished insulating material 110' is substantially coplanar with a top surface of the patterned mask layer 102b'. In other words, the top surfaces of the semiconductor fins 108 are protected by the patterned pad layer 102a' and the patterned mask layer 102b' and are not revealed.

Figure 5A:
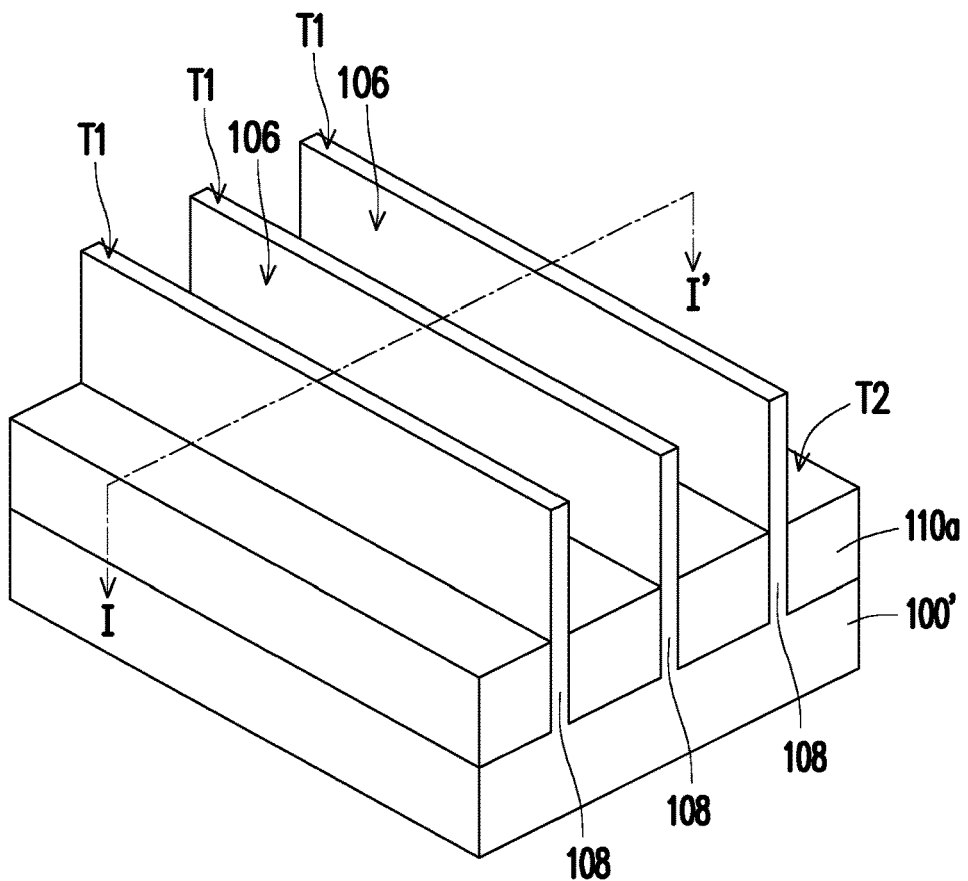
Figure 5B:
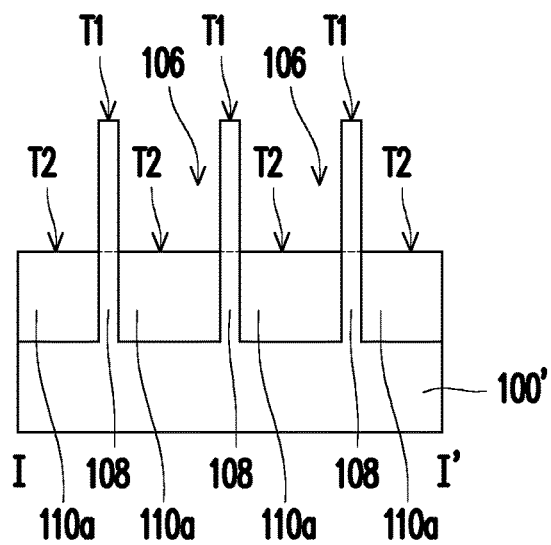

FIG. 5B is a cross-sectional view taken along line I-I' of FIG. 5A. Referring to FIG. 5A and FIG. 5B, the polished insulating material 110' filled in the trenches 106 is partially removed by an etching process to form a plurality of insulators 110a in the trenches 106. In some embodiments, the polished insulating material 110' may be etched off by a wet etching process with hydrofluoric acid (HF). Alternatively, the polished insulating material 110' may be etched off by a dry etching process with $HF_3$ and $NH_3$ gases. During the dry etching process, plasma may be generated and Argon may also be included. As illustrated in FIG. 5A and FIG. 5B, each semiconductor fin 108 is sandwiched between two adjacent insulators 110a. In some embodiments, top surfaces T2 of the insulators 110a are lower than top surfaces T1 of the semiconductor fins 108. For example, the semiconductor fins 108 protrude from the top surfaces T2 of the insulators 110a. In some embodiments, the insulators 110a may be referred to as "shallow trench isolation (STI)." In some embodiments, the top surfaces T2 of the insulators 110a may have a flat surface (as shown in FIG. 5A and FIG. 5B), a convex surface, a concave surface, or a combination thereof.

Figure 6A:
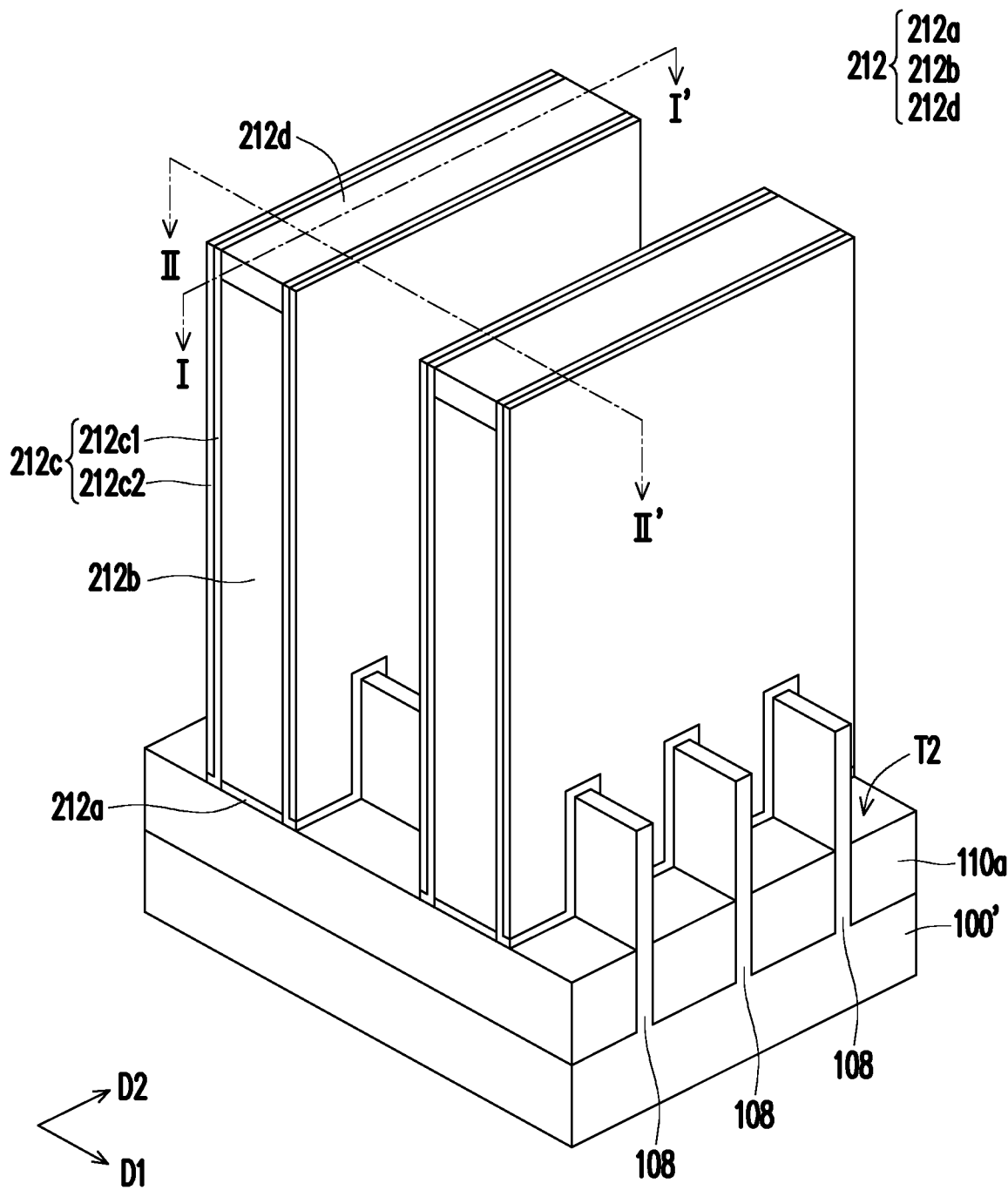
Figure 6B:
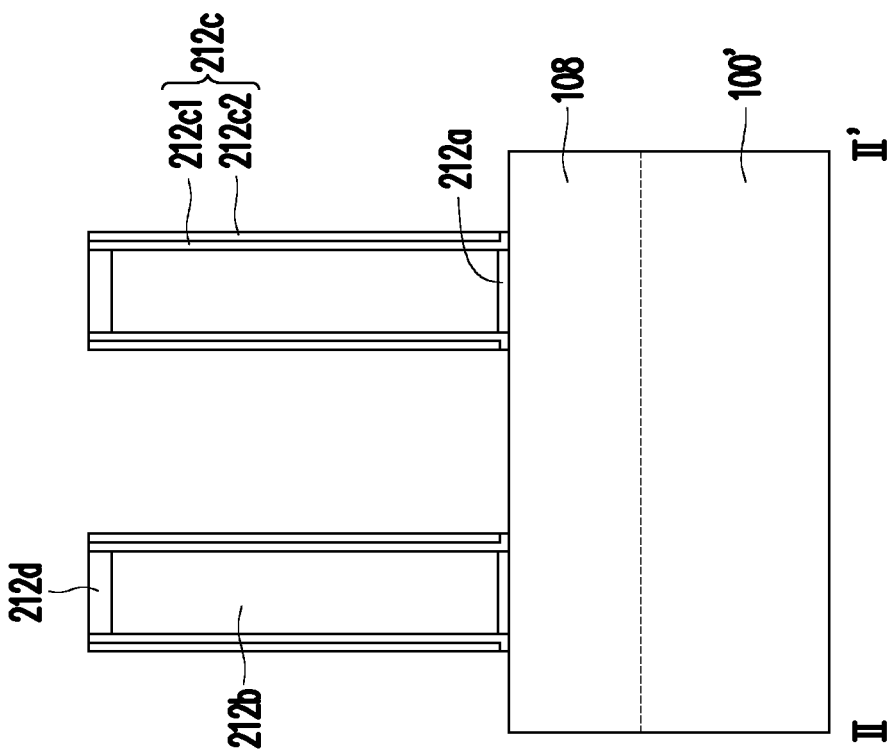
Figure 6B:
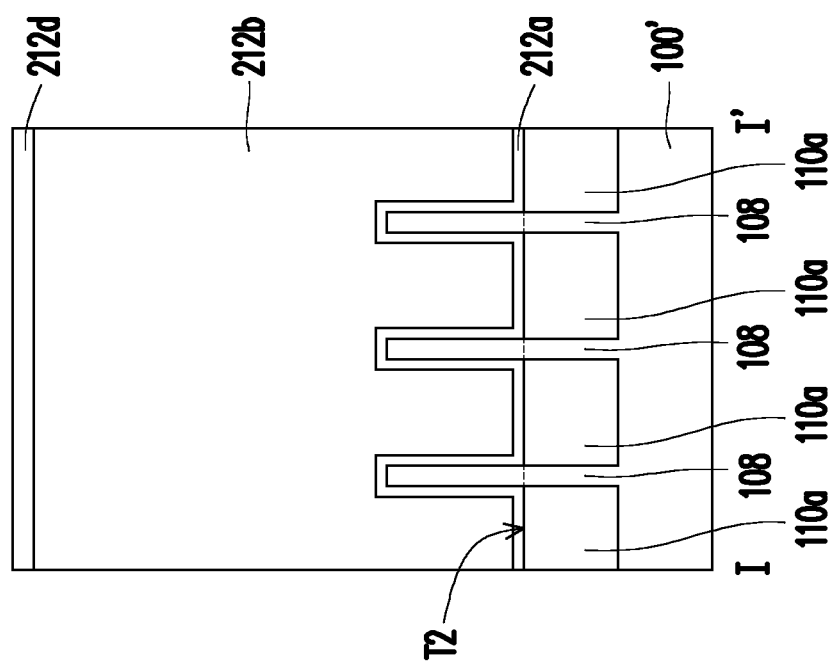

FIG. 6B is a cross-sectional view taken along lines I-I' and II-II' of FIG. 6A. Referring to FIG. 6A and FIG. 6B, a plurality of dummy gate structures 212 is formed over a portion of the semiconductor fins 108 and a portion of the insulators 110a. In some embodiments, the dummy gate structures 212 are formed across the semiconductor fins 108. For example, an extending direction D2 of the dummy gate structures 212 may be perpendicular to an extending direction D1 of the semiconductor fins 108. In some embodiments, each dummy gate structure 212 includes a dielectric layer 212a, a dummy gate 212b disposed over the dielectric layer 212a, and a mask layer 212d disposed over the dummy gate 212b. In some embodiments, the dielectric layer 212a is conformally formed over a portion of the insulators 110a and a portion of the semiconductor fins 108. In some embodiments, the dielectric layer 212a may include silicon oxide, silicon nitride, or silicon oxy-nitride. The dielectric layer 212a may be formed using a suitable process, such as atomic layer deposition (ALD), chemical vapor deposition (CVD), physical vapor deposition (PVD), thermal oxidation, UV-ozone oxidation, or a combination thereof. The dielectric layer 212a may be formed to separate the semiconductor fins 108 and the dummy gate 212b and to function as an etching stop layer.

In addition to the dummy gate structures 212, multiple pairs of spacer structures 212c are also formed over portions of the semiconductor fins 108 and portions of the insulators 110a. As illustrated in FIG. 6A and FIG. 6B, the spacer structures 212c are disposed on sidewalls of the dummy gate structures 212. For example, the dielectric layer 212a, the dummy gate 212b, and the mask layer 212d are sandwiched between a pair of spacer structures 212c. In some embodiments, the spacer structures 212c and the dummy gate structures 212 have the same extending direction D2. Similar to the dummy gate structures 212, the spacer structures 212c are also formed across the semiconductor fins 108. In some embodiments, the spacer structures 212c are formed of dielectric materials, such as silicon oxide, silicon nitride, carbonized silicon nitride (SiCN), SiCON, or a combination thereof. In some embodiments, the spacer structures 212c may be formed by a thermal oxidation or a deposition followed by an anisotropic etch. Each spacer structure 212c may be a single-layered structure or a multi-layered structure. For example, in this embodiment, each spacer structure 212c is a multi-layered structure including a first layer 212c1 and a second layer 212c2.

Figure 7A:
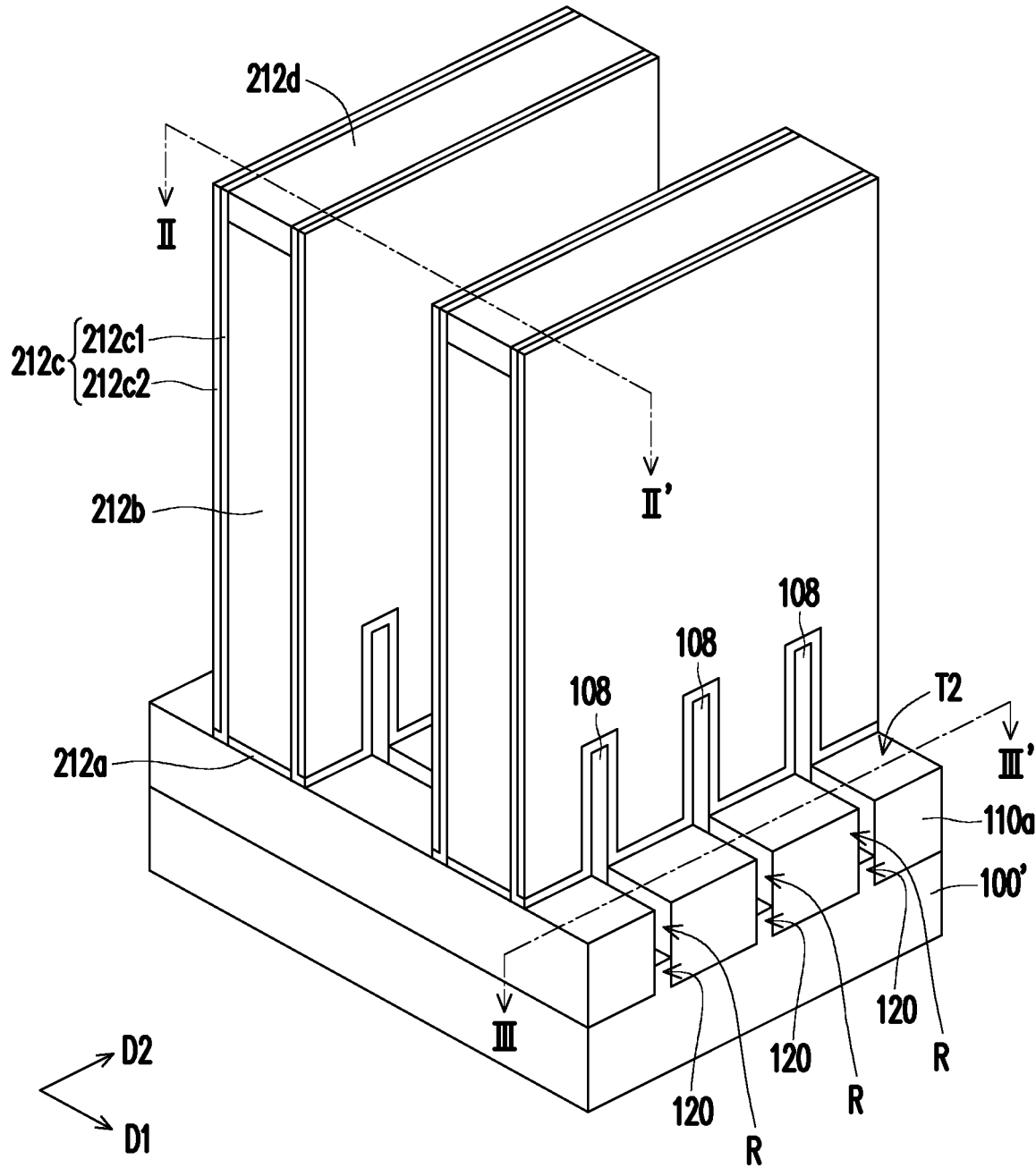
Figure 7B:
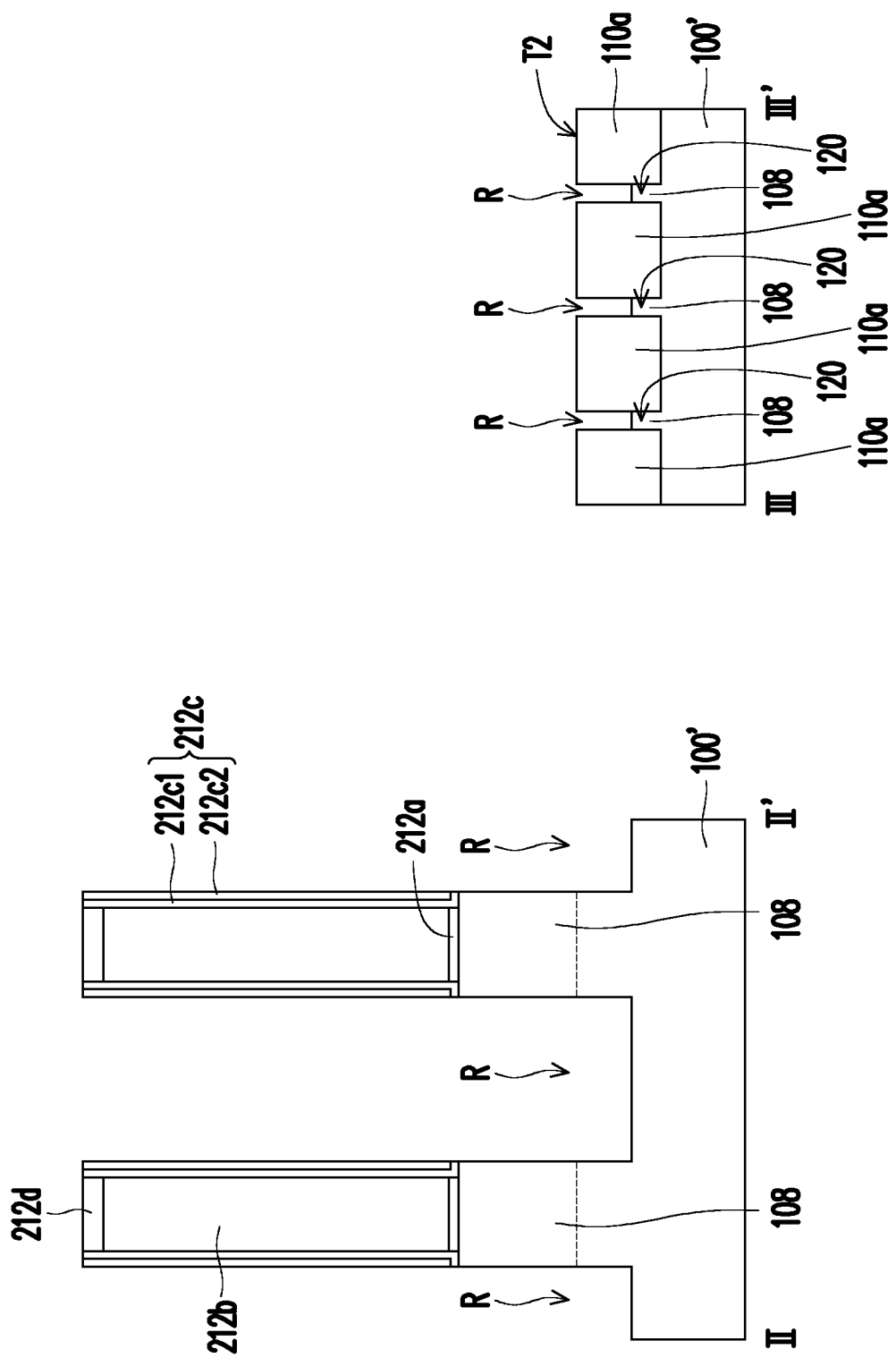

FIG. 7B is a cross-sectional view taken along lines II-II' and III-III' of FIG. 7A. Referring to FIG. 7A and FIG. 7B, the semiconductor fins 108 that are not covers by the dummy gate structures 212 and the spacer structures 212c are removed/recessed below the top surfaces T2 of the insulators 110a to form a plurality of recessed portions R. The recessed portions R in the semiconductor fins 108 may be formed by performing, for example, an anisotropic etching process, an isotropic etching process, or a combination thereof. In some embodiments, the recessed portions R in the semiconductor fins 108 are recessed to have surfaces below the top surfaces T2 of the insulators 110a. In some embodiments, a depth of the recessed portions R is less than a thickness of the insulators 110a. That is, the bottom surfaces of the recessed portions R are higher than the bottom surfaces of the insulators 110a. In other words, the semiconductor fins 108 exposed by the dummy gate structures 212 and the spacer structures 212c are not entirely removed, and the remaining semiconductor fins 108 located below the recessed portion R later form parts of source/drain regions 120. The portions of the semiconductor fins 108 that are covered by the dummy gate structures 212 and the spacer structures 212c may be referred to as the channel portions of the semiconductor fins 108.

Figure 8A:
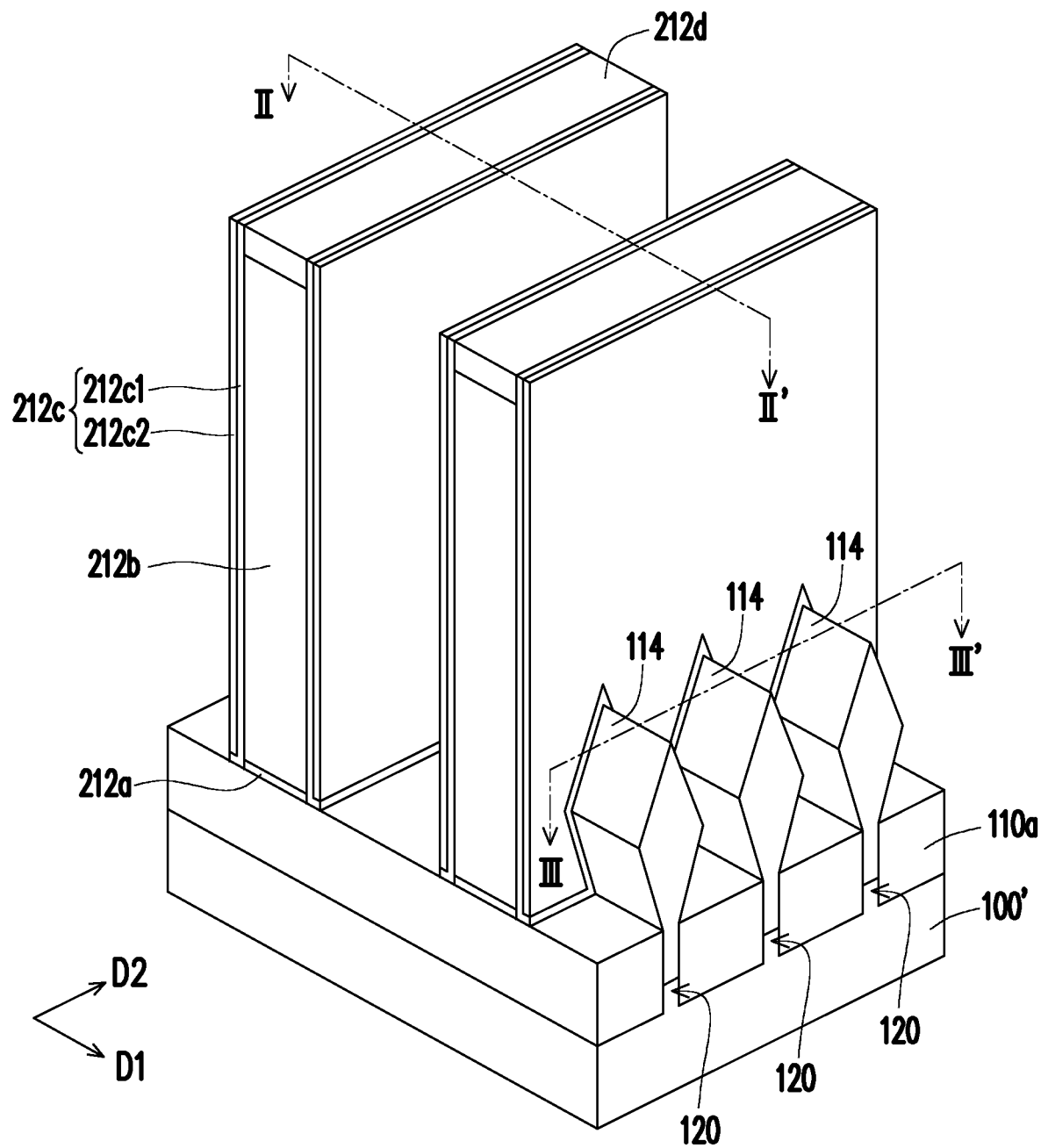
Figure 8B:
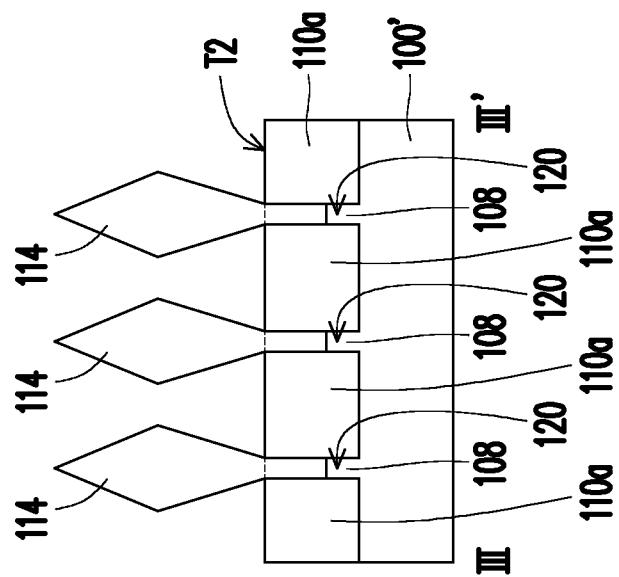
Figure 8B:
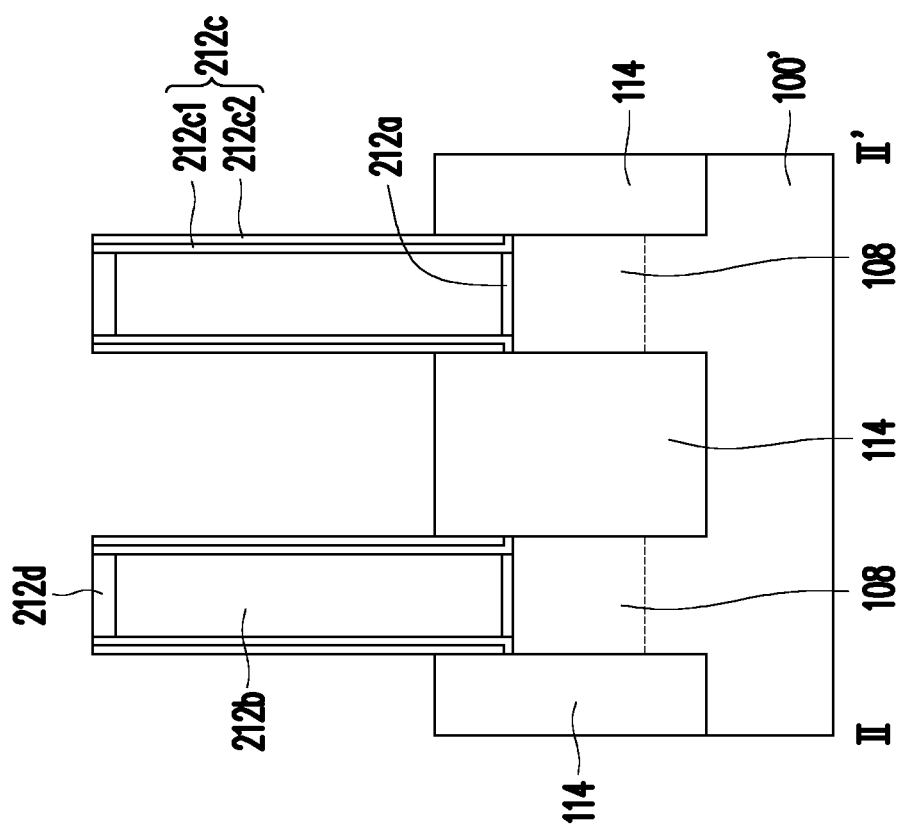

FIG. 8B is a cross-sectional view taken along lines II-II' and III-III' of FIG. 8A. Referring to FIG. 8A and FIG. 8B, strained material structures 114 (or highly-doped low-resistance material structures) are grown on the recessed portions R and extends upward and beyond the top surfaces T2 of the insulators 110a. That is, the strained material structures 114 are formed on the recessed portions R and cover the portions of the semiconductor fins 108 that are revealed from the sidewalls of the spacer structures 212c. In some embodiments, the strained material structures 114 are epitaxially grown to have protruded shapes or diamond shapes. In some embodiments, the strained material structures 114 are formed of high-quality strained material through epitaxial growth technology, such as cyclic deposition-etch (CDE) epitaxy or selective epitaxial growth (SEG). In some embodiments, a material of the strained material structures 114 is different than a material of the semiconductor fins 108. Since the strained material has a lattice constant different from that of the semiconductor fins 108, the channel portion(s) sandwiched between the strained material structures 114 is strained or stressed to increase carrier mobility of the device and enhance the device performance. In some embodiments, the strained material structures 114 and the remaining semiconductor fins 108 located below form the source/drain regions 120 of the subsequently formed device.

In some embodiments, the strained material structures 114 are formed such that each dummy gate 212b is disposed between respective neighboring pairs of the strained material structures 114. As illustrated in FIG. 8A, the dummy gate 212b are separated from the neighboring strained material structures 114 by the corresponding spacer structures 212c. As such, appropriate lateral distance is maintained between the dummy gate 212b and the strained material structures 114, so the strained material structures 114 do not short out with the subsequently formed gates of the resulting device.

In some embodiments, the strained material structures 114 may be doped with a conductive dopant. In some embodiments, the strained material structures 114, such as SiGe, SiGeB, Ge, GeSn, or the like, are epitaxial-grown with p-type dopants for straining a p-type FinFET. That is, the strained material structures 114 are doped with the p-type dopants to be the source and the drain of the p-type FinFET. The p-type dopants include boron or $BF_2$. In some alternative embodiments, the strained material structures 114, such as SiC, SiP, SiCP, a combination of SiC/SiP, or the like, are epitaxial-grown with n-type dopants for straining an n-type FinFET. That is, the strained material structures 114 are doped with the n-type dopants to be the source and the drain of the n-type FinFET. The n-type dopants include arsenic and/or phosphorus. In some embodiments, the strained material structures 114 may be epitaxial-grown by LPCVD process with in-situ doping. Depending on the type of the device, the strained material structures 114 in different regions may be doped with different type of dopants. Similarly, depending on the function of the device, the strained material structures 114 in different regions may be doped with different dopant concentrations. In some embodiments, each of the strained material structures 114 may be a single-layered structure or a multi-layered structure.

It should be noted that the recess step illustrated in FIG. 7A and FIG. 7B may be omitted in some embodiments. For example, the strained material structures 114 may be formed on the un-recessed semiconductor fins 108 not covered by the dummy gate structures 212 and the spacer structures 212c.

Figure 9A:
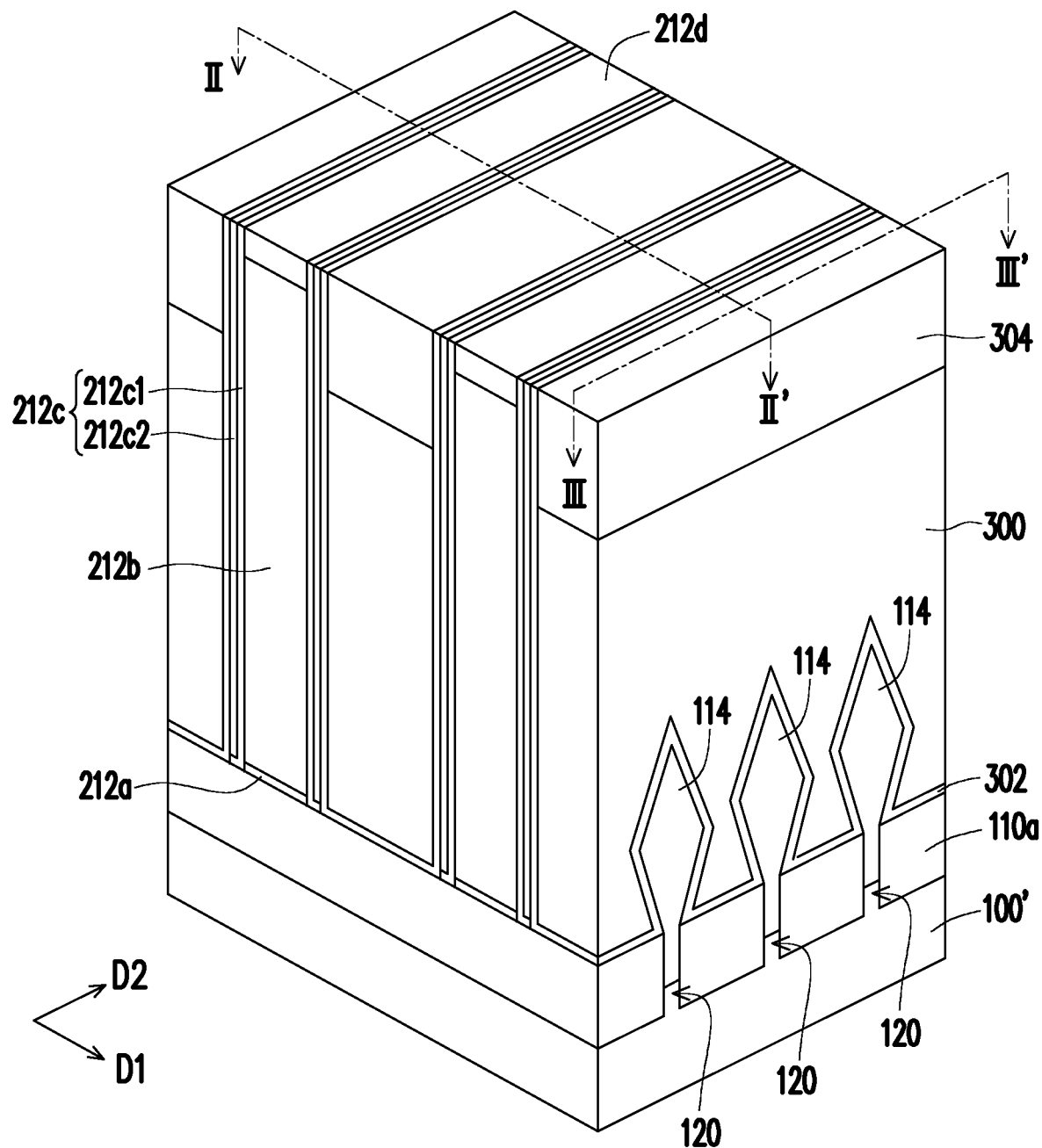
Figure 9B:
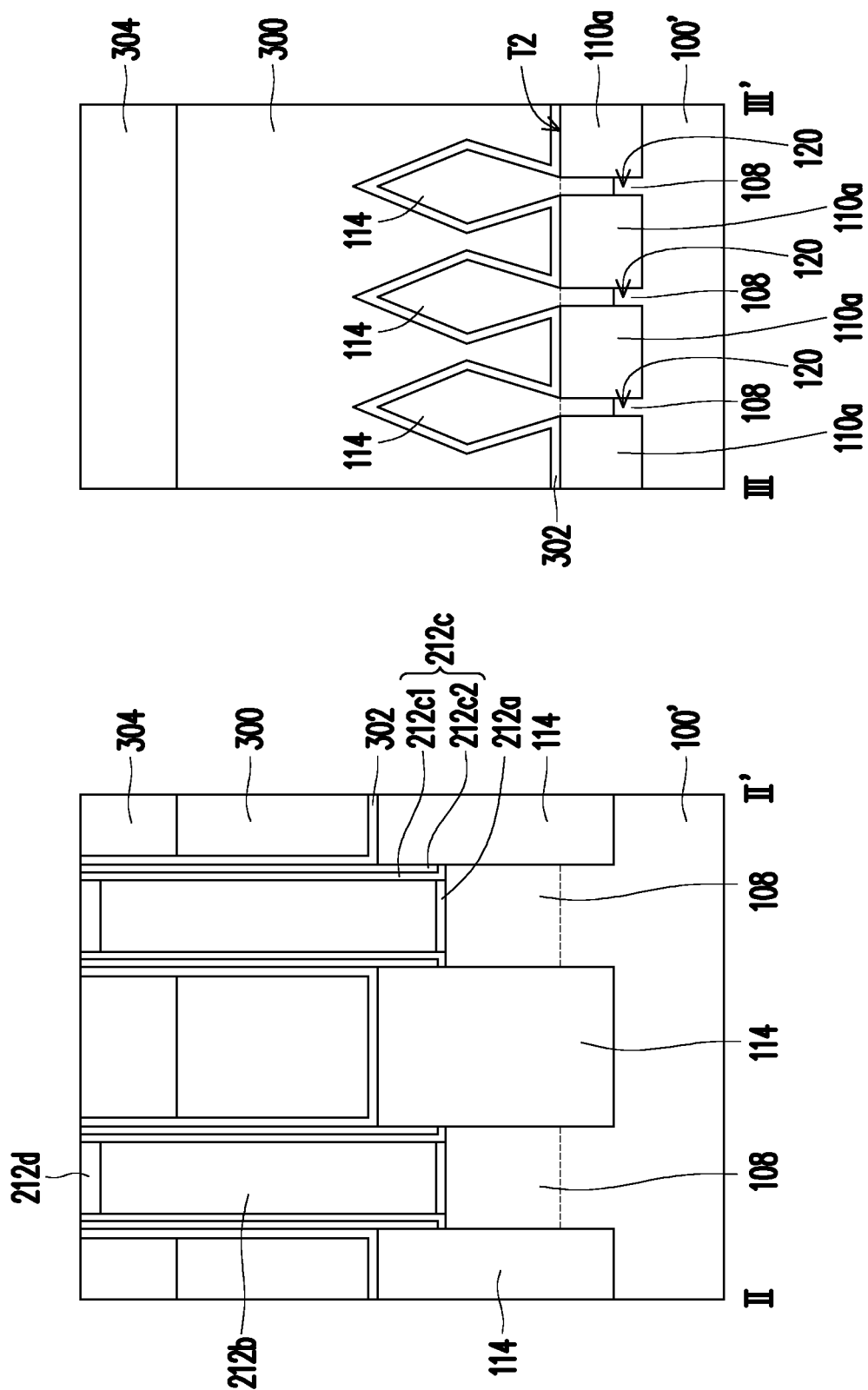

FIG. 9B is a cross-sectional view taken along lines II-II' and III-III' of FIG. 9A. Referring to FIG. 9A and FIG. 9B, an etch stop layer 302, an interlayer dielectric layer 300 and a cap layer 304 are sequentially formed over the strained material structures 114 and the insulators 110a. In some embodiments, the method of forming the etch stop layer 302, the interlayer dielectric layer 300 and the cap layer 304 includes the following steps. An etch stop layer covering the top surfaces of the dummy gate structures 212 the top surfaces of the insulators 110a and the top surfaces of the trained material structures 114 is formed by, for example, CVD, SACVD, molecular layer deposition (MLD), ALD, or the like. After that, the interlayer dielectric 300 is formed on the etch stop layer 302 by, for example, flowable chemical vapor deposition (FCVD), CVD, HDPCVD, SACVD, spin-on, sputtering, or other suitable methods. Then, a portion of the interlayer dielectric 300 and a portion of the etch stop layer 302 are removed by a planarization process. The planarization process includes, for example, a chemical mechanical polish (CMP) process, an etch back process, combinations thereof, or the like. In some embodiments, after the interlayer dielectric 300 is planarized, a top surface of the polished interlayer dielectric 300 is substantially coplanar with a top surface of the mask layer 212d. After the planarization process, the polished interlayer dielectric 300 is partially removed/recessed below the top surfaces of the dummy gate structures 212 by an etching process. In some embodiments, the polished interlayer dielectric 300 may be etched off by a wet etching process with hydrofluoric acid (HF). Alternatively, the polished interlayer dielectric 300 may be etched off by a dry etching process with HF 3 and NH 3 gases. During the dry etching process, plasma may be generated and Argon may also be included. The cap layer 304 is then formed on the recessed interlayer dielectric layer 300. In some embodiments, another planarization process may be performed on the cap layer 304 to expose the dummy gate structures 212. In some embodiments, the another planarization process may remove the mask layer 212d.

In some embodiments, the etch stop layer 302 and the cap layer 304 may be formed of silicon oxide, silicon nitride, silicon carbo-nitride, SiOCN, or the like. In some embodiments, the etch stop layer 302 may be referred to as "contact etch stop layer (CESL)." In some embodiments, the interlayer dielectric layer 300 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. It is understood that the interlayer dielectric layer 300 may include one or more dielectric materials and/or one or more dielectric layers.

Figure 10A:
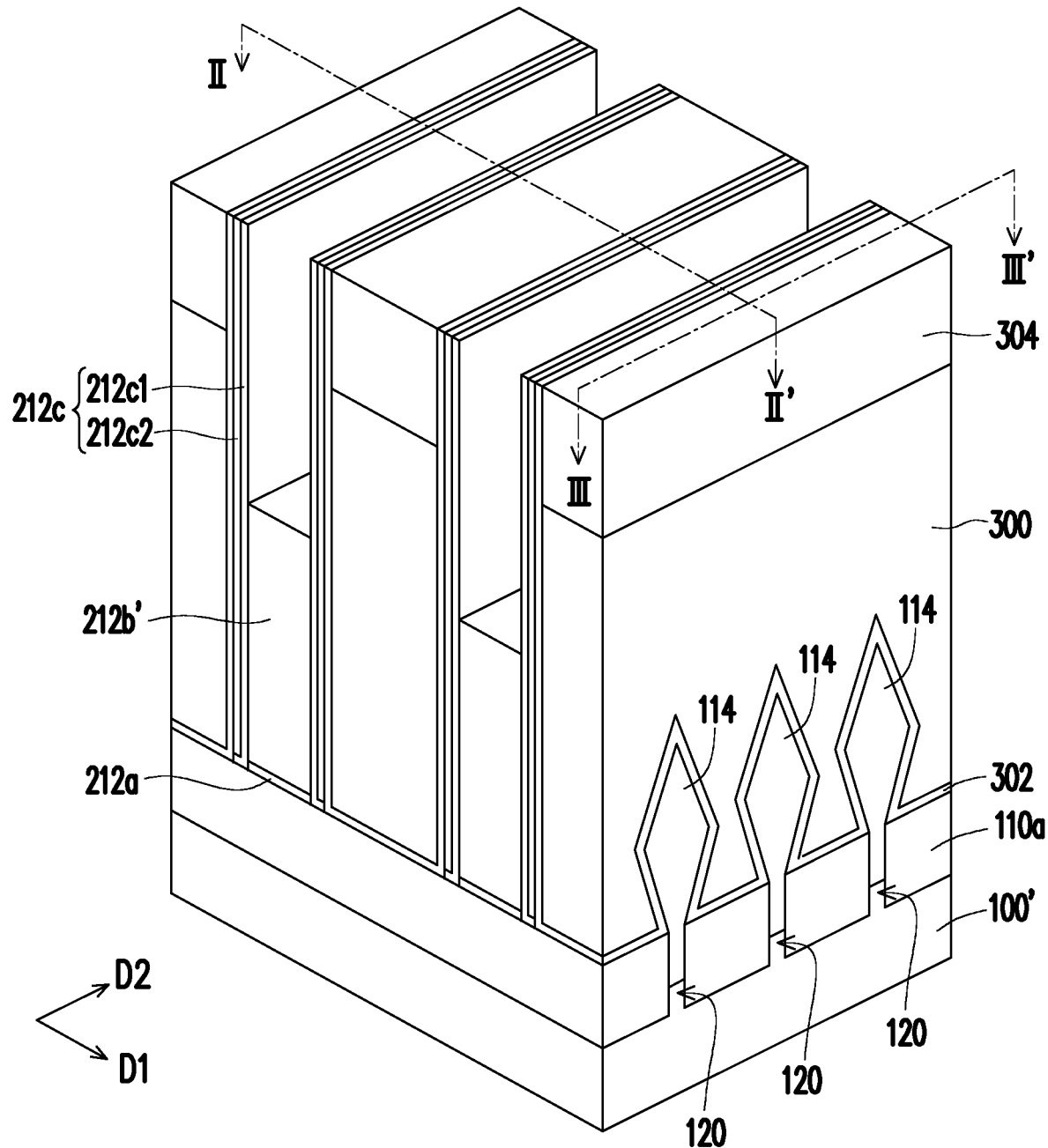
Figure 10B:
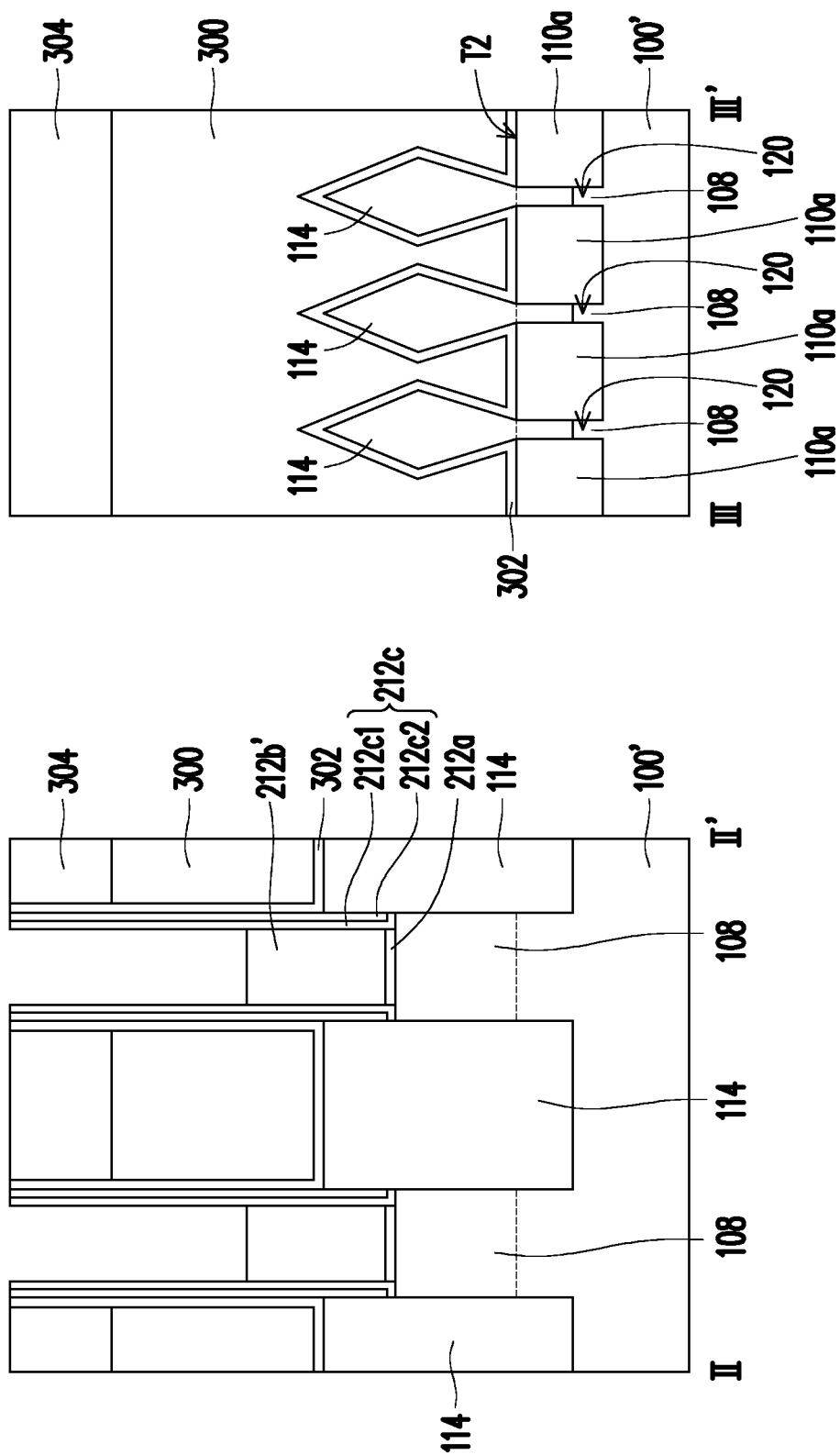

FIG. 10B is a cross-sectional view taken along lines II-II' and III-III' of FIG. 10A. Referring to FIG. 10A and FIG. 10B, the mask layer 212d and a portion of the dummy gate 212b are removed by a first etching process. The first etching process includes, for example, a wet etching process or a dry etching process. Example of the wet etching process includes chemical etching and example of the dry etching process includes plasma etching. However, other commonly known etching methods may also be utilized in the first etching process.

The remaining dummy gate 212b' covers the underlying dielectric layer 212a and located beside bottom portions of the spacer structures 212c. Top portions of the spacer structures 212c are exposed after the first etching process.

Figure 11A:
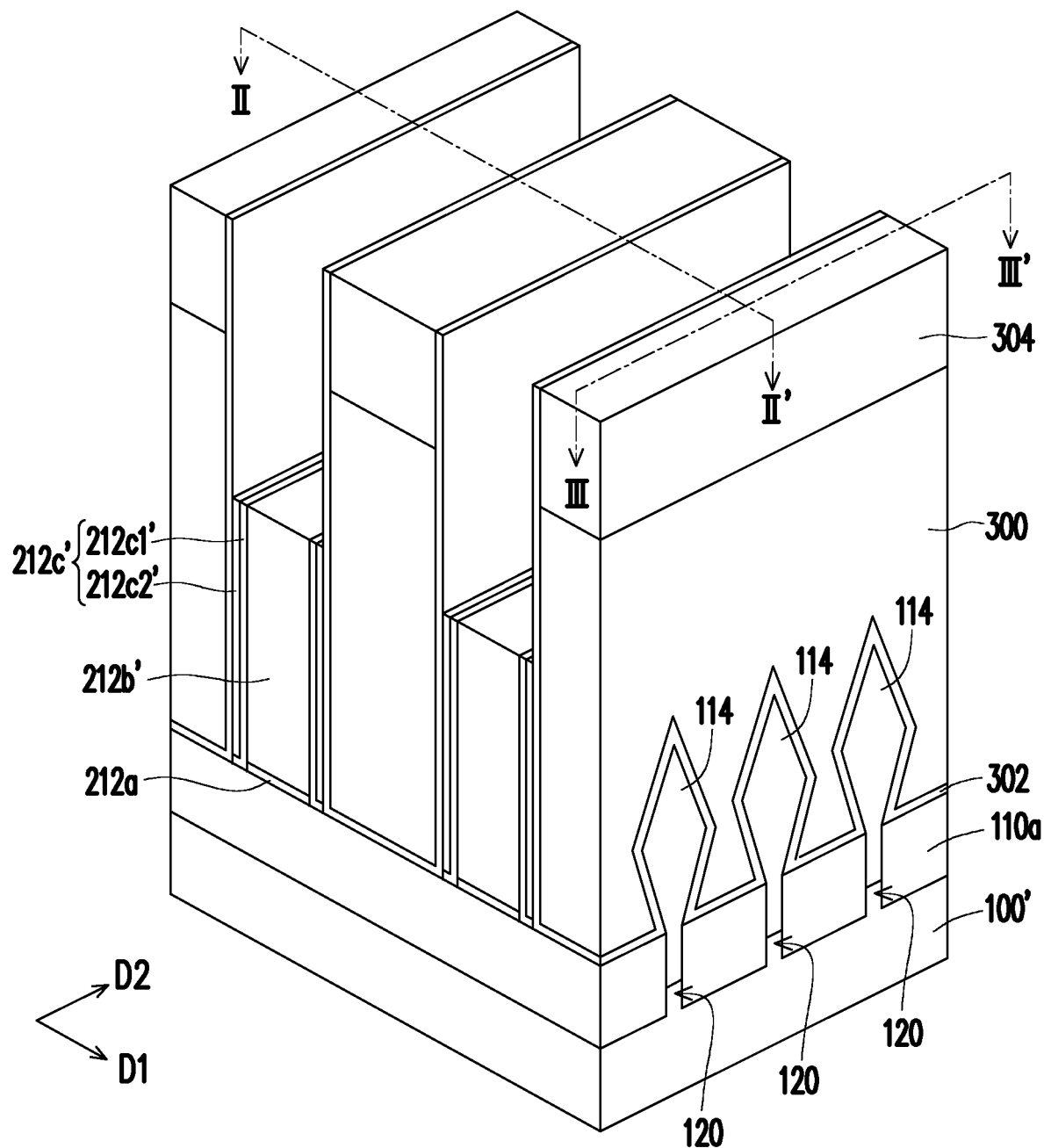
Figure 11B:
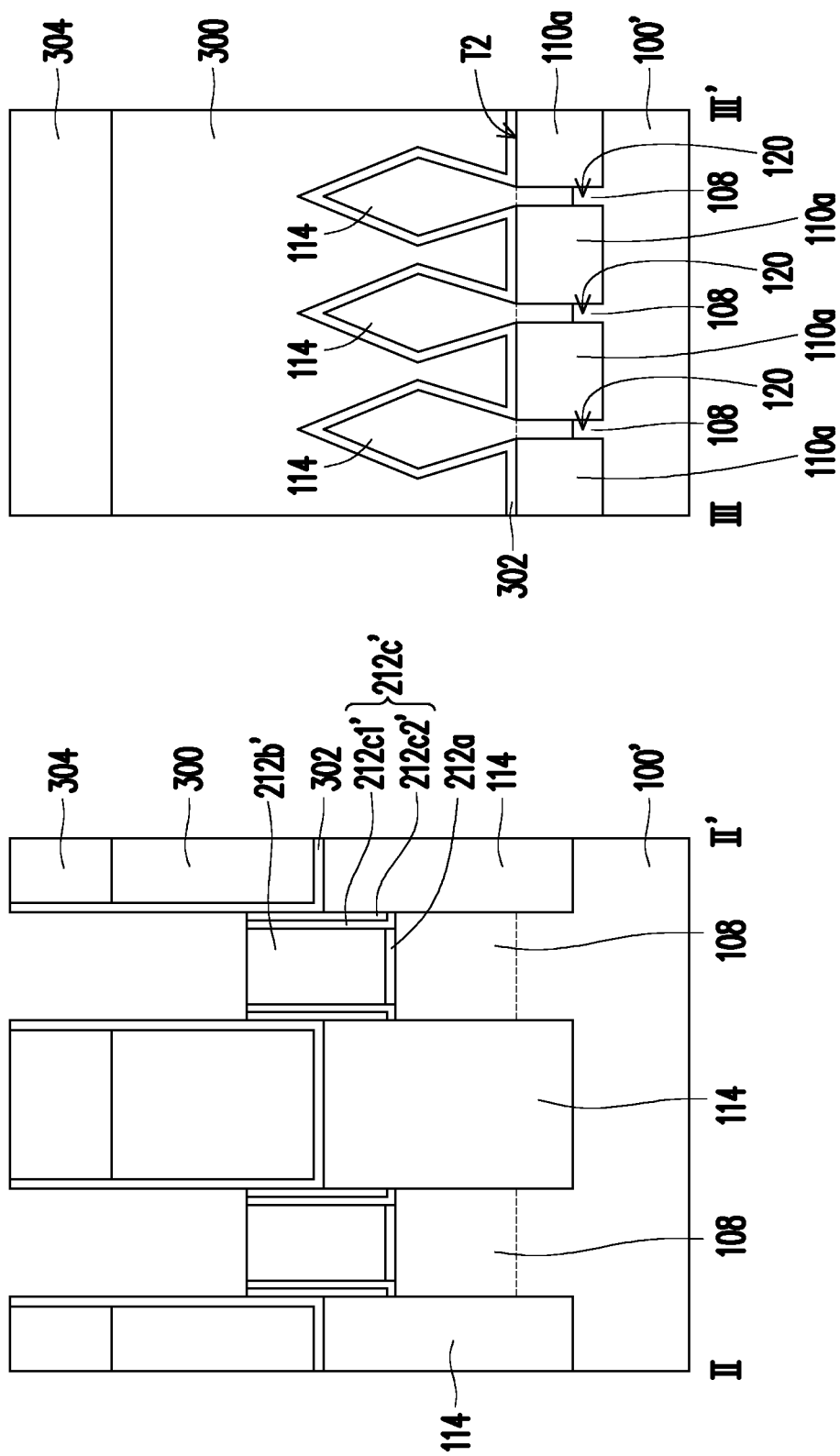

FIG. 11B is a cross-sectional view taken along lines II-II' and III-III' of FIG. 11A. Referring to FIG. 11A and FIG. 11B, top portions of the space structures 212c exposed by the remaining dummy gate 212b' are removed by a second etching process. The second etching process includes, for example, a wet etching process or a dry etching process. Example of the wet etching process includes chemical etching and example of the dry etching process includes plasma etching. However, other commonly known etching methods may also be utilized in the second etching process.

In FIG. 11A and FIG. 11B, top surfaces of the remaining space structures 212c' are coplanar with the top surfaces of the remaining dummy gates 212b', but the disclosure is not limited thereto. In other embodiments, the remaining space structures 212c' may be higher than or lower than the remaining dummy gates 212b' after the second etching process. In this embodiment the remaining space structures 212c' include a remaining first layer 212c1' and a remaining second layer 212c2'.

Figure 12A:
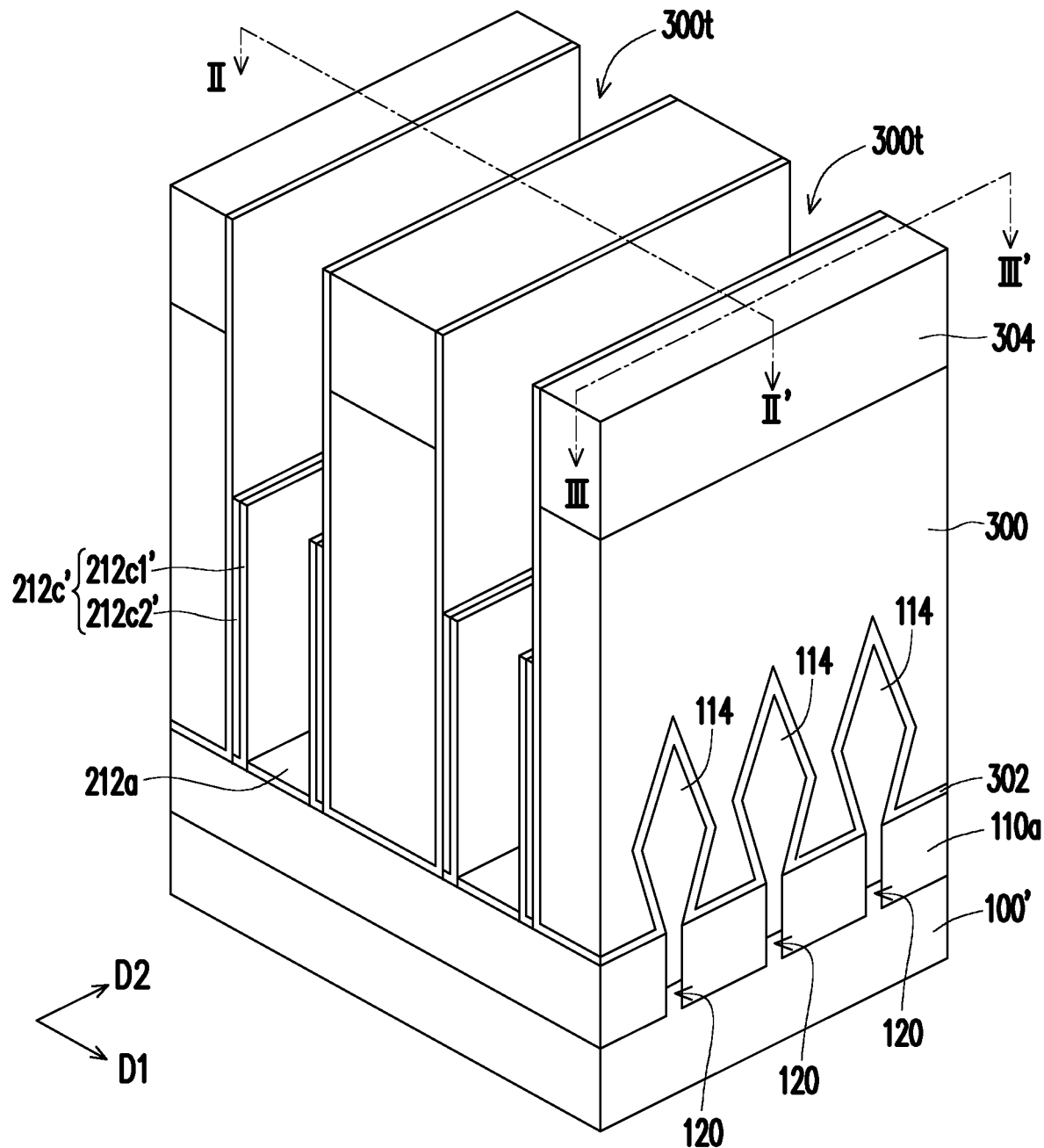
Figure 12B:
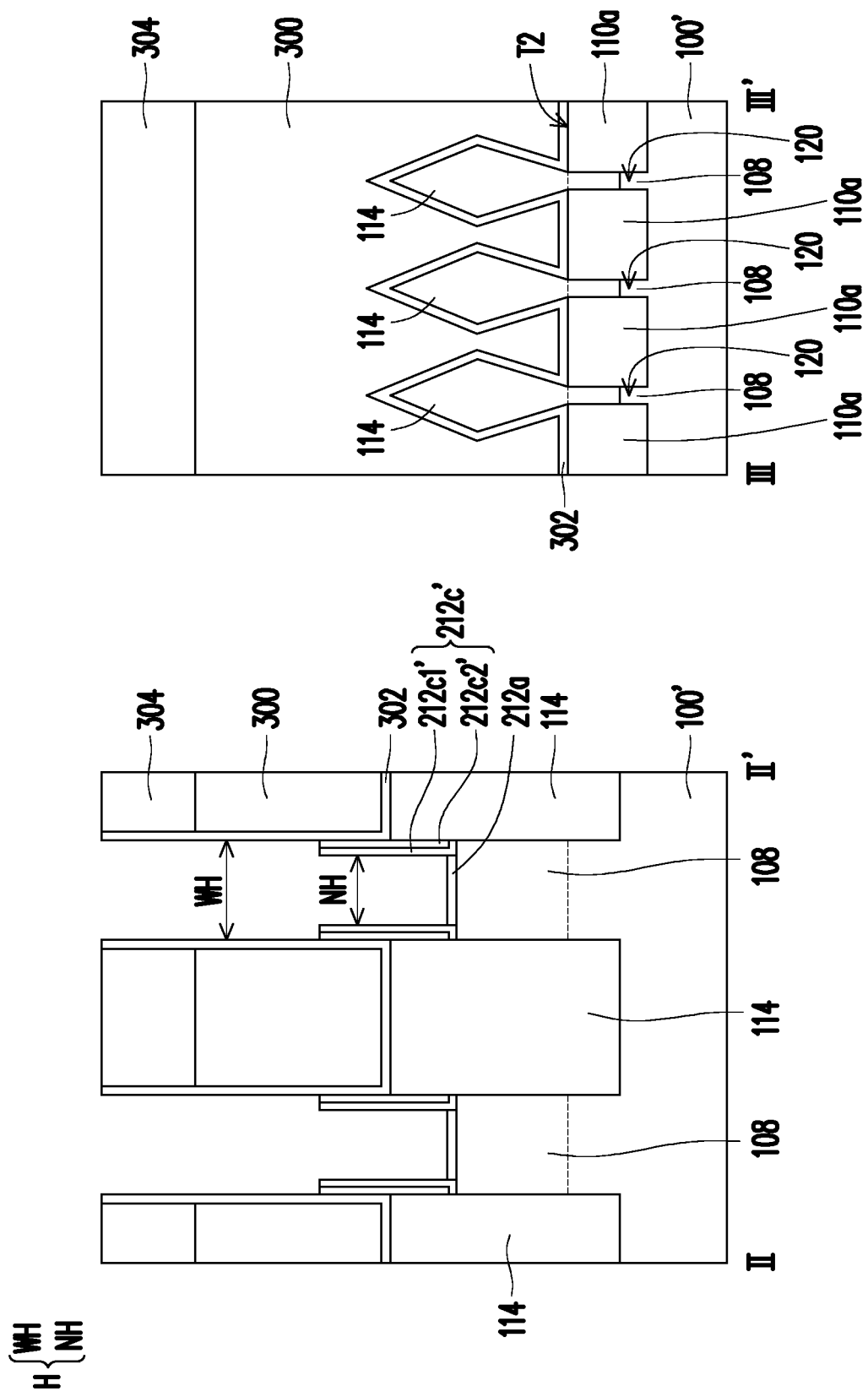

FIG. 12B is a cross-sectional view taken along lines II-II' and III-III' of FIG. 12A. Referring to FIG. 12A and FIG. 12B, the remaining dummy gate 212b' is removed by a third etching process. The third etching process includes, for example, a wet etching process or a dry etching process. Example of the wet etching process includes chemical etching and example of the dry etching process includes plasma etching. However, other commonly known etching methods may also be utilized in the third etching process.

The remaining space structures 212c' are located in the trenches 300t of the interlayer dielectric layer 300 to define a hollow portion H including a narrow hollow NH and a wide hollow WH. In this embodiment, a portion of the etching stop layer 302 is also located in the trench 300t. The narrow hollow NH is horizontally located between the remaining space structures 212c', and the wide hollow WH is horizontally located between the etching stop layer 302. The wide hollow WH is located above the remaining space structures 212c' and the narrow hollow NH. In some embodiments, the difference between the width of the wide hollow WH and the width of the narrow hollow NH is substantially equal to the width of two remaining space structures 212c'.

Figure 13A:
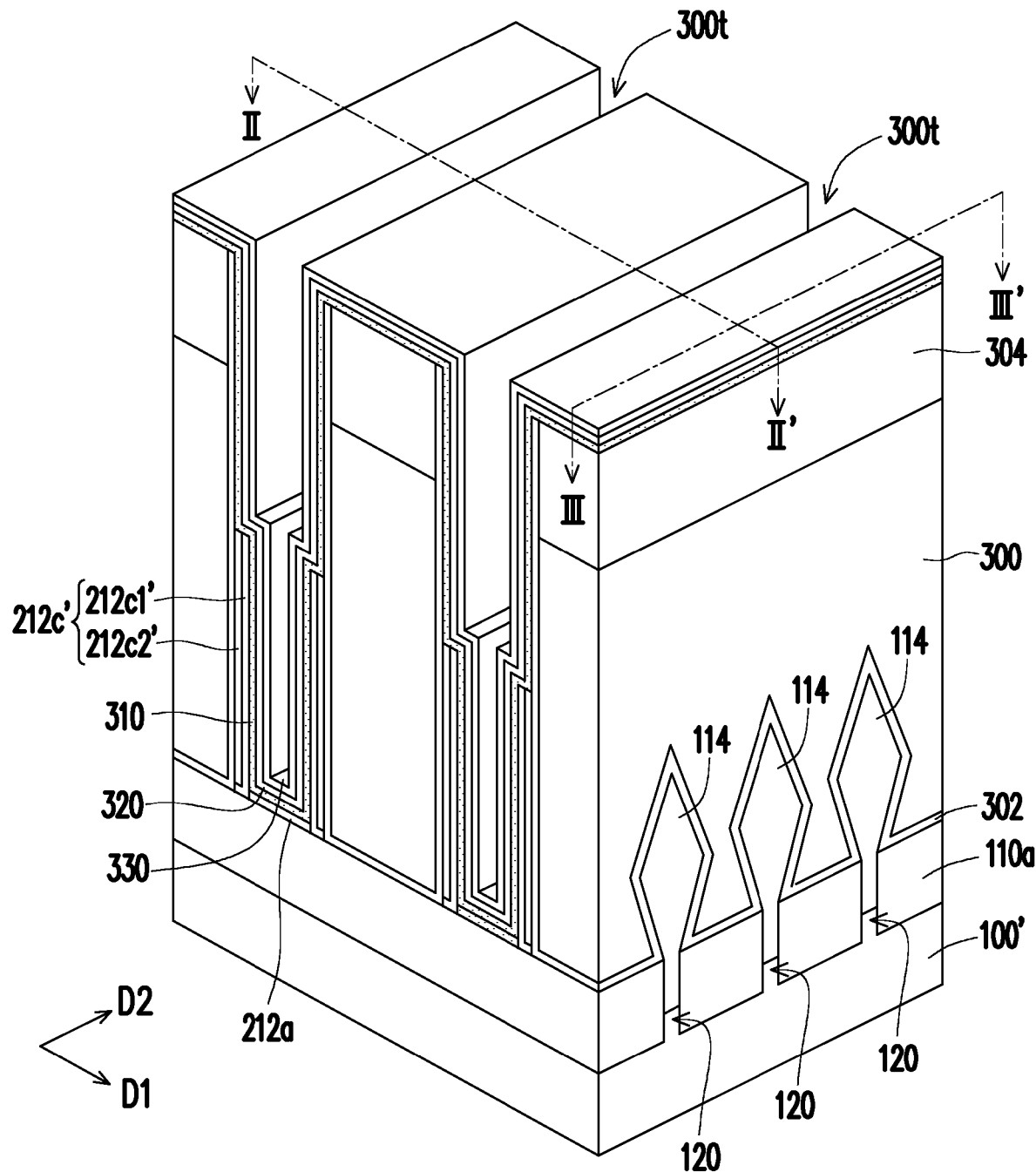
Figure 13B:
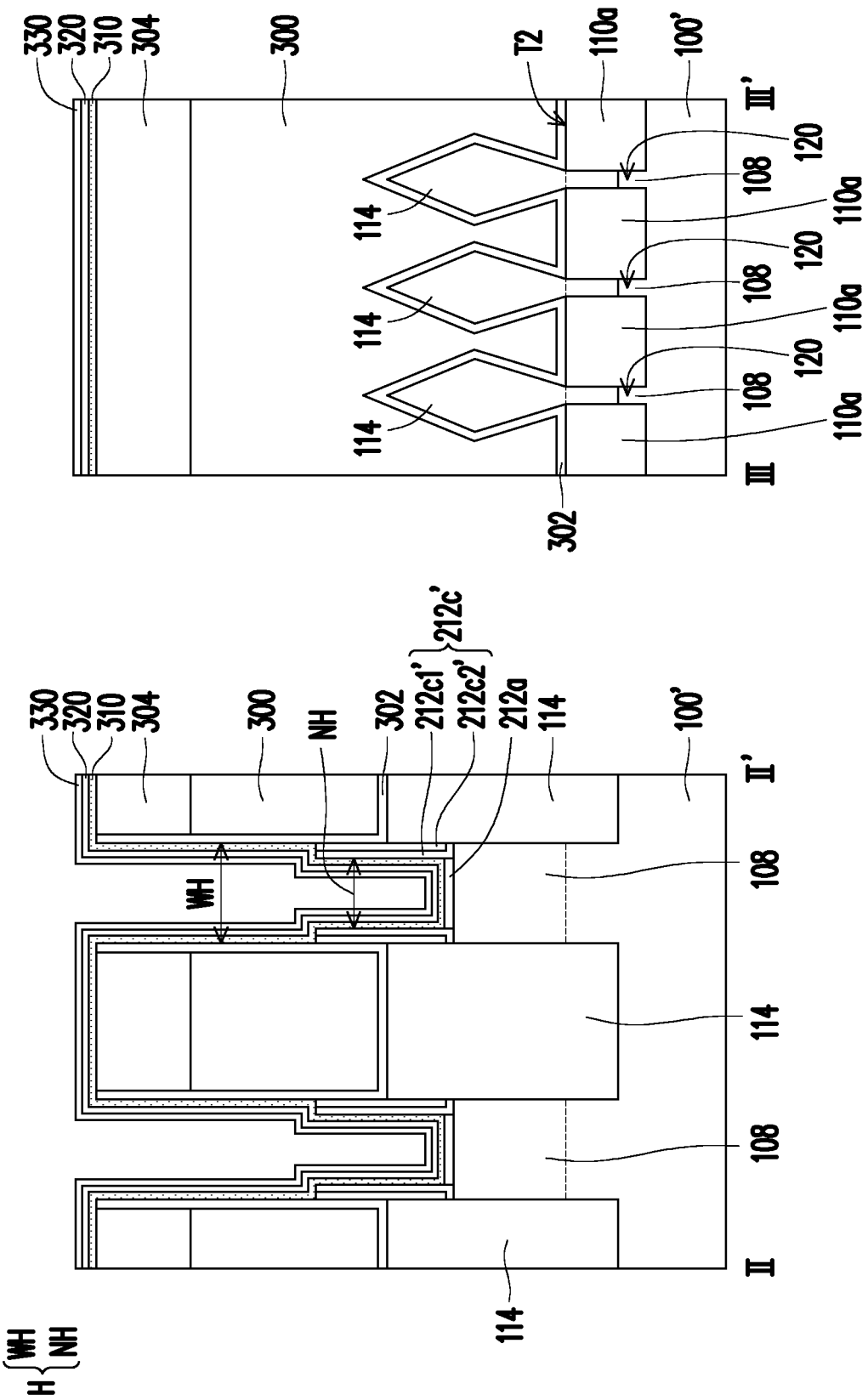

FIG. 13B is a cross-sectional view taken along lines II-II' and III-III' of FIG. 13A. Referring to FIG. 13A and FIG. 13B, a gate insulating layer 310 is formed above the semiconductor substrate 100'. The gate insulating layer 310 covers sidewalls of the narrow hollow NH and sidewalls of the wide hollow WH. For example, the gate insulating layer 310 is extending along the top surface of the dielectric layer 212a, the inner sidewalls and the top surfaces of the remaining space structures 212c', the inner sidewall and the top surface of the etch stop layer 302 and the top surface of the cap layer 304.

In some embodiments, the gate insulating layer 310 is a high-k dielectric layer having a dielectric constant greater than about 4, greater than about 12, greater than about 16, or even greater than about 20. For example, a material of the high-k dielectric layer may include may include a metal oxide, such as $ZrO_2$, $Gd_2O_3$, $HfO_2$, $BaTiO_3$, $Al_2O_3$, $LaO_2$, $TiO_2$, $Y_2O_3$, STO, BTO, BaZrO, HfZrO, HfLaO, HfTaO, HfTiO, or a combination thereof. In some alternative embodiments, the high-k dielectric may optionally include a silicate such as HfSiO, HfSiON, LaSiO, AlSiO, or a combination thereof. In some embodiments, the method of forming the high-k dielectric includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

A dipole dopant layer 320 is formed on the gate insulating layer 310 by, for example, CVD, PECVD, ALD, PVD or the like. After forming the dipole dopant layer 320, a hard mask layer 330 is formed on the dipole dopant layer 320 by, for example, CVD, PECVD, ALD, PVD or the like. Both of the dipole dopant layer 320 and the hard mask layer 330 are extending into the hollow portions H. Since the height of the remaining space structures 212c' is lower than the height of the interlayer dielectric layer 300, the gate insulating layer 310, the dipole dopant layer 320 and the hard mask layer 330 include a plurality of step structures that climb through the remaining space structures 212c' in the trenches 300t. In some embodiments, the dipole dopant layer 320 may be made of an insulation layer such as an aluminum oxide containing dipole dopant. The dipole dopant may include lanthanum. In some embodiments, the hard mask layer 330 may also include aluminum oxide, but the hard mask layer 330 doesn't contain the dipole dopant.

Figure 14A:
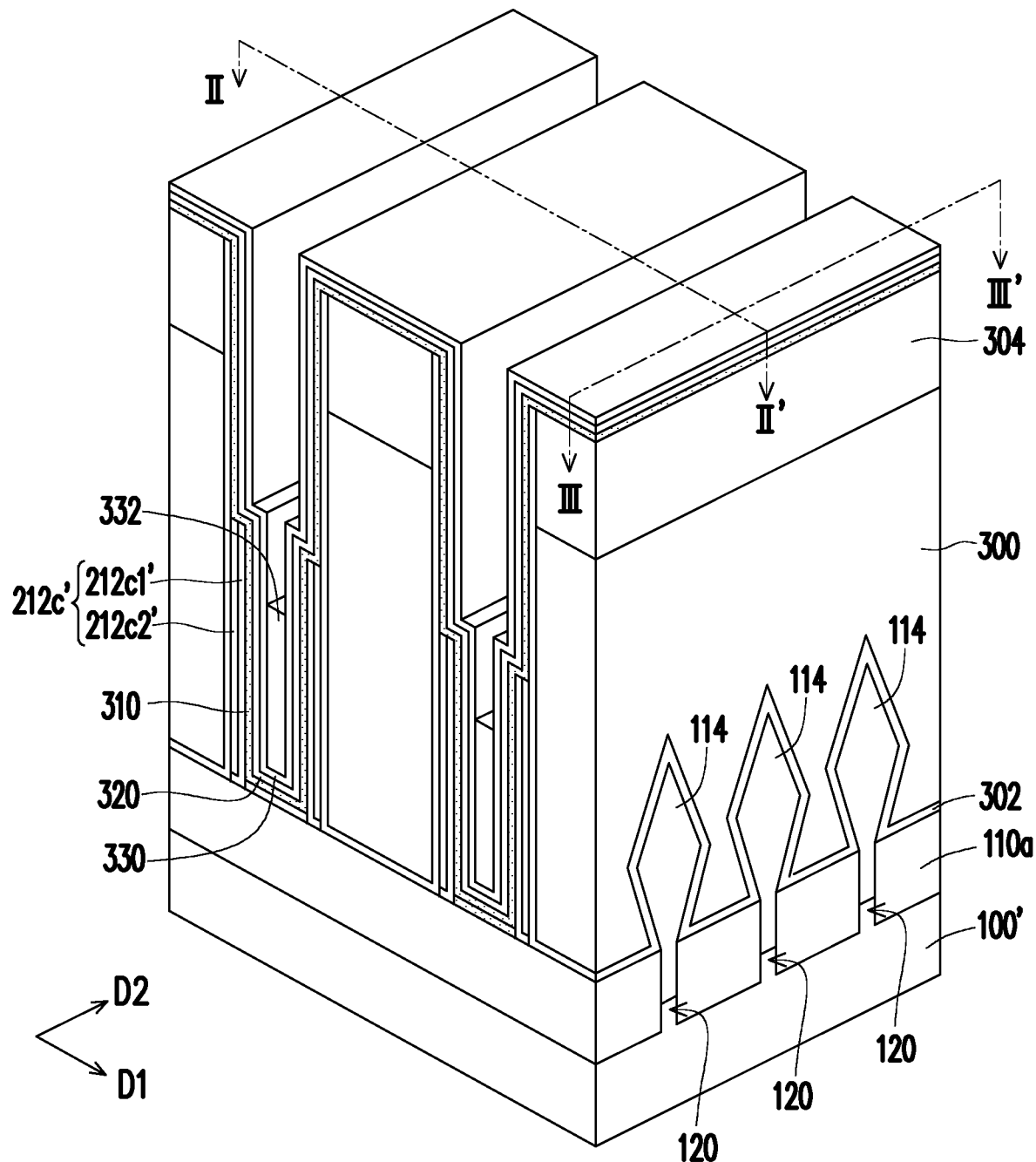
Figure 14B:
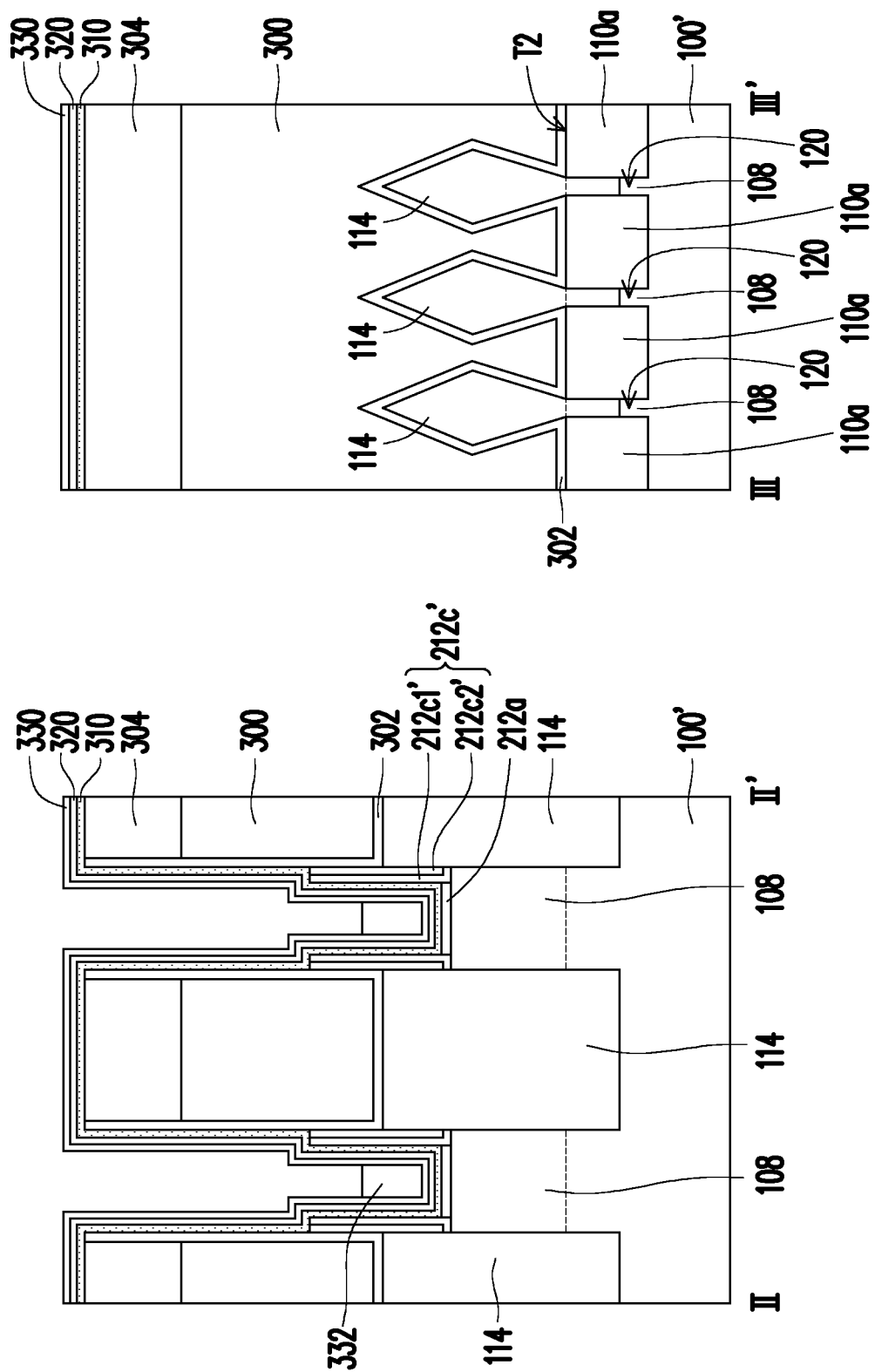

FIG. 14B is a cross-sectional view taken along lines II-II' and III-III' of FIG. 14A. Referring to FIG. 14A and FIG. 14B, a mask layer 332, such as a bottom anti-reflection coating (BARC), is formed on the hard mask layer 330. In some embodiments, the mask layer 332 may be formed by any suitable method, such as CVD, spin-on, or the like, and the mask layer 332 may be patterned by using a photoresist pattern as a mask.

Figure 15A:
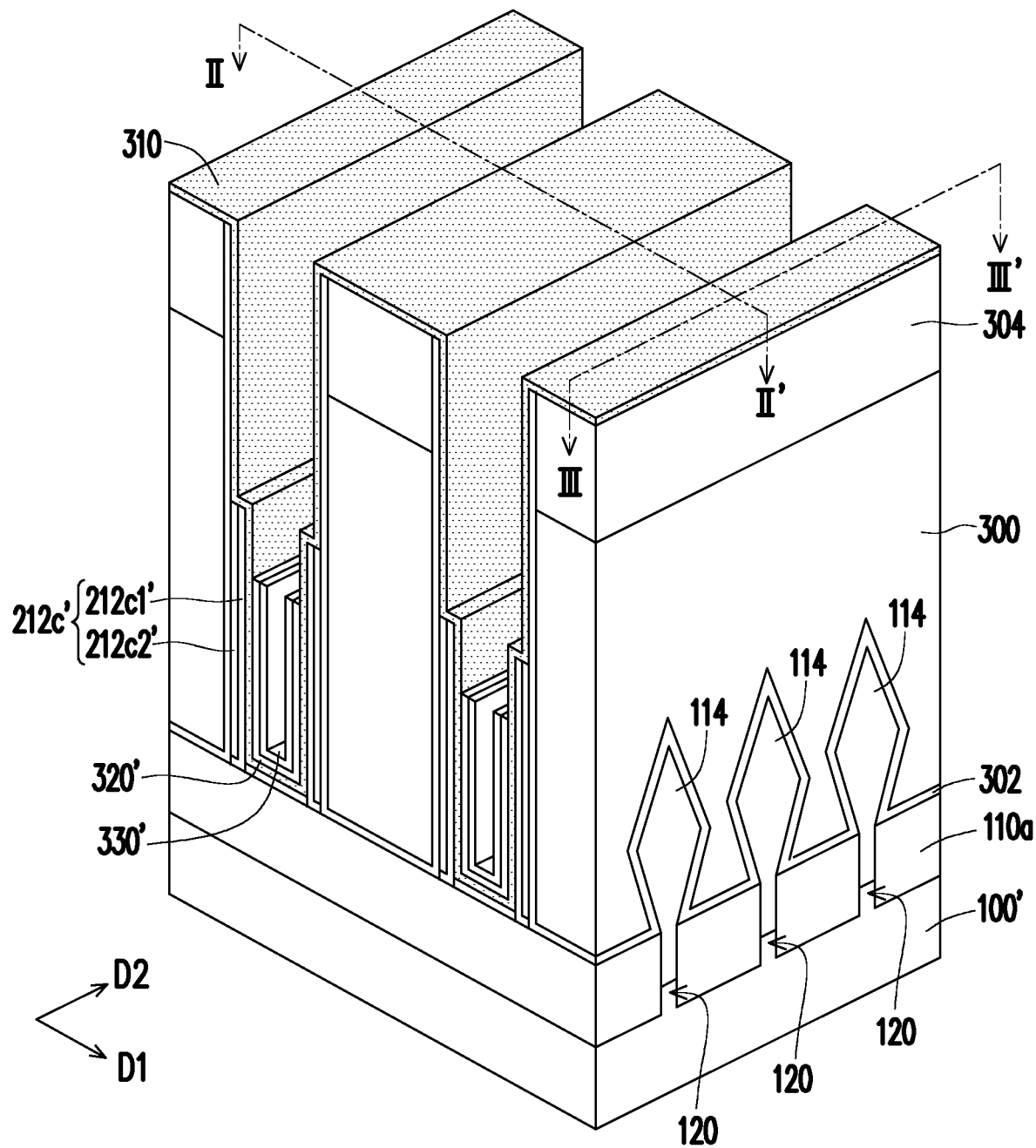
Figure 15B:
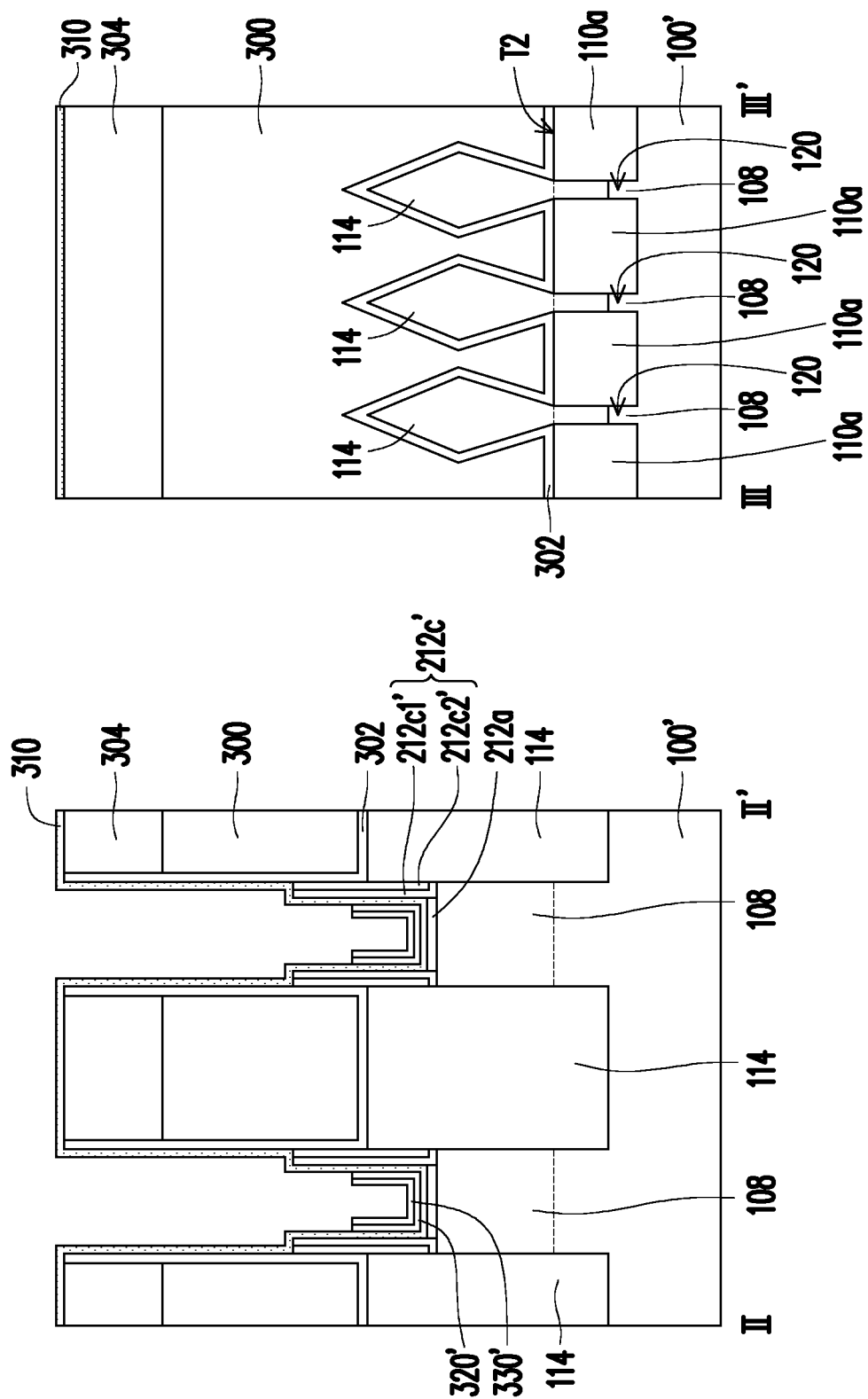

FIG. 15B is a cross-sectional view taken along lines II-II' and III-III' of FIG. 15A. Referring to FIG. 15A and FIG. 15B, the hard mask layer 330 is patterned by using the mask layer 332. In some embodiments, the mask layer 332 may be consumed during the patterning. After forming the patterned hard mask layer 330', the mask layer 332 are removed by any suitable method, such as $O_2$ ashing process, etching process or other suitable process. Then, the dipole dopant layer 320 is patterned by using the patterned hard mask layer 330' as a mask. In the case, a portion of the gate insulating layer 310 is exposed by the patterned dipole dopant layer 320'. In some embodiments, the height of the patterned dipole dopant layer 320' is lower than the height of the remaining spacer structures 212c'. That is, the patterned dipole dopant layer 320' exposes the gate insulating layer 310 in the wide hollow WH and the gate insulating layer 310 at the top portion of the narrow hollow NH.

Figure 16A:
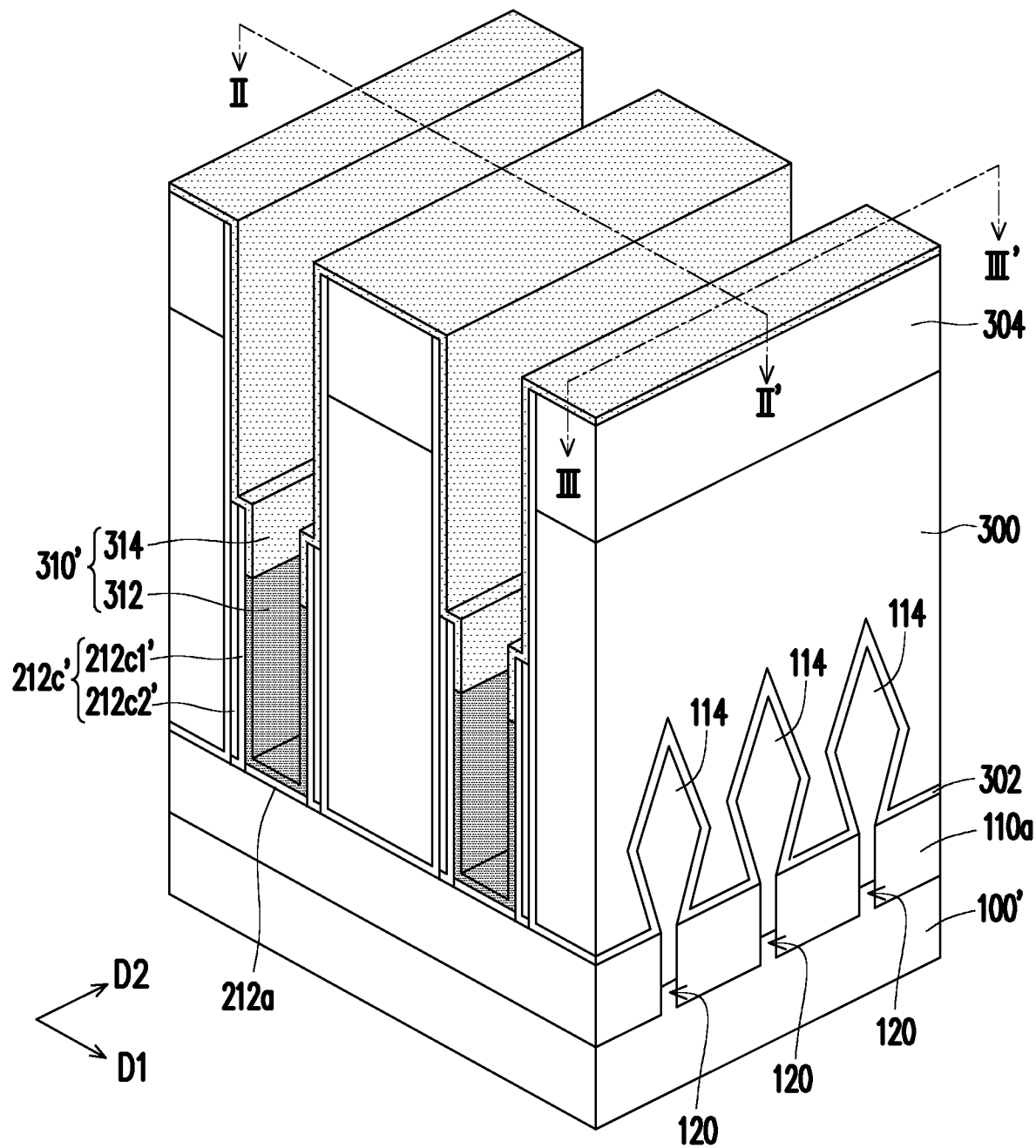
Figure 16B:
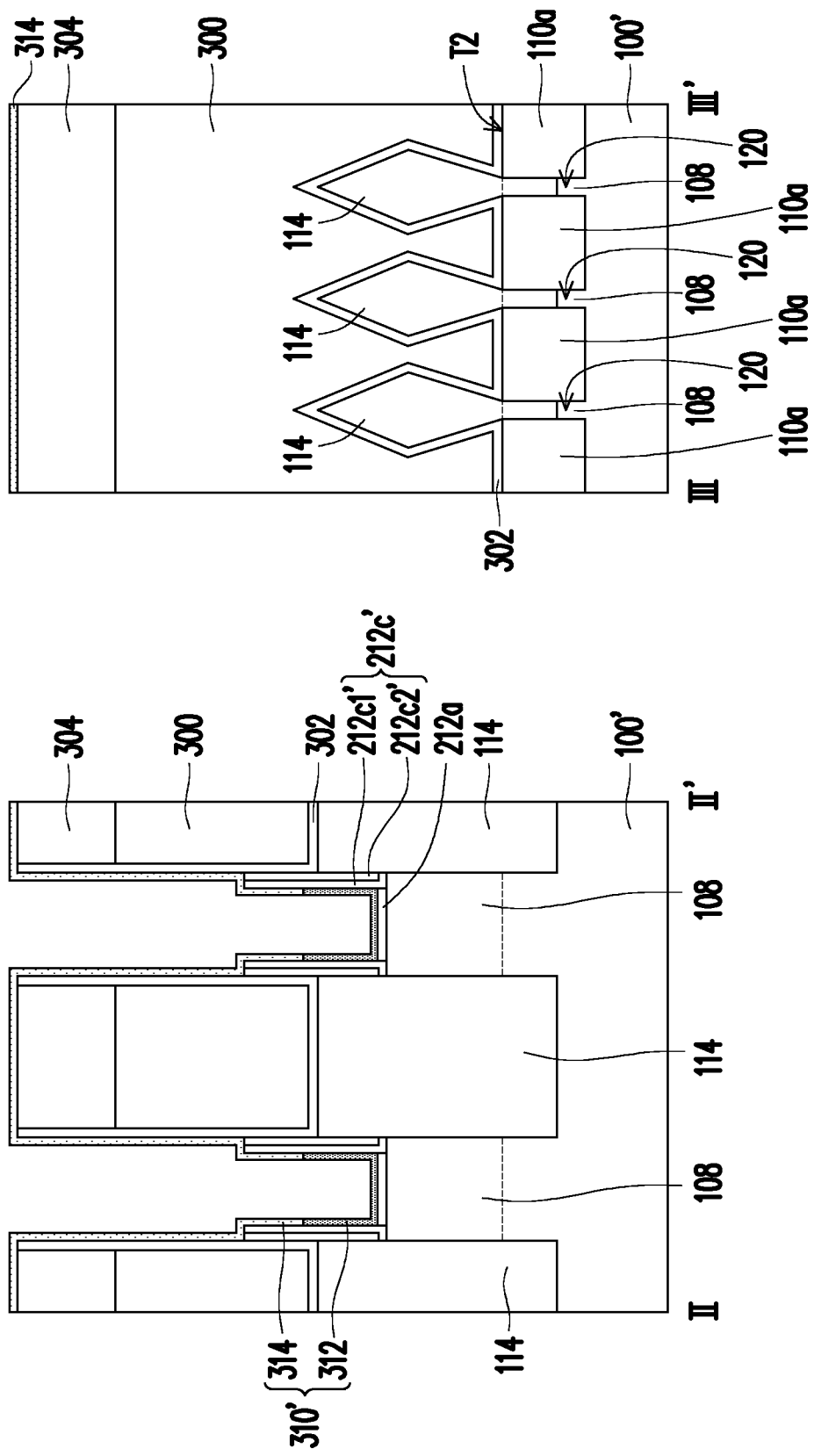

FIG. 16B is a cross-sectional view taken along lines II-II' and III-III' of FIG. 16A. Referring to FIG. 16A and FIG. 16B, a drive-in step is performed such that the dipole dopant of the patterned dipole dopant layer 320' diffuses into the gate insulating layer 310. Therefore, a first region 312 doped with dipole dopant is formed in the gate insulating layer 310'. A second region 314 of the gate insulating layer 310' is not doped with the dipole dopant, and the first region 312 of the gate insulating layer 310' in the narrow hollow NH is doped with the dipole dopant. In some embodiments, the first region 312 is lower than the remaining spacer structures 212c'. The dielectric layer 212a is disposed between the first region 312 and the semiconductor substrate 100'.

In some embodiments, the patterned hard mask layer 330' and the patterned dipole dopant layer 320' are removed after the drive-in step by, for example, wet etching or dry etching. In some alternative embodiments, the patterned hard mask layer 330' is removed before the drive-in step, and the patterned dipole dopant layer 320' is removed after the drive-in step.

Figure 17A:
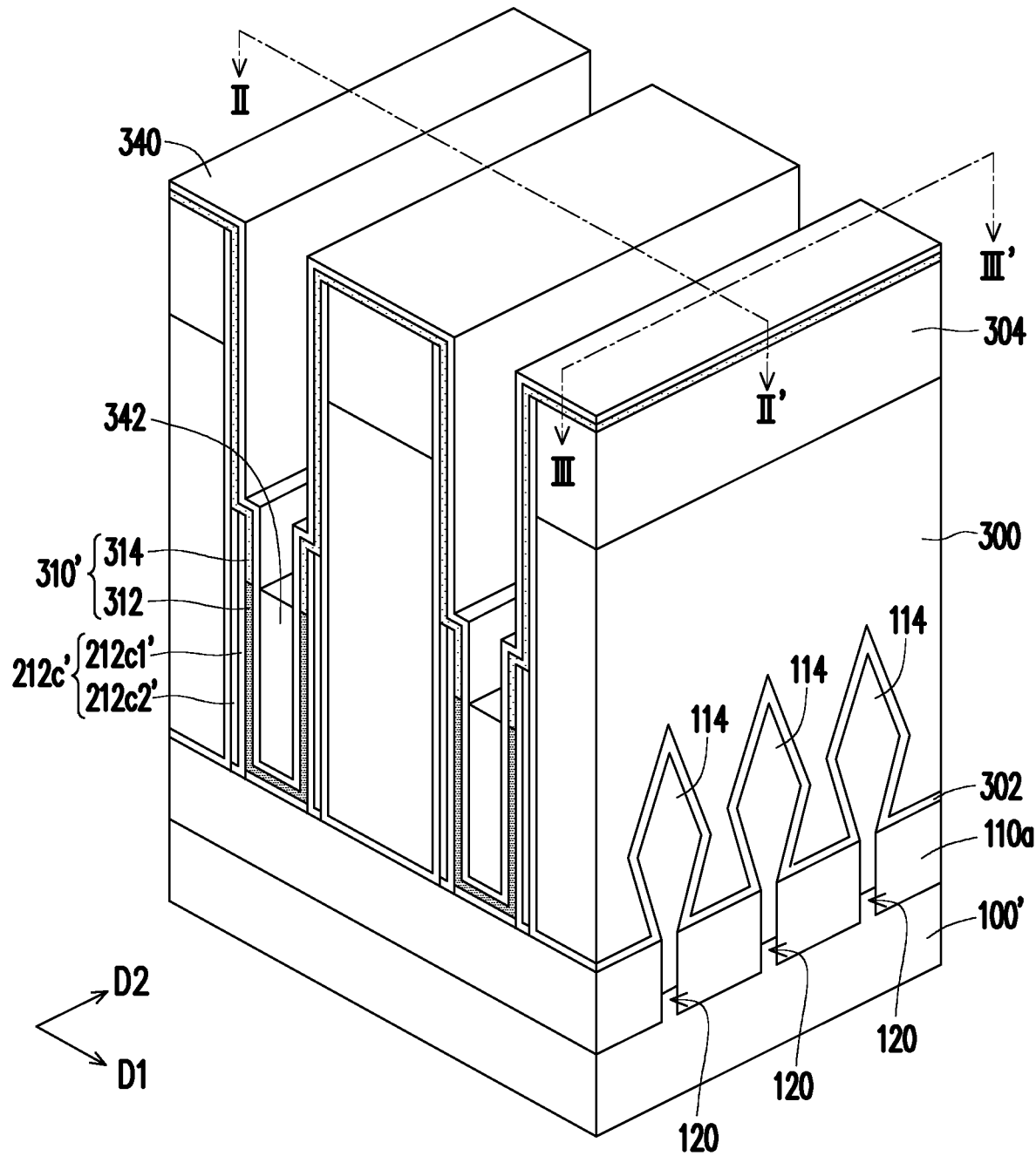
Figure 17B:
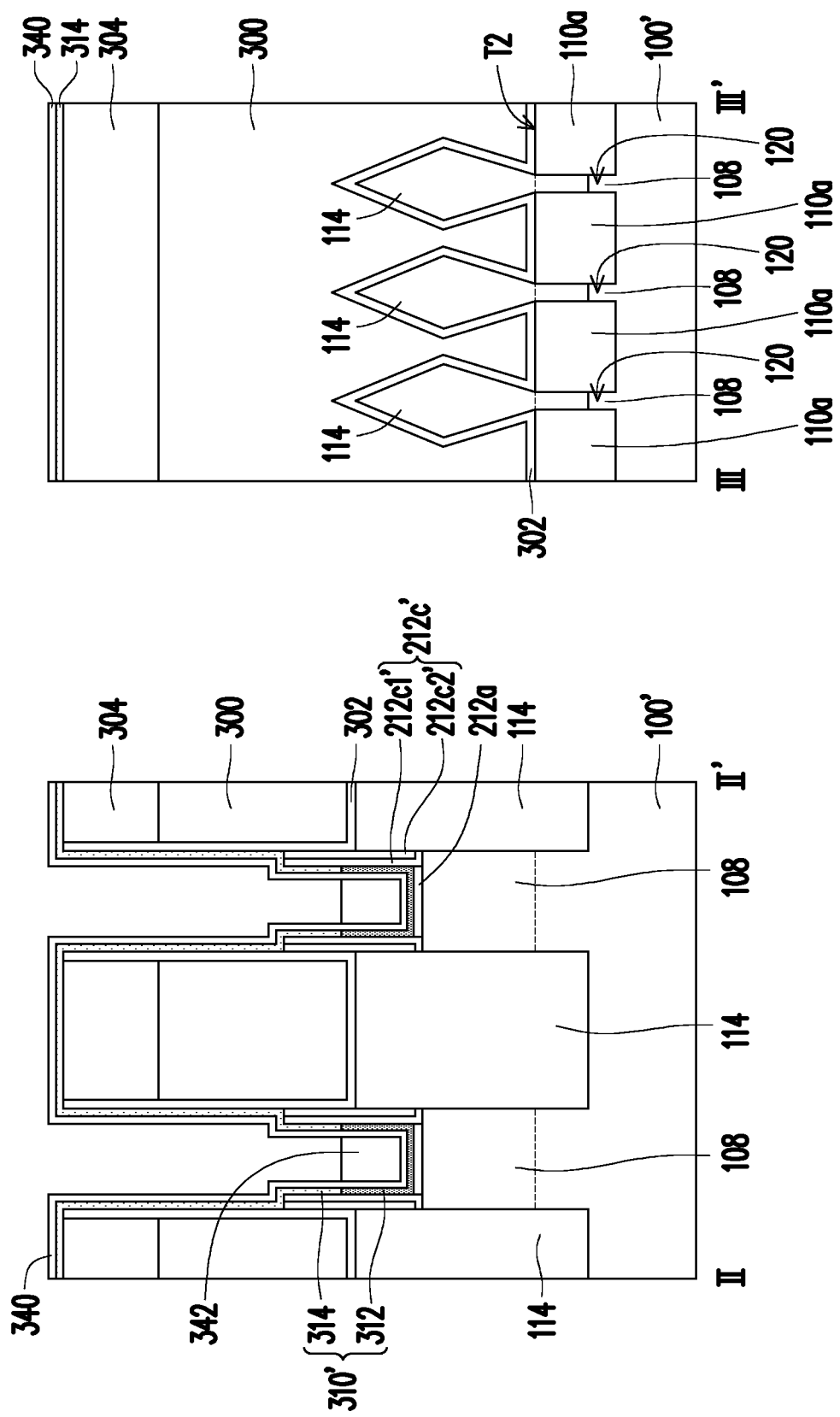

FIG. 17B is a cross-sectional view taken along lines II-II' and III-III' of FIG. 17A. Referring to FIG. 17A and FIG. 17B, a first work function material layer 340 is conformally formed on the gate insulating layer 310. In some embodiments, the first work function material layer 340 includes p-type or n-type work function metals. Exemplary p-type work function metals include TiN, TiSiN, TaN, Ru, Mo, Al, WN, ZrSi$_2$, MoSi$_2$, TaSi$_2$, NiSi$_2$, WN, other suitable p-type work function materials, or combinations thereof. On the other hand, exemplary n-type work function metals include Ti, TiAl, Ag, TaAl, TaAlC, TiAlN, TaC, TaCN, TaSiN, Mn, Zr, other suitable n-type work function materials, or combinations thereof. In some embodiments, the first work function material layer 340 may be formed by, for example, CVD, PECVD, ALD, remote plasma atomic layer deposition (RPALD), plasma-enhanced atomic layer deposition (PEALD), MBD, or the like. In some embodiments, the first work function material layer 340 may serve the purpose of adjusting threshold voltage (Vt) of the subsequently formed semiconductor device.

A mask layer 342, such as a BARC, is formed on the first work function material layer 340. In some embodiments, the mask layer 342 may be formed by any suitable method, such as CVD, spin-on, or the like, and the mask layer 342 may be patterned by using a photoresist pattern as a mask.

Figure 18A:
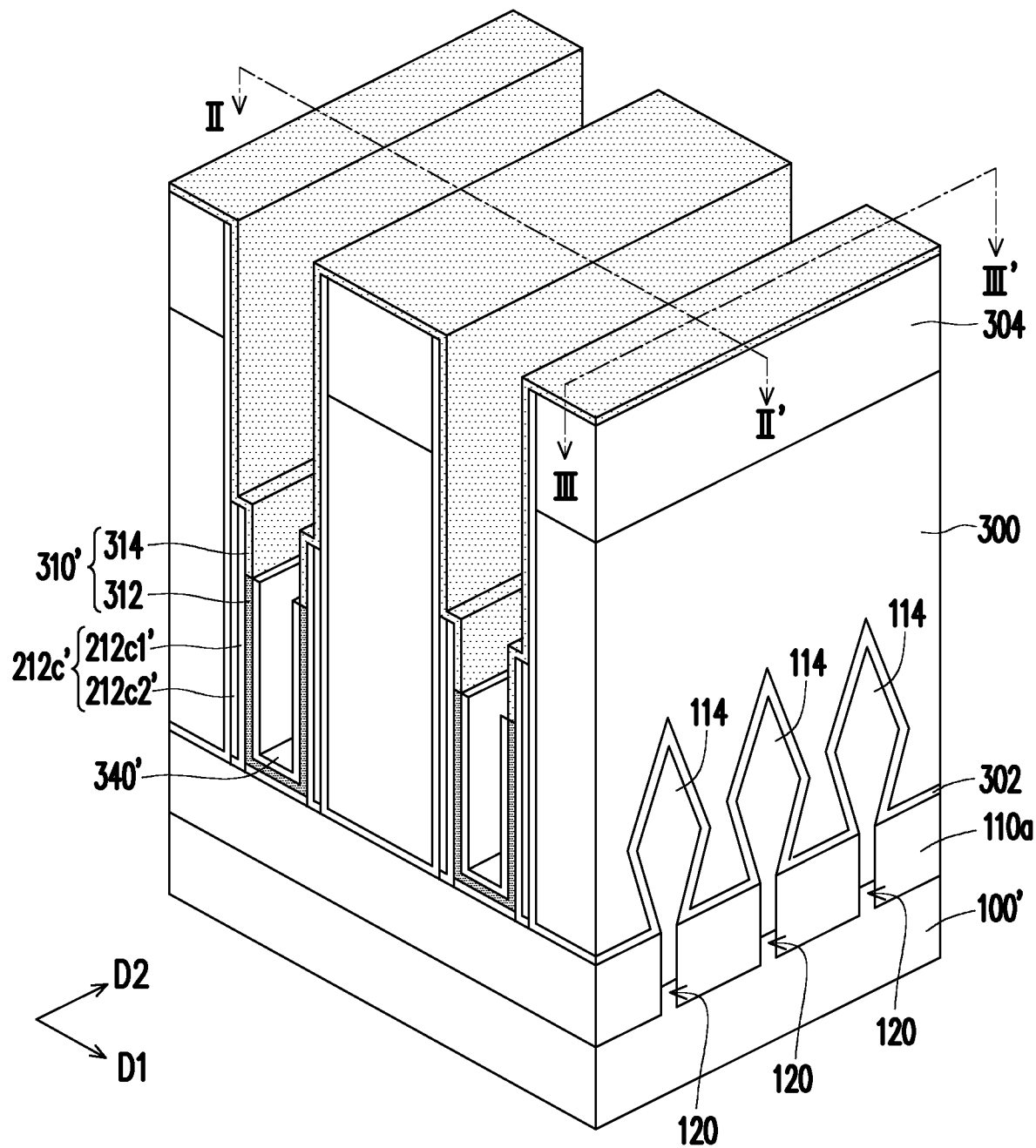
Figure 18B:
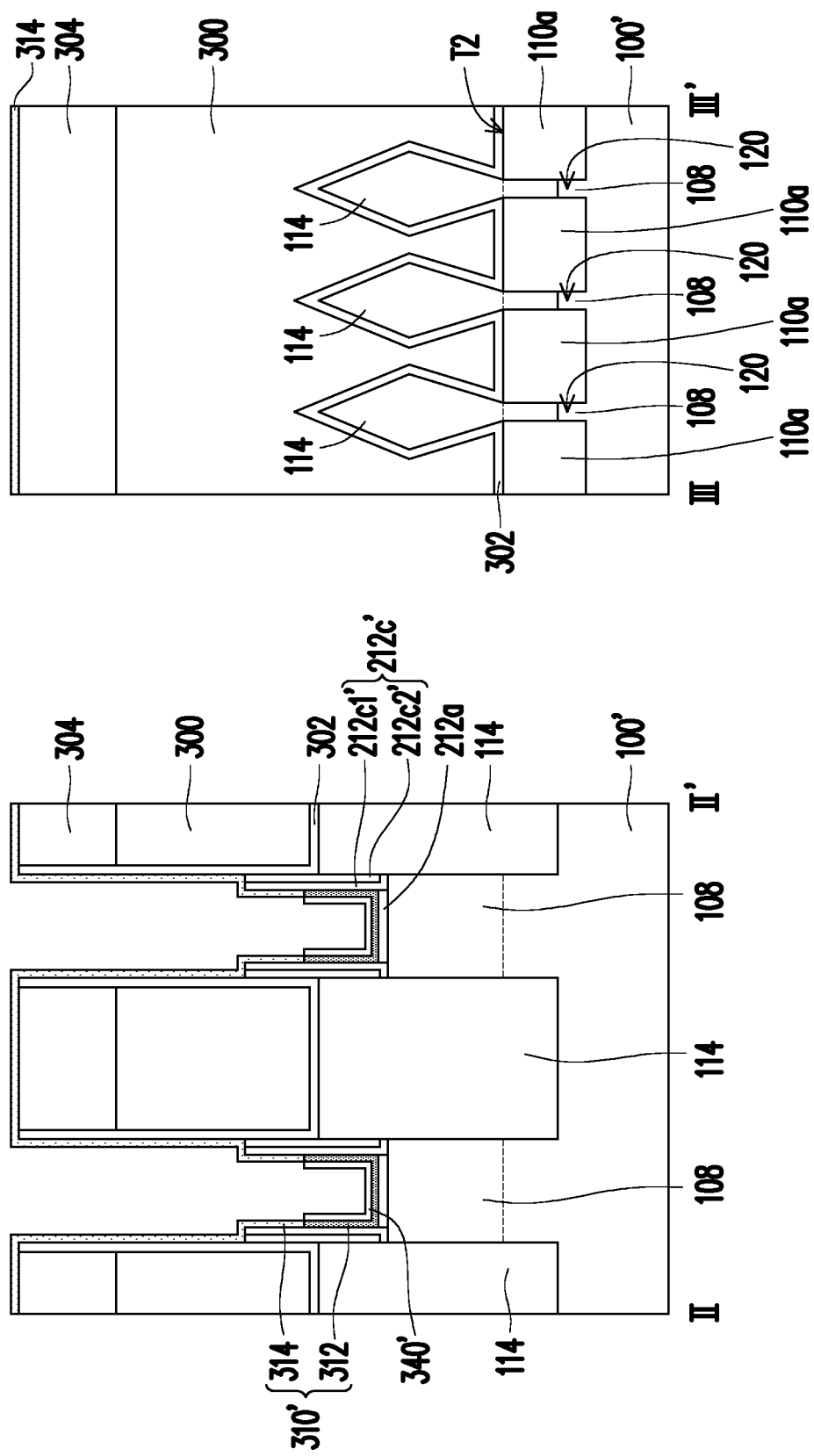

FIG. 18B is a cross-sectional view taken along lines II-II' and III-III' of FIG. 18A. Referring to FIG. 18A and FIG. 18B, the first work function material layer 340 is patterned by using the mask layer 342. In some embodiments, the mask layer 342 may be consumed during the patterning. After forming the first work function metal layer 340', the mask layer 342 is removed by any suitable method, such as O$_2$ ashing process, etching process or other suitable process. In some embodiments, the height of the first work function metal layer 340' is lower than the height of the remaining spacer structures 212c'. That is, the first work function metal layer 340' exposes the gate insulating layer 310 in the wide hollow WH and the gate insulating layer 310 at the top portion of the narrow hollow NH. The first region 312 is horizontally located between the first work function metal layer 340' and the spacer structures 212c'. The first work function metal layer 340' is in contact with the first region 312.

Figure 19A:
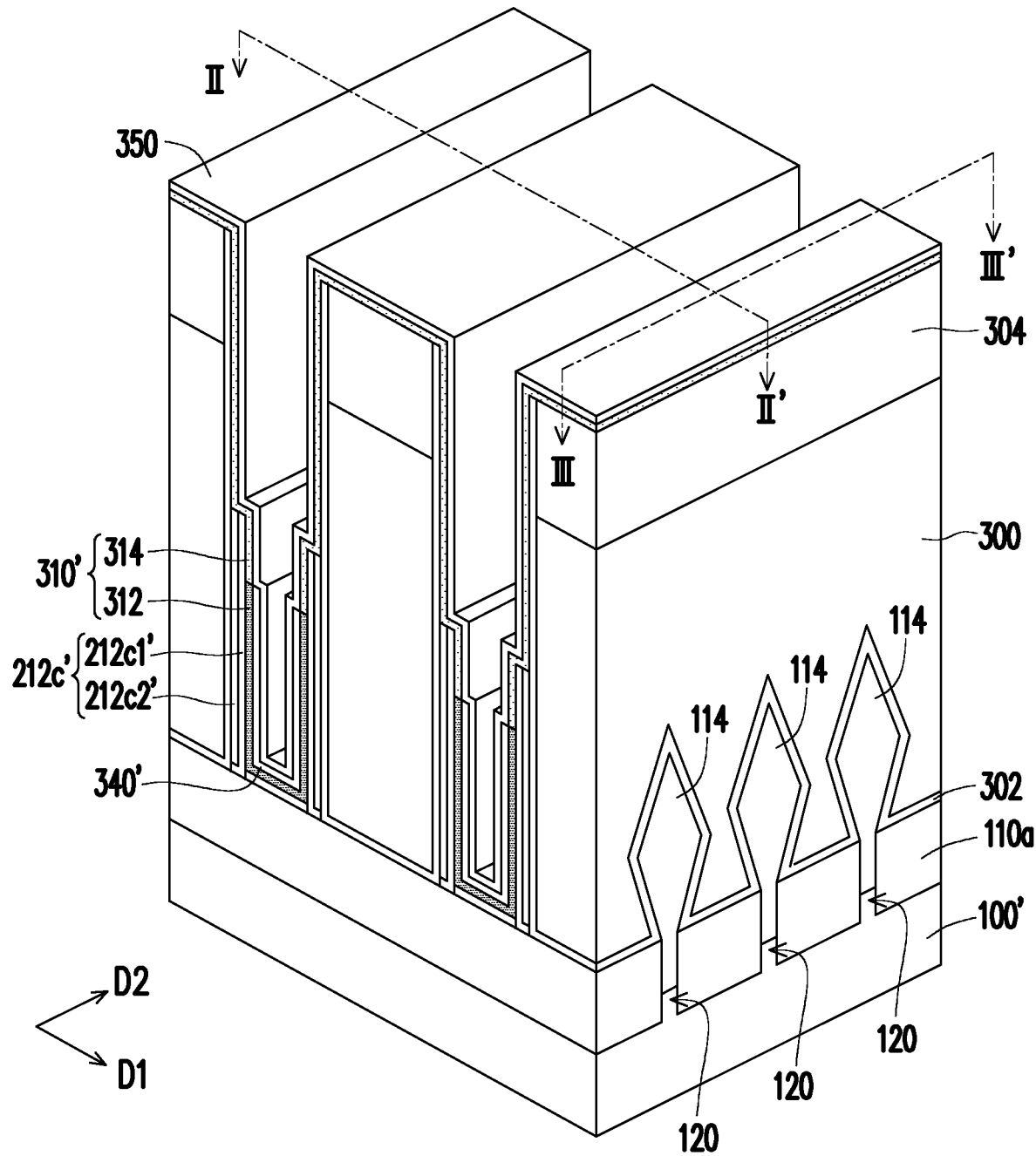
Figure 19B:
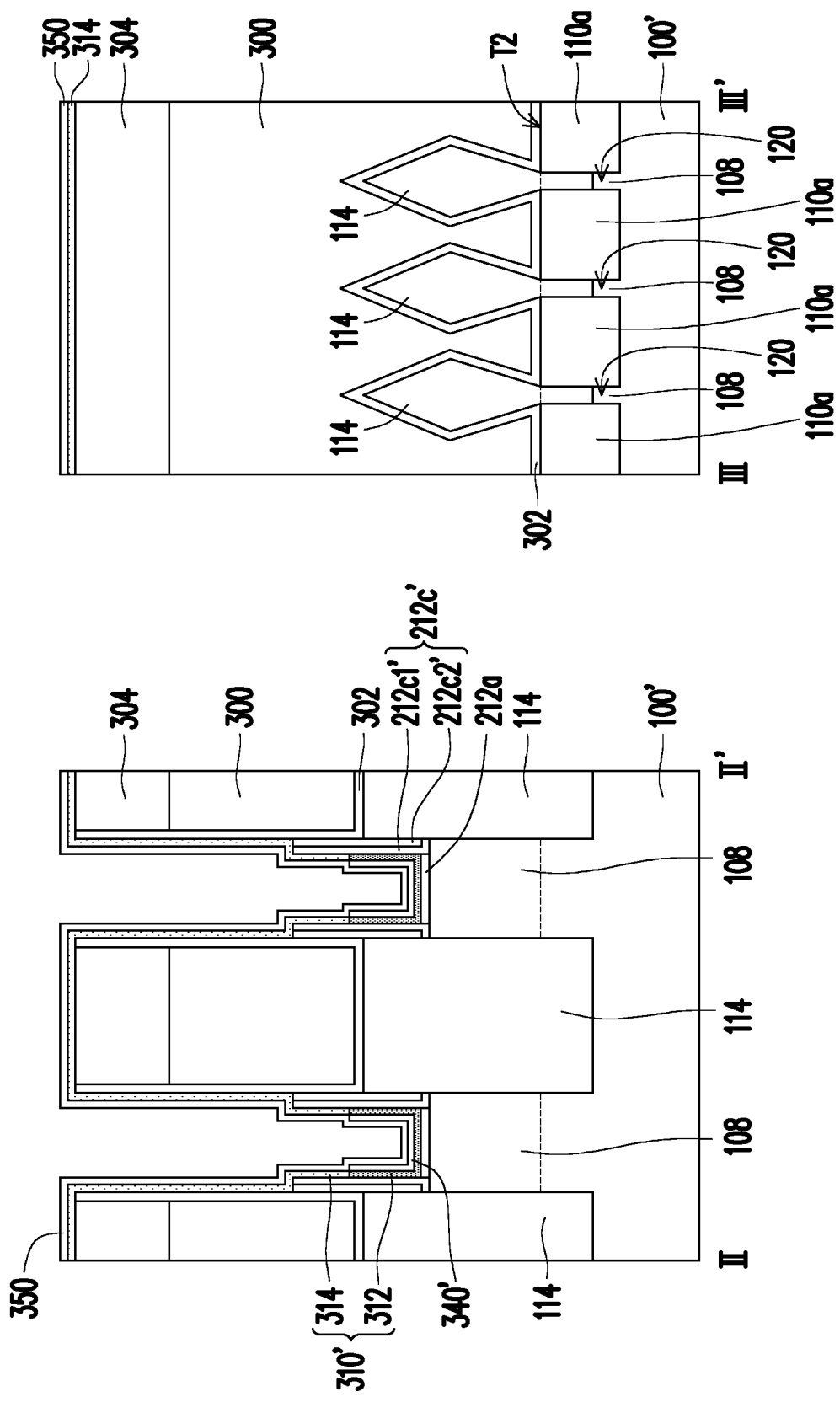

FIG. 19B is a cross-sectional view taken along lines II-II' and III-III' of FIG. 19A. Referring to FIG. 19A and FIG. 19B, a second work function material layer 350 is conformally formed on the gate insulating layer 310 and the first work function metal layer 340'. In some embodiments, the second work function material layer 350 includes p-type or n-type work function metals. Exemplary p-type work function metals include TiN, TiSiN, TaN, Ru, Mo, Al, WN, ZrSi$_2$, MoSi$_2$, TaSi$_2$, NiSi$_2$, WN, other suitable p-type work function materials, or combinations thereof. On the other hand, exemplary n-type work function metals include Ti, TiAl, Ag, TaAl, TaAlC, TiAlN, TaC, TaCN, TaSiN, Mn, Zr, other suitable n-type work function materials, or combinations thereof. The second work function material layer 350 and the first work function metal layer 340' include different types of work function materials. In some embodiments, the second work function material layer 350 may be formed by, for example, CVD, PECVD, ALD, RPALD, PEALD, MBD, or the like. In some embodiments, the first work function material layer 340 may serve the purpose of adjusting threshold voltage (Vt) of the subsequently formed semiconductor device.

Figure 20A:
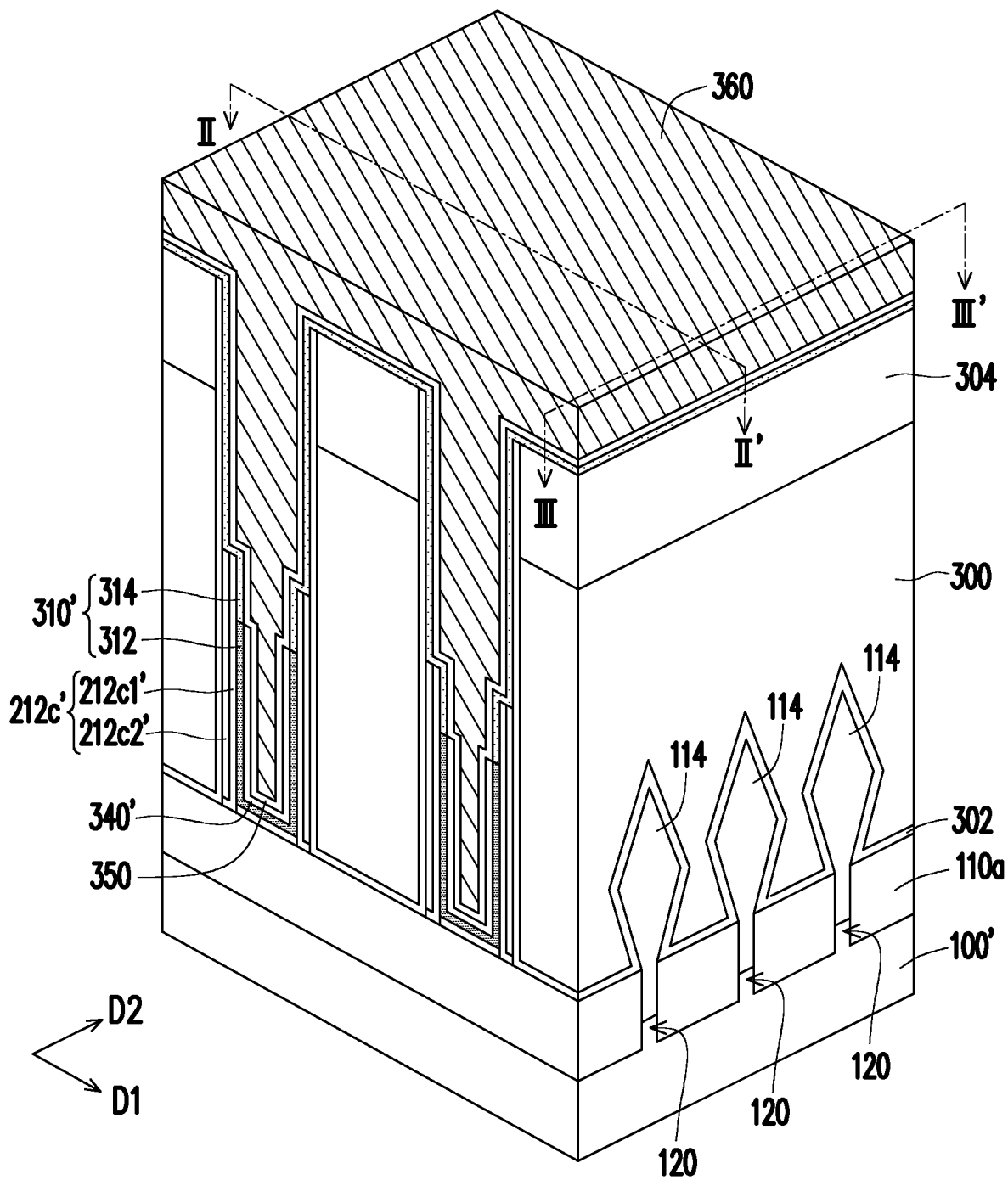
Figure 20B:
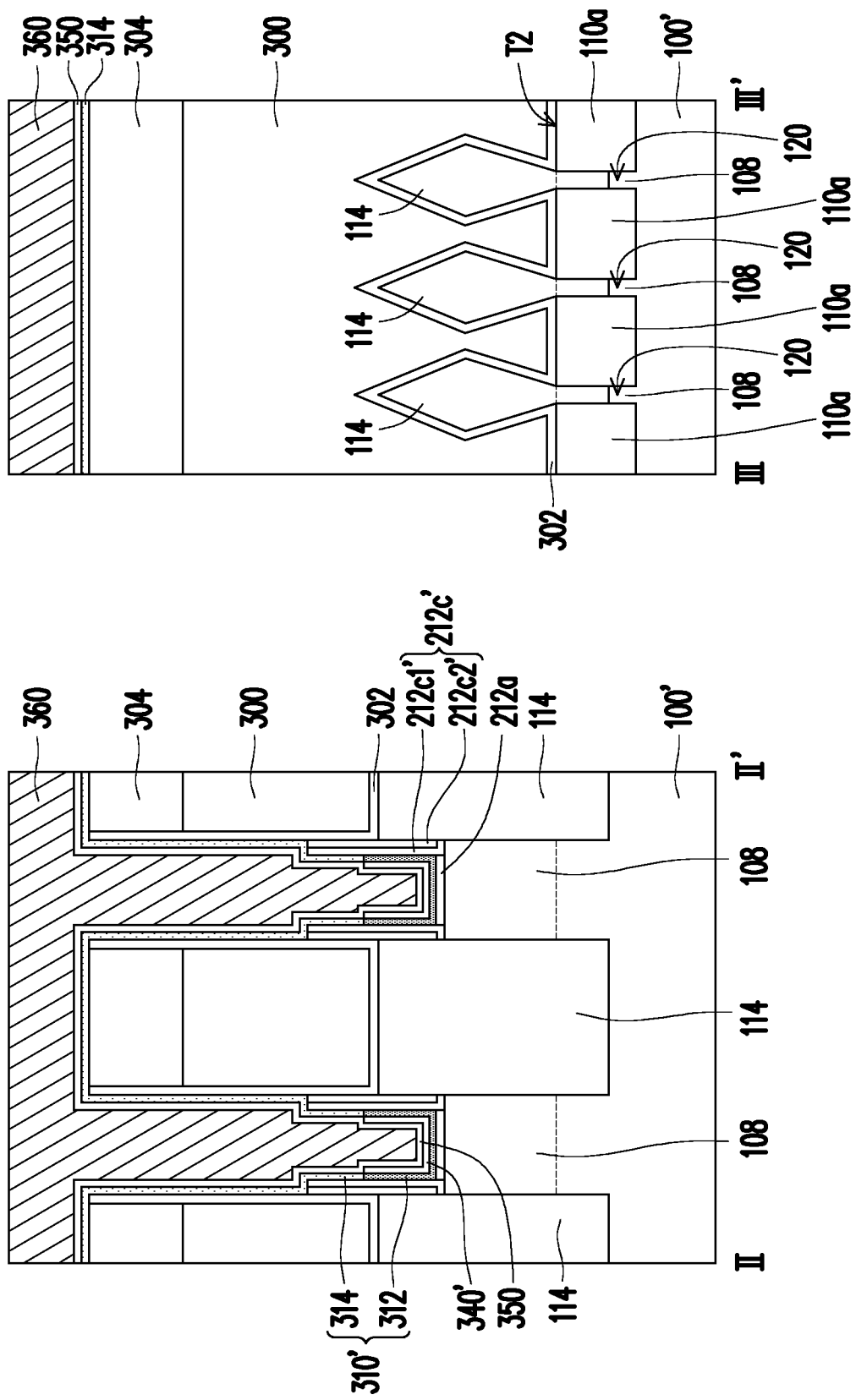

FIG. 20B is a cross-sectional view taken along lines II-II' and III-III' of FIG. 20A. Referring to FIG. 20A and FIG. 20B, a glue material layer 360 is formed on the second work function material layer 350. In some embodiments, the glue material layer 360 may be formed through CVD, PVD, sputtering or other suitable process. The glue material layer 360 may be TiN, TaN or the like.

Figure 21A:
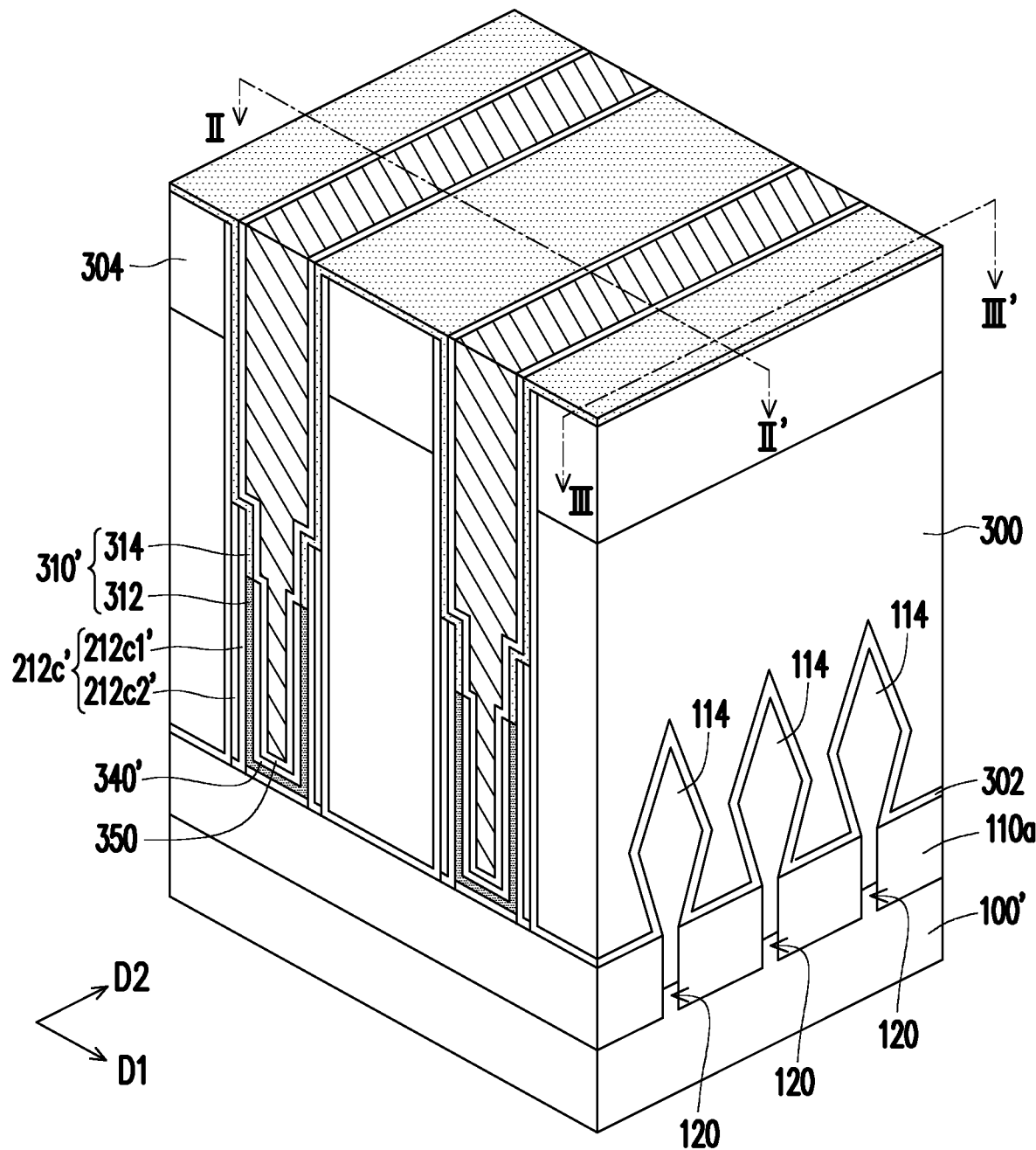
Figure 21B:
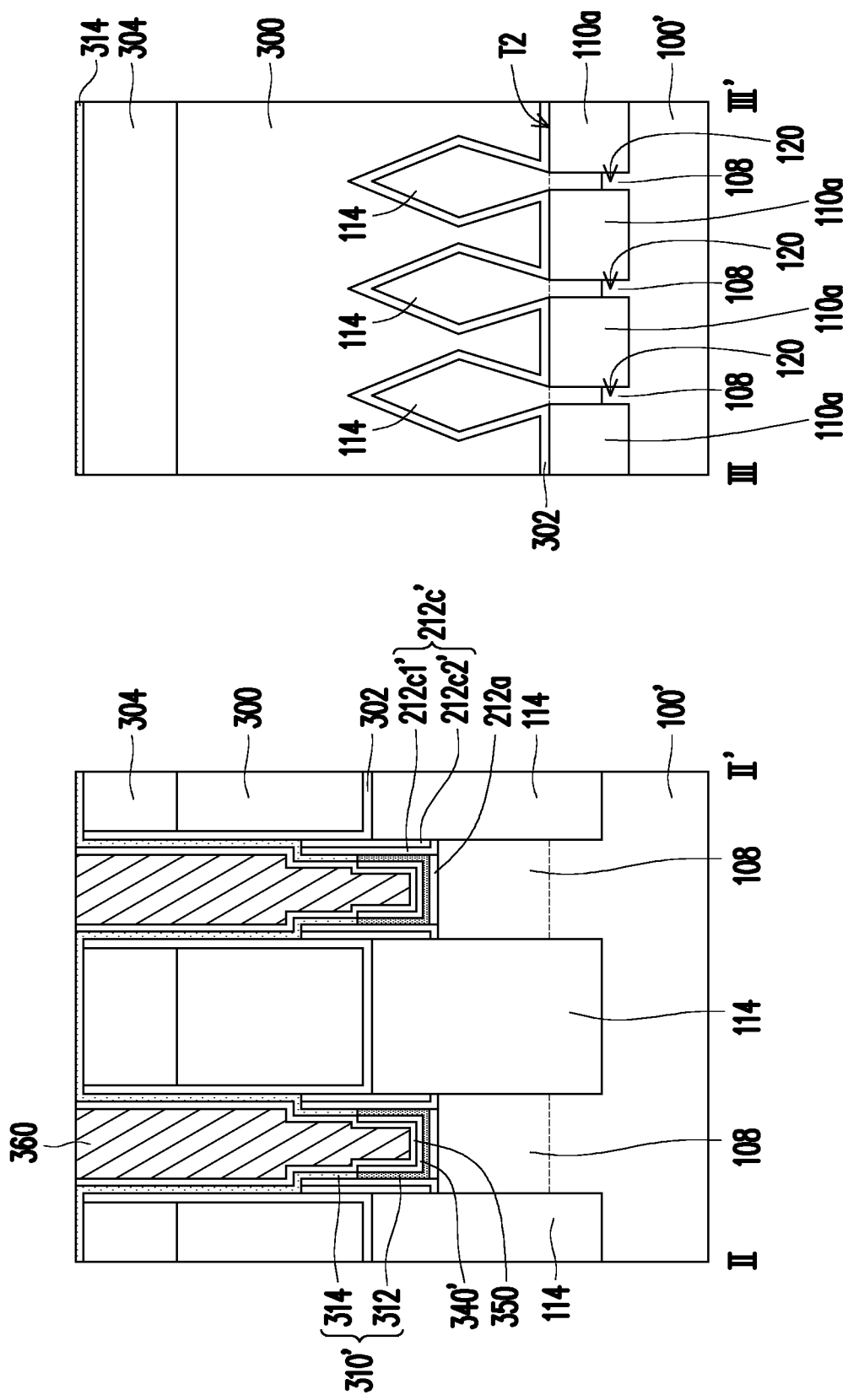

FIG. 21B is a cross-sectional view taken along lines II-II' and III-III' of FIG. 21A. Referring to FIG. 21A and FIG. 21B, after forming the glue material layer 360, a first removal process is performed to partially remove the glue material layer 360 and the second work function material layer 350 located outside the hollow portions H. The top surfaces of the glue material layer 360 and the second work function material layer 350 substantially level with the top surface of the cap layer 304. The first removal process may be or include a planarization process such as a CMP process or a mechanical grinding process.

Figure 22A:
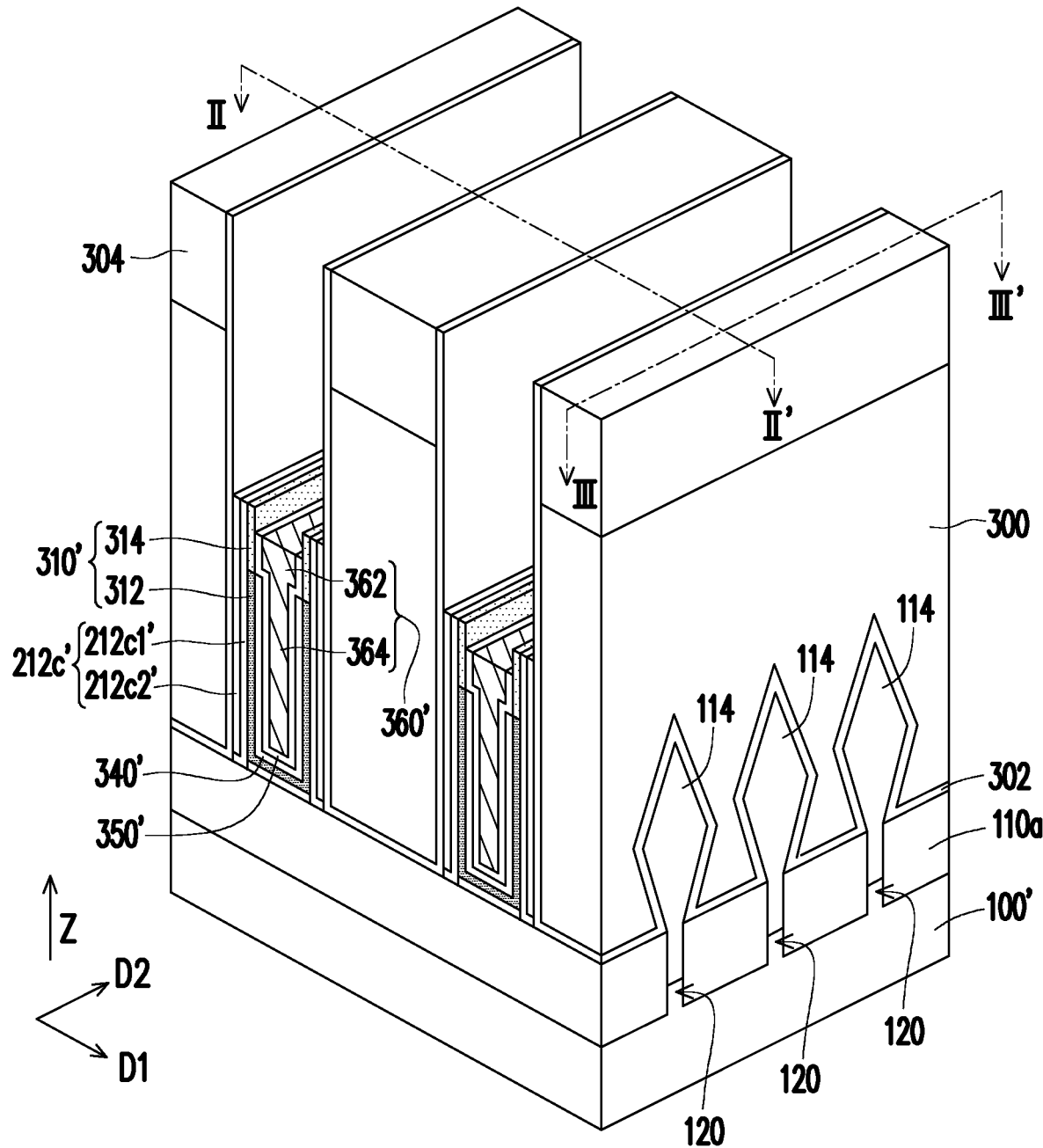
Figure 22B:
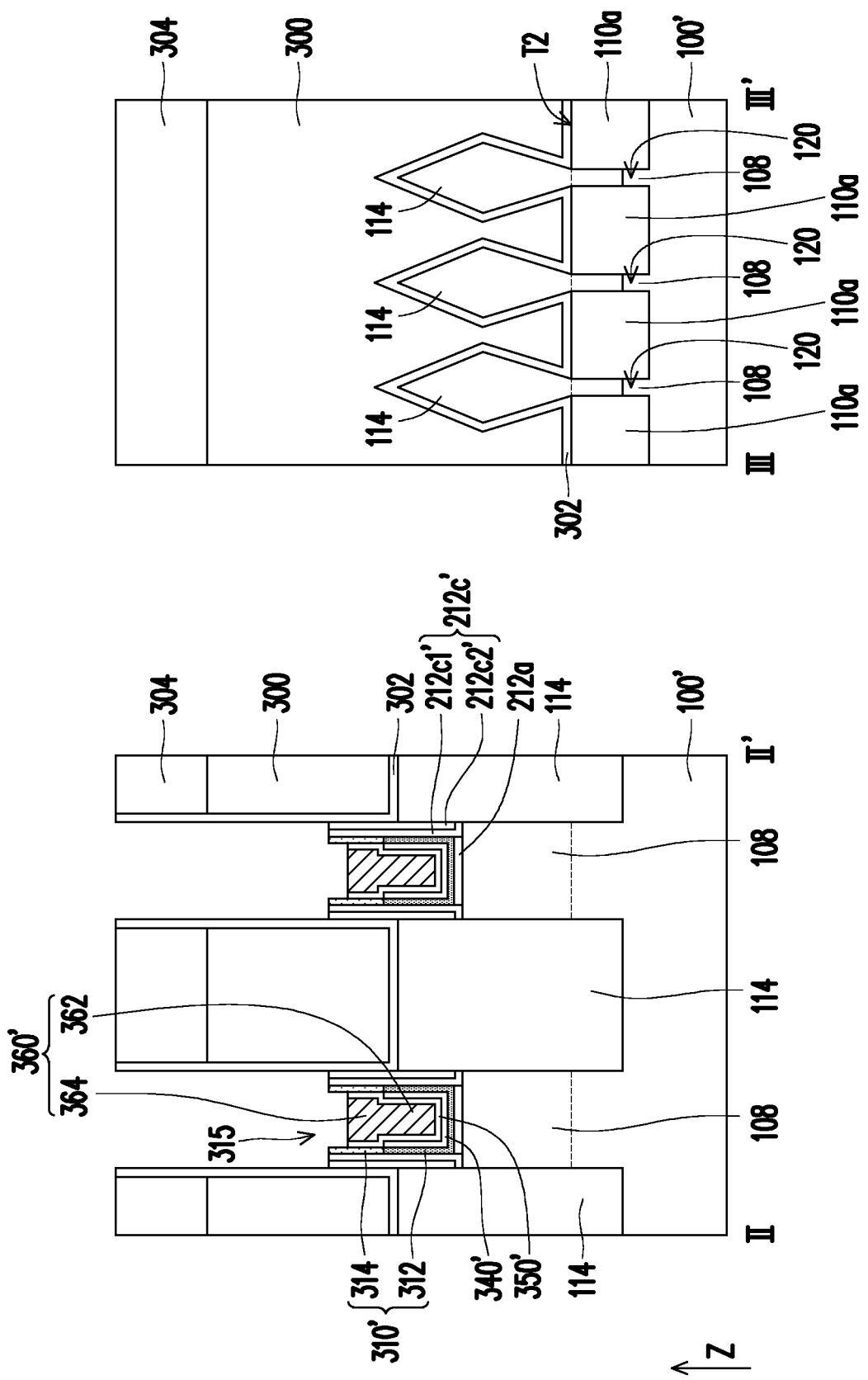

FIG. 22B is a cross-sectional view taken along lines II-II' and III-III' of FIG. 22A. Referring to FIG. 22A and FIG. 22B, after the first removal process, a second removal process is performed to partially remove the glue material layer 360, the second work function material layer 350 and the gate insulating layer 310 in the wide hollow WH. In this embodiment, a portion of the glue material layer 360 and a portion of the second work function material layer 350 in the narrow hollow NH are also removed by the second removal process. After the second removal process, the second work function metal layer 350', the glue layer 360' and the gate insulating layer 310' are located in the narrow hollow NH. Both of the first work function metal layer 340', the second work function metal layer 350', the glue layer 360' and the gate insulating layer 310' are disposed between inner sidewalls of the spacer structures 212c'. In some embodiments, the second removal process includes one or more etching process(es). Due to the different etching rates, the height of the gate insulating layer 310' in the Z-axis direction is higher than that of the second work function metal layer 350' and the glue layer 360'. In some embodiments, the first region 312 and the first work function metal layer 340' do not need to be removed in the second removal, so the difficulty of the etching process can be reduced, and the yield of the second removal can be improved.

The gate insulating layer 310' includes a first region 312 doped with dipole dopant and second regions 314 without the dipole dopant. The first region 312 is connected with the second regions 314. Two second regions 314 are respectively connected with two ends of the first region 312. The first region 312 is located between bottom portions of the spacer structures 212c' and the second regions 314 are located above the first region 312. The first work function metal layer 340' is located below the second regions 314 and in contact with the first region 312. In some embodiments, the second regions 314 extend beyond the top surfaces of the second work function metal layer 350' and the glue layer 360', so that a gate accommodation space 315 is located between the second regions 314. In some embodiments, the top surfaces of the second regions 314 are leveled with the top surfaces of the spacer structures 212c', but the disclosure is not limited thereto. In other embodiments, the top surfaces of the second regions 314 are lower than the spacer structures 212c'.

The height of the second work function metal layer 350' in the Z-axis direction is higher than that of the first work function metal layer 340'. The second work function metal layer 350' covers and crosses two ends of the first work function metal layer 340' and is in contact with the second regions 314 of the gate insulating layer 310'. That is, the second work function metal layer 350' include a step structure that climb through the first work function metal layer 340'. The glue layer 360' is disposed on the second work function metal layer 350' and includes a narrow portion 362 horizontally located between the first region 312 and a wide portion 364 horizontally located between the second regions 314. Both of the narrow portion 362 and the wide portion 364 are disposed between the spacer structures 212c'. A part of the second work function metal layer 350' is located between the wide portion 364 and the second regions 314. Another part of the second work function metal layer 350' is located between the narrow portion 362 and the first work function metal layer 340'.

In this embodiment, the first region 312 is protected by the second regions 314 from being loss during the second removal process. Therefore, no metal residue (e.g., residue containing dipole dopant) will appear above the spacer structures 212c' or on the etch stop layer 302 after the second removal process. If the metal residue exists, the residue may serve as the seed layer of a gate metal in the subsequent process, resulting in the formation of the gate metal at unexpected locations, and increasing the possibility of short circuit of the device. In addition, the metal residue may also cause the gate metal to have an uneven surface. Therefore, the second regions 314 may reduce the possibility of short circuit of the device, and the second regions 314 may make the gate metal formed subsequently have a flatter surface.

Figure 23A:
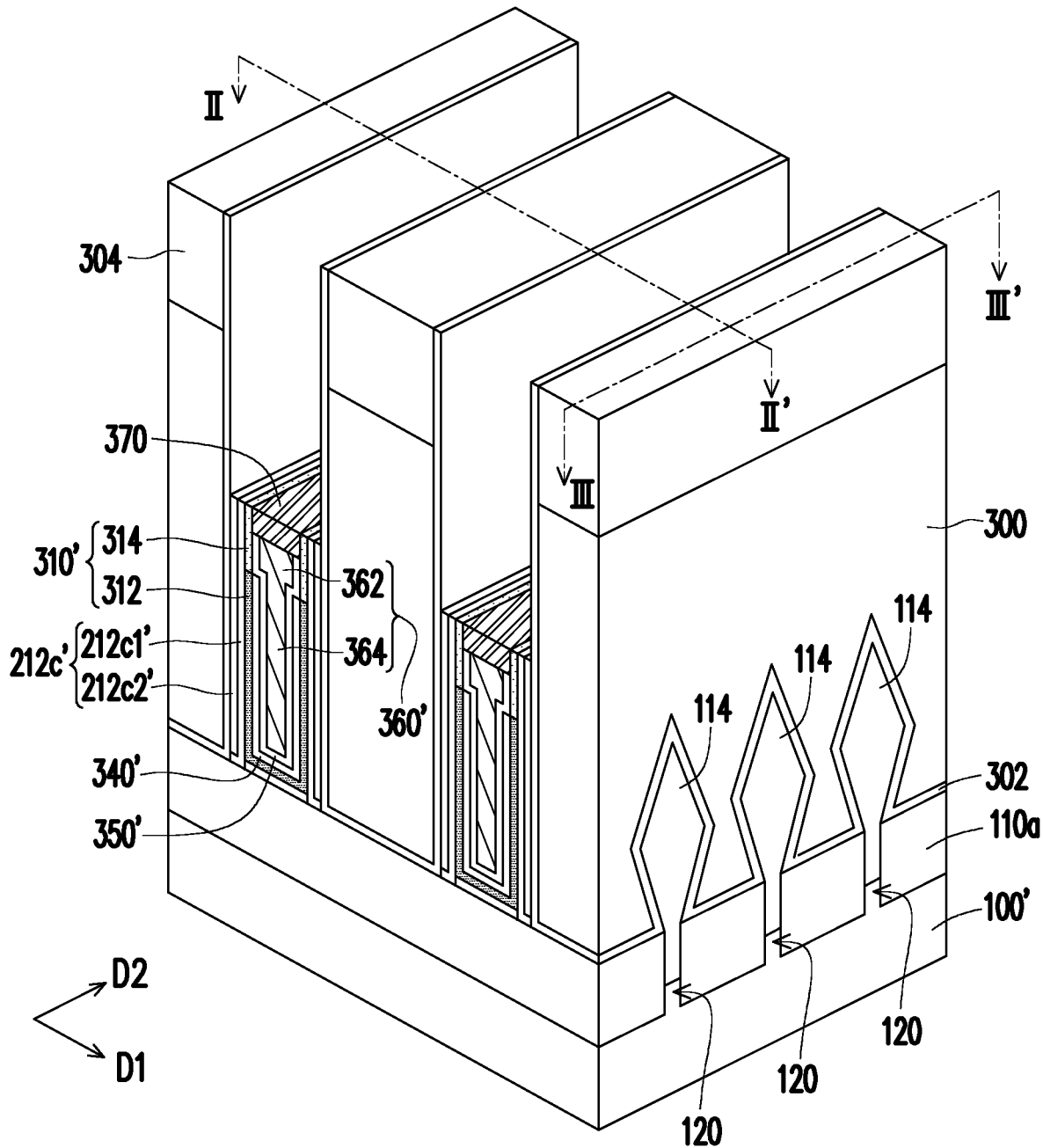
Figure 23B:
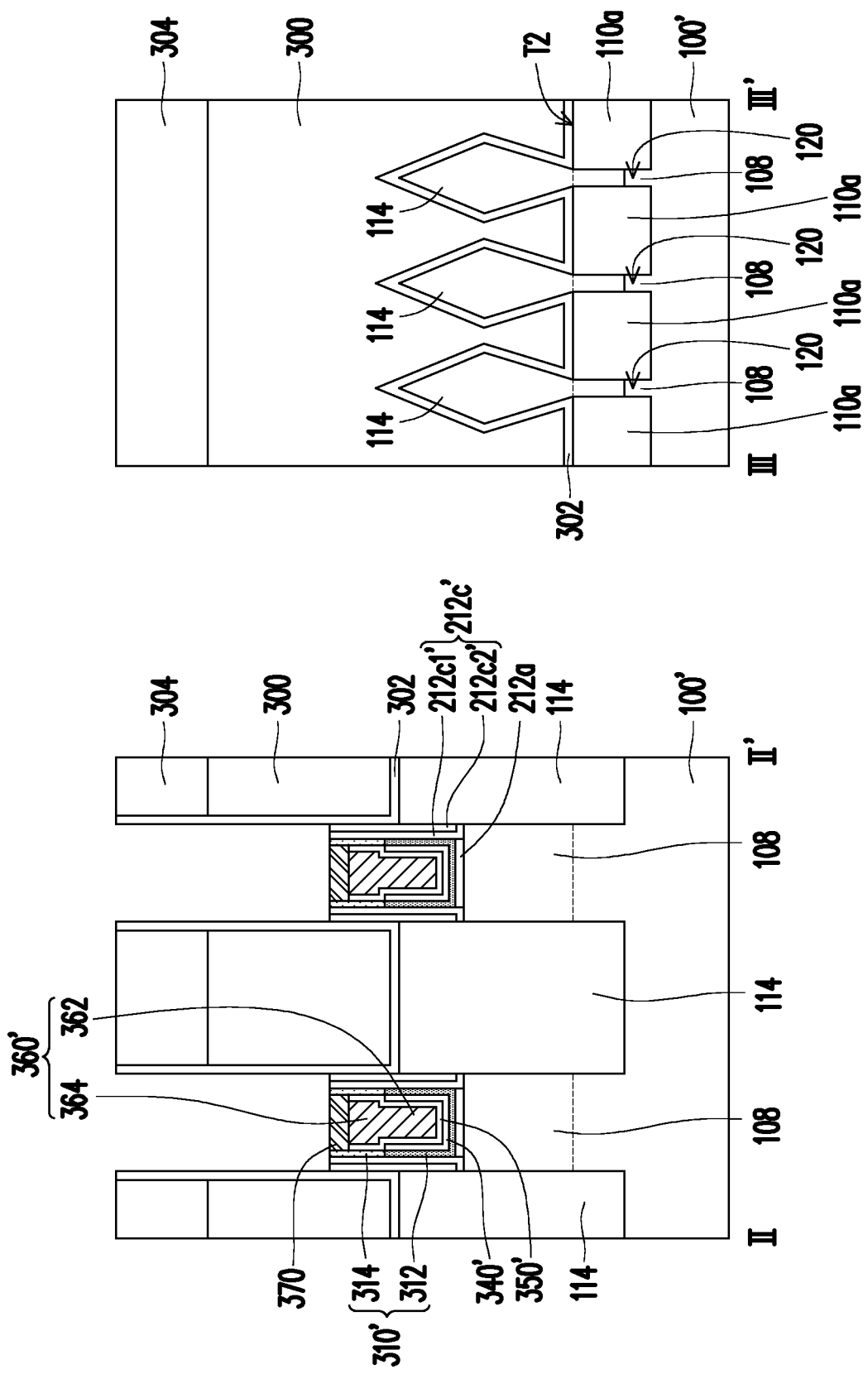

FIG. 23B is a cross-sectional view taken along lines II-II' and III-III' of FIG. 23A. Referring to FIG. 23A and FIG. 23B, a metal gate 370 is formed in the hollow portion H. In this embodiment, the metal gate 370 is formed in the gate accommodation space 315 between the second regions 314. In some embodiments, the metal gate 370 is formed on the glue layer 360' and the second work function metal layer 350'. In some embodiments, the materials of the gate material layer 370 include aluminum (Al), titanium (Ti), tungsten (W), tantalum (Ta), nitride thereof, combinations thereof, and/or alloys thereof. In some embodiments, the formation of the metal gate 370 includes electroless plating, plating or other suitable process. In some embodiments, the glue layer 360' may be a seed layer in the formation process of the metal gate 370. The glue layer 360' is disposed between the second work function metal layer 350' and the metal gate 370. In some embodiments, a part of the wide portion 364 of the glue layer 360' is vertically located between the second work function metal layer 350' and the metal gate 370.

In some embodiment, there is no impurities including titanium, aluminum and/or fluorine located above the spacer structures 212c' or on the etch stop layer 302. Therefore, the metal gate 370 is formed at the desired location. In some embodiments, the metal gate 370 includes a flat surface and has a uniform thickness such as 2 nm to 8 nm. The metal gate 370 is disposed above the first work function metal layer 340', and the metal gate 370 is disposed between inner sidewalls of the spacer structures 212c' and in contact with inner sidewalls of the second regions 314, two ends of the second work function metal layer 350' and top surface of the glue layer 360'.

Figure 24A:
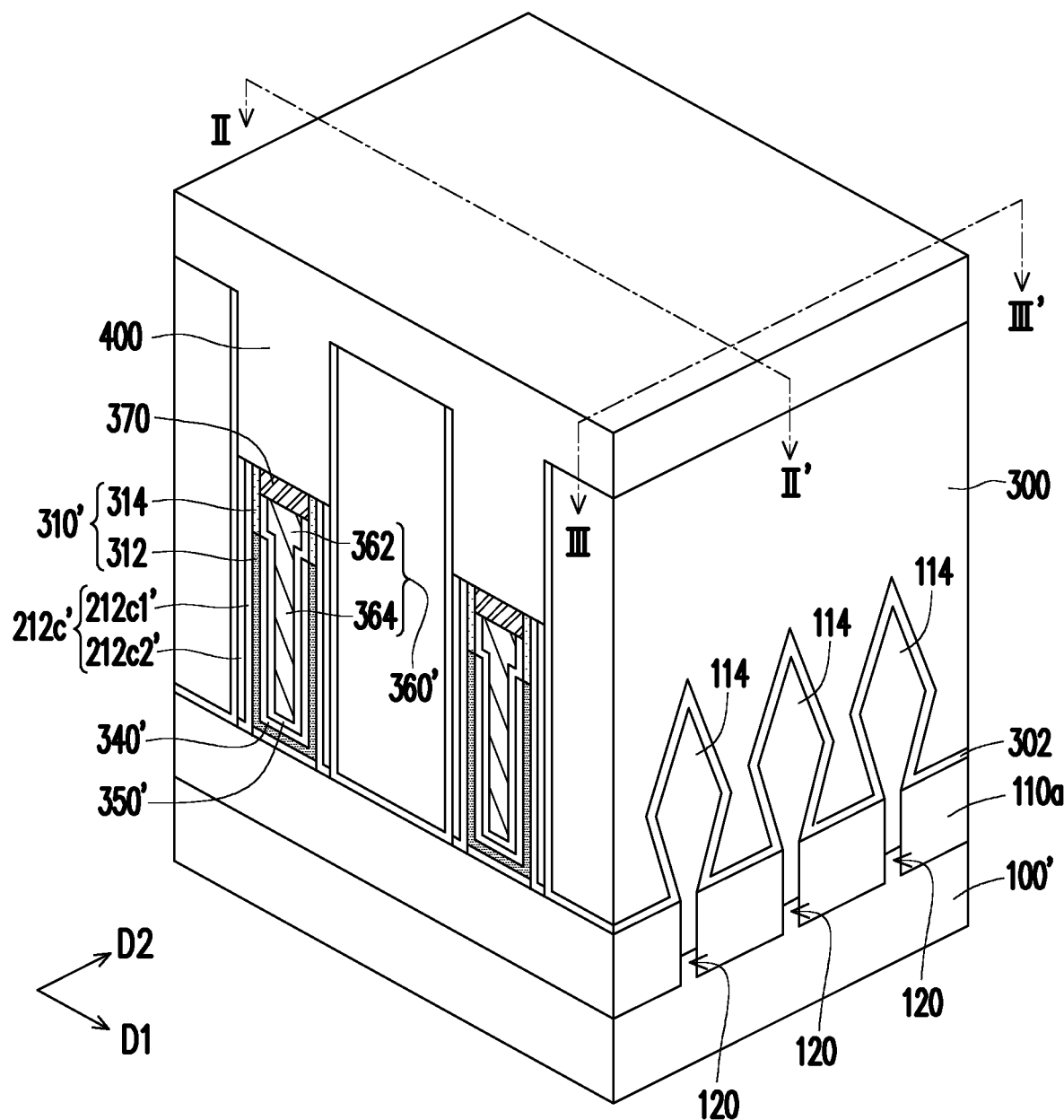
Figure 24B:
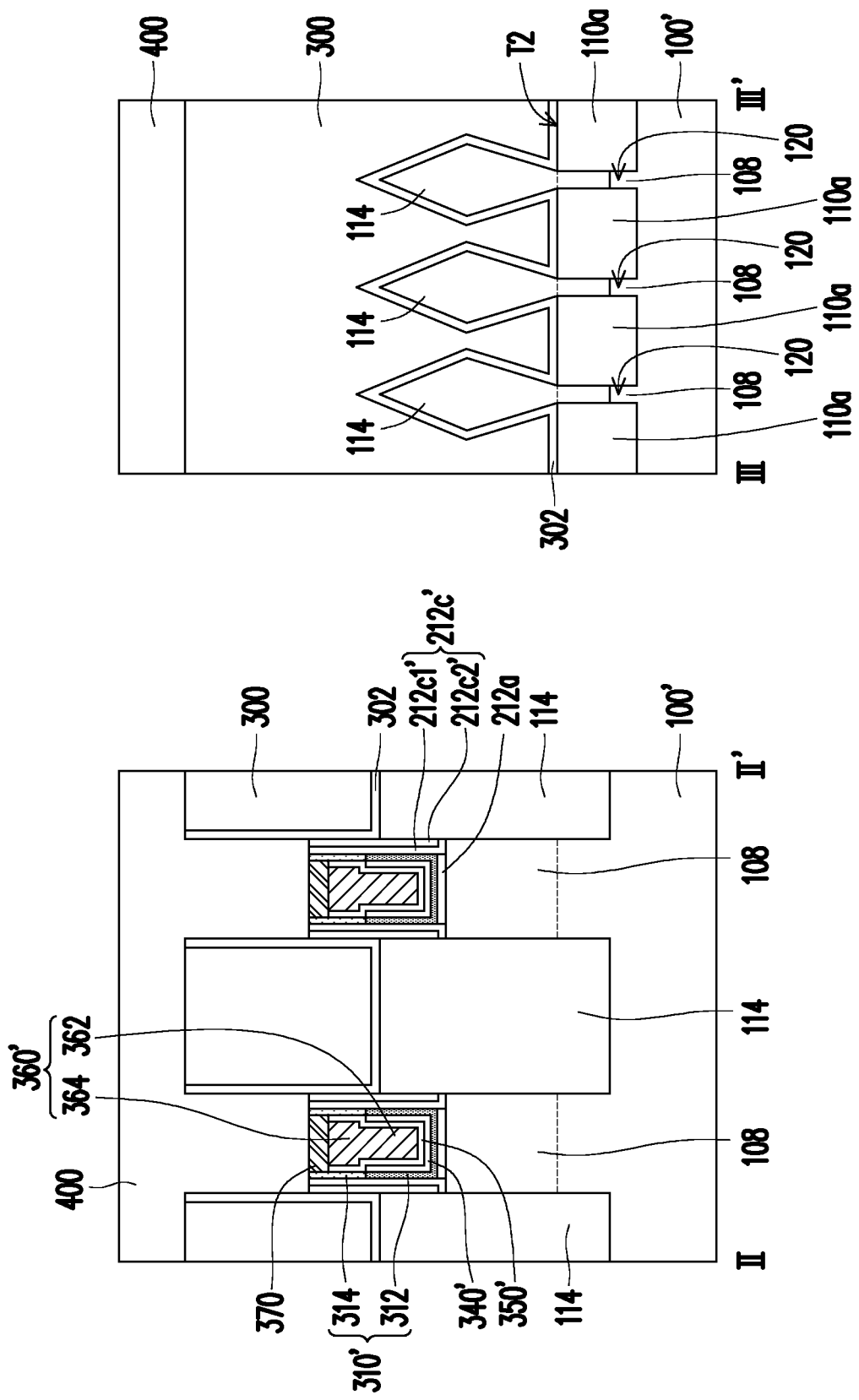

FIG. 24B is a cross-sectional view taken along lines II-II' and III-III' of FIG. 24A. Referring to FIG. 24A and FIG. 24B, a hard mask material layer 400 is formed on the metal gate 370. The hard mask material layer 400 fills into the wide hollow WH. In some embodiments, the hard mask material layer 400 may be formed of silicon oxide, silicon nitride, silicon carbo-nitride, SiOCN, or the like. In some embodiments, the hard mask material layer 400 is disposed on the spacer structures 212c', the second region 314 and the metal gate 370.

Figure 25A:
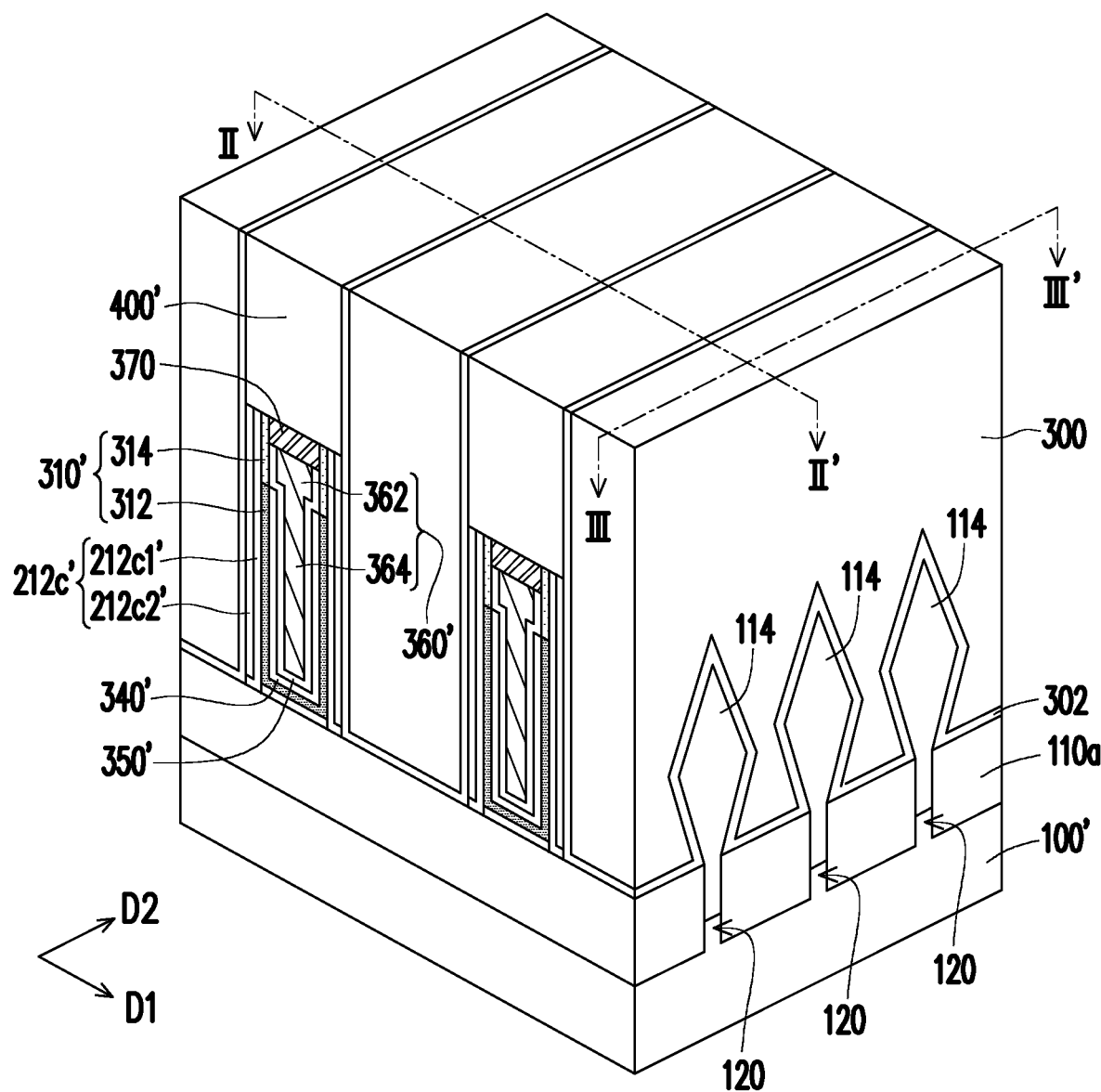
Figure 25B:
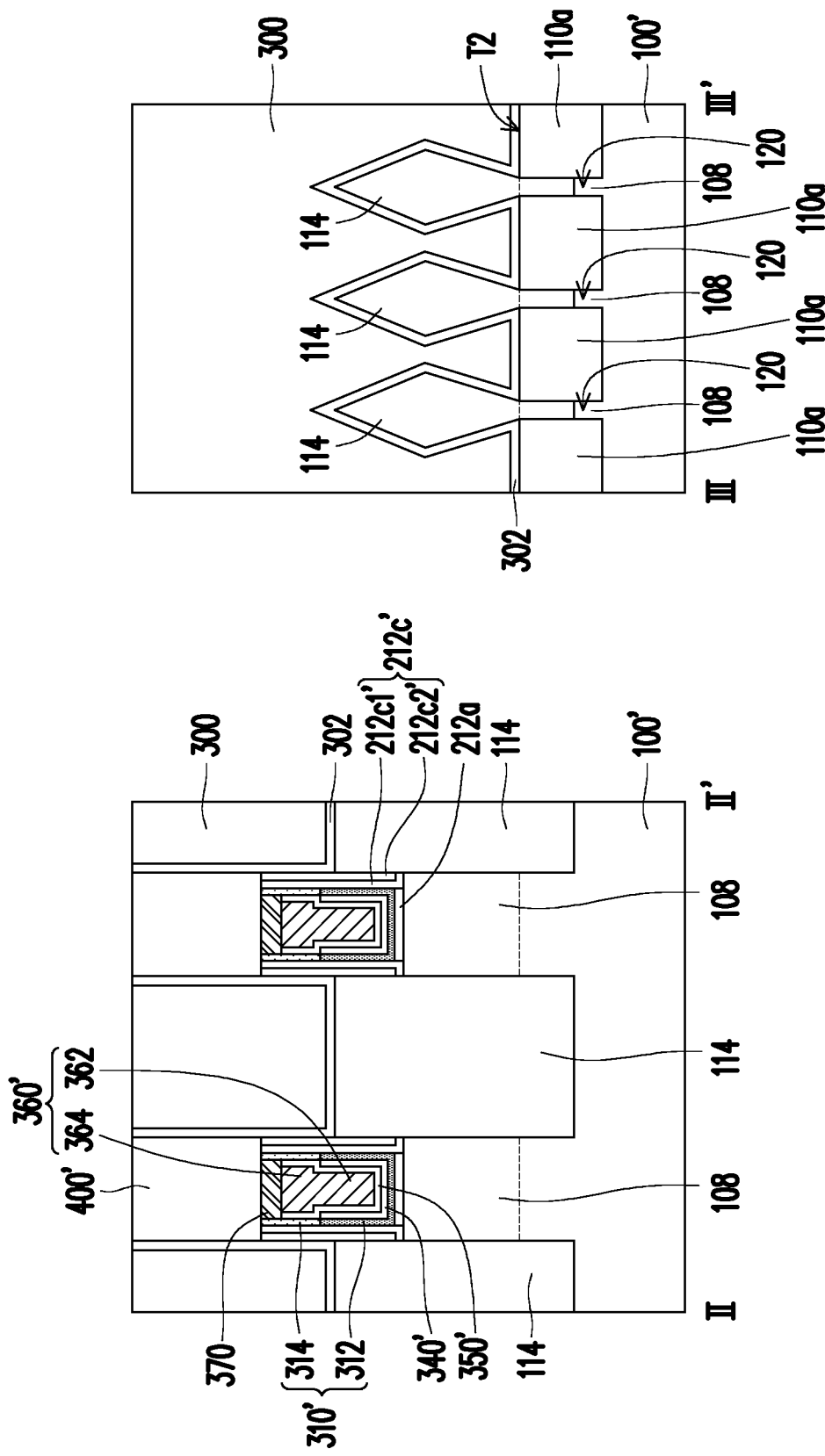

FIG. 25B is a cross-sectional view taken along lines II-II' and III-III' of FIG. 25A. Referring to FIG. 25A and FIG. 25B, a planarization process is performed on the hard mask material layer 400, the cap layer 304 and the etch stop layer 302. In some embodiments, a portion of the hard mask material layer 400, the cap layer 304 and a portion of the etch stop layer 302 are removed to form a polished hard mask layer 400'. The planarization process includes, for example, a chemical mechanical polish (CMP) process or the like. In some embodiments, after the planarization process, a top surface of the interlayer dielectric layer 300 is substantially coplanar with a top surface of the polished hard mask layer 400'. The polished hard mask layer 400' is disposed above the metal gate 370 and the spacer structures 212c', and the hard mask layer 400' is separated from the first work function metal layer 340' and the first region 312.

Figure 26A:
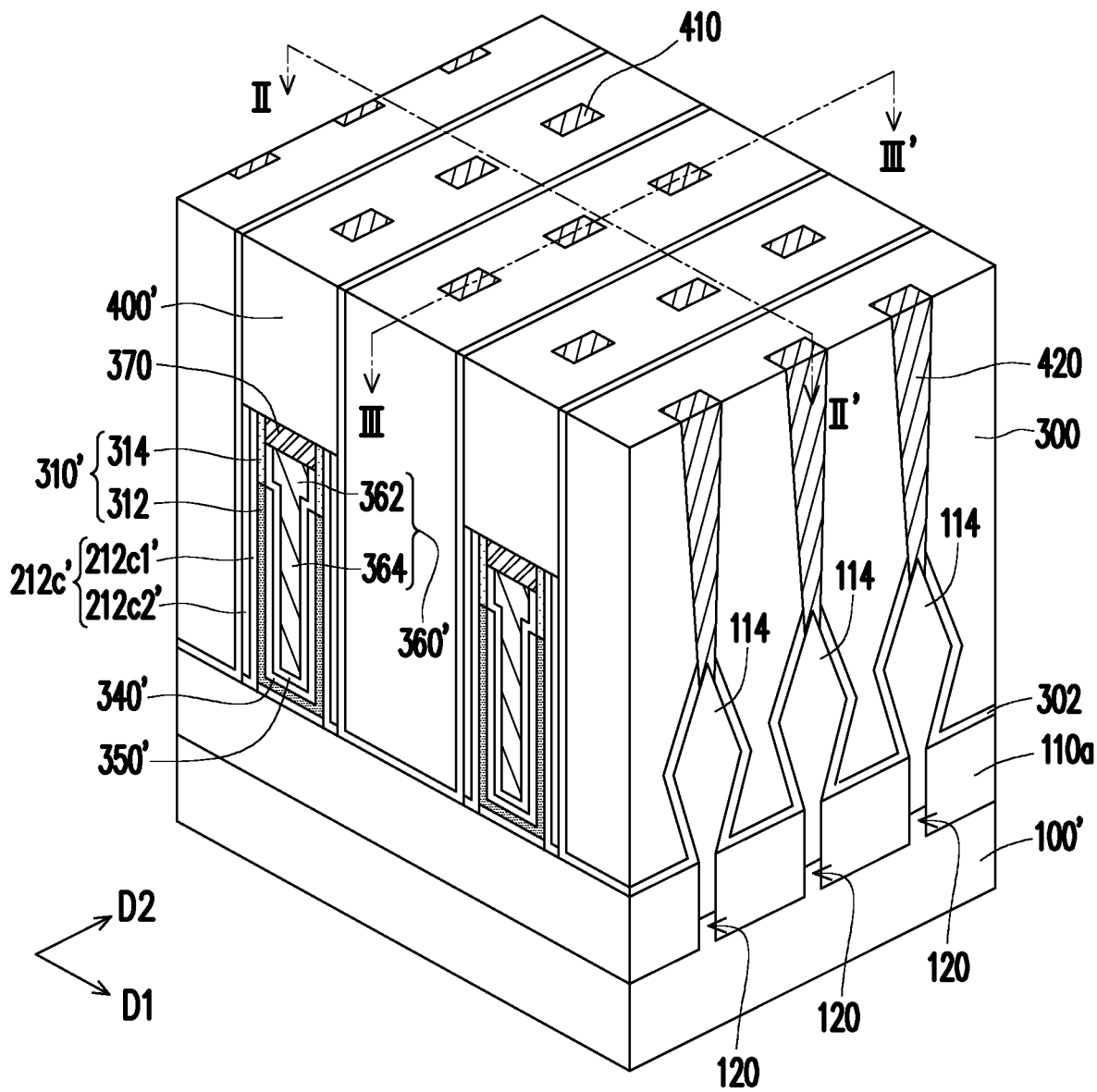
Figure 26B:
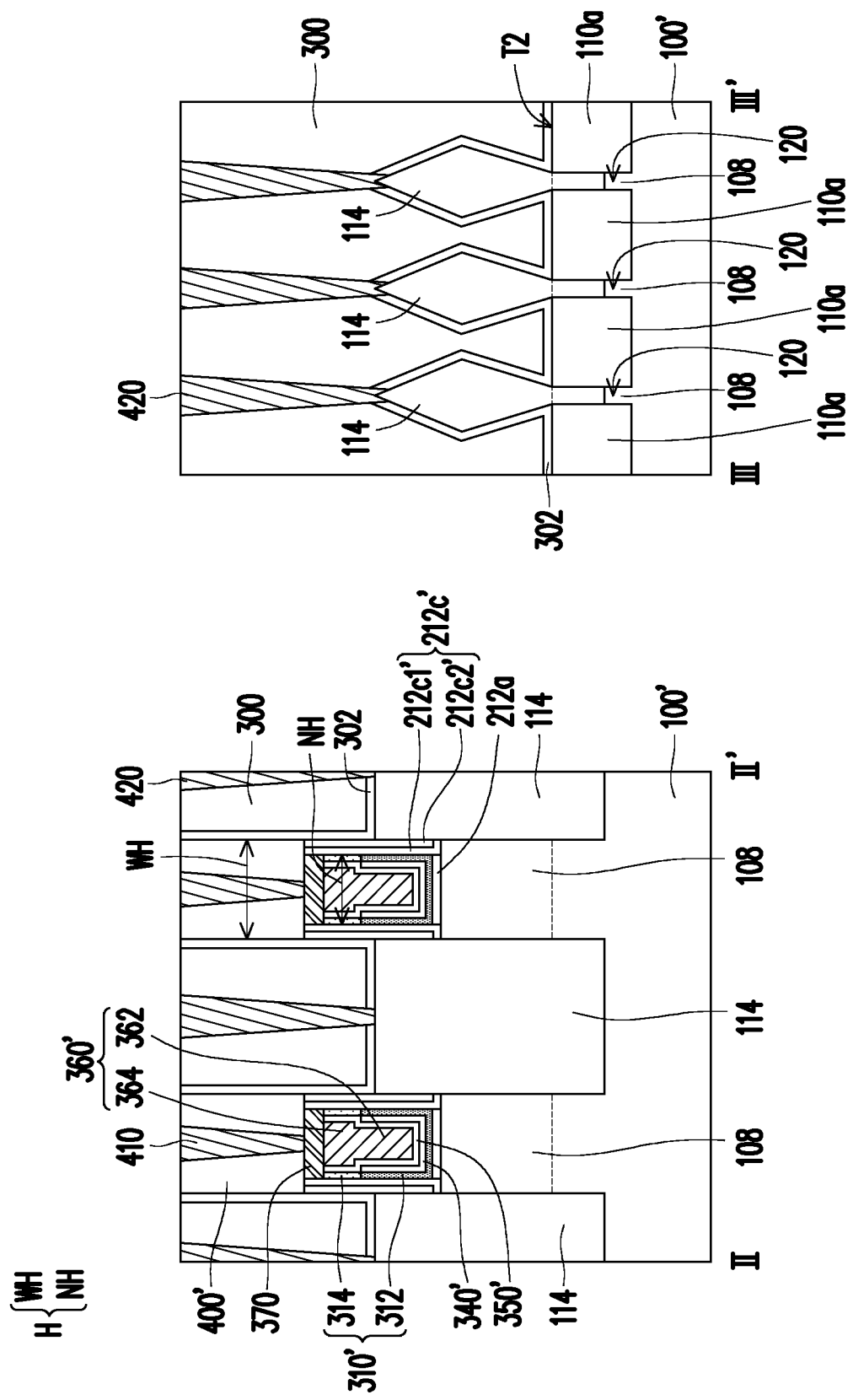

FIG. 26B is a cross-sectional view taken along lines II-II' and III-III' of FIG. 26A. Referring to FIG. 26A and FIG. 26B, gate contacts 410 are formed in the hard mask layer 400', and the conductive contacts 420 are formed in the interlayer dielectric layer 300. The gate contacts 410 are embedded in the hard mask layer 400' and in contact with the metal gate 370. The conductive contacts 420 are embedded in the interlayer dielectric layer 300 and in contact with the strained material structures 114.

In some embodiments, the hard mask layer 400' and the interlayer dielectric layer 300 may include different materials. Therefore, the gate contacts 410 and the conductive contacts 420 may be formed in different processes. For example, a first etching process is performed on the interlayer dielectric layer 300 to form openings expose the strained material structures 114. The conductive contacts 420 are subsequently formed in the openings of the interlayer dielectric layer 300 to electrically connect the strained material structures 114. Then, a second etching process is performed on the hard mask layer 400' to form openings expose the metal gate 370. The gate contacts 410 are subsequently formed in the openings of the hard mask layer 400' to electrically connect the metal gate 370.

In accordance with some embodiments of the disclosure, a semiconductor device includes a substrate, an interlayer dielectric layer, spacer structures, a gate insulating layer, a first work function metal layer and a metal gate. The interlayer dielectric layer is disposed above the substrate. The spacer structures are located in a trench of the interlayer dielectric. The gate insulating layer is disposed between inner sidewalls of the spacer structures. The gate insulating layer includes a first region doped with dipole dopant and second regions without the dipole dopant. The first region is connected with the second regions. The first region is horizontally located between the first work function metal layer and the spacer structures. The metal gate is disposed above the first work function metal layer. The metal gate is disposed between and in contact with the second regions.

In accordance with some embodiments of the disclosure, a semiconductor device includes a substrate, an interlayer dielectric layer, spacer structures, a gate insulating layer, a first work function metal layer, a second work function metal layer and a metal gate. The interlayer dielectric layer is disposed above the substrate. The spacer structures are located in a trench of the interlayer dielectric. The gate insulating layer is disposed between inner sidewalls of the spacer structures. The gate insulating layer includes a first region doped with dipole dopant and second regions without the dipole dopant. The first region is located between bottom portions of the spacer structures, and the second regions are located above the first region. The first work function metal layer is in contact with the first region. The second work function metal layer is disposed on the first work function metal layer. The second work function metal layer covers two ends of the first work function metal layer and is in contact with the gate insulating layer. The metal gate is disposed above the second work function metal layer and in contact with the second regions.

In accordance with some embodiments of the disclosure, a semiconductor device includes a substrate, an interlayer dielectric layer, spacer structures, a gate insulating layer, a first work function metal layer, a second work function metal layer, a glue layer and a metal gate. The interlayer dielectric layer is disposed above the substrate. The interlayer dielectric layer has a trench. The spacer structures are located in the trench. The gate insulating layer is disposed between the spacer structures. The gate insulating layer includes a first region doped with dipole dopant and second regions without the dipole dopant. The first region is located between bottom portions of the spacer structures and the second regions are located above the first region. The first work function metal layer is disposed on the first region. The second work function metal layer covers the first work function metal layer. The glue layer is disposed above the second work function metal layer. The glue layer includes a narrow portion horizontally located between the first work function metal layer and a wide portion located above the narrow portion. The metal gate is disposed above the glue layer and is in contact with the second regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   an interlayer dielectric layer disposed above the substrate;
   spacer structures located in a trench of the interlayer dielectric;
   a gate insulating layer disposed between inner sidewalls of the spacer structures, wherein the gate insulating layer comprises a first region doped with a dipole dopant and second regions without the dipole dopant, wherein the first region is connected to the second regions, wherein the first region and the second regions are respectively in contact with the inner sidewalls of the spacer structures;
   a first work function metal layer, wherein the first region is horizontally located between the first work function metal layer and the spacer structures; and
   a metal gate disposed above the first work function metal layer, wherein the metal gate is disposed between and in contact with the second regions.

2. The semiconductor device of claim 1, wherein the height of the spacer structures is lower than the height of the interlayer dielectric layer.

3. The semiconductor device of claim 1, further comprising:
   a second work function metal layer disposed on the first work function metal layer, wherein the first work function metal layer is in contact with the first region, and the second work function metal layer crosses two ends of the first work function metal layer and is in contact with the gate insulating layer.

4. The semiconductor device of claim 3, further comprising:
   a glue layer disposed between the second work function metal layer and the metal gate, wherein the glue layer comprises a narrow portion located in the first region and a wide portion horizontally located between the second regions.

5. The semiconductor device of claim 4, wherein a part of the wide portion is vertically located between the second work function metal layer and the metal gate.

6. The semiconductor device of claim 1, further comprising:
   a hard mask layer disposed above the metal gate and the spacer structures, and the hard mask layer is separated from the first work function metal layer; and
   a gate contact embedded in the hard mask layer and in contact with the metal gate.

7. The semiconductor device of claim 6, wherein the hard mask layer is located in the trench of the interlayer dielectric and in contact with top ends of the spacer structures.

8. A semiconductor device, comprising:
   a substrate;
   an interlayer dielectric layer disposed above the substrate;
   spacer structures located in a trench of the interlayer dielectric;
   a gate insulating layer disposed between inner sidewalls of the spacer structures, wherein the gate insulating layer comprises a first region doped with a dipole dopant and second regions without the dipole dopant, wherein the first region is located between bottom portions of the spacer structures, and the second regions are located above the first region;
   a first work function metal layer in contact with the first region;
   a second work function metal layer disposed on the first work function metal layer, wherein the second work function metal layer covers two ends of the first work function metal layer and is in contact with the gate insulating layer; and
a metal gate disposed above the second work function metal layer and in contact with the second regions.

9. The semiconductor device of claim 8, wherein the height of the spacer structures is lower than the height of the interlayer dielectric layer.

10. The semiconductor device of claim 8, wherein the second work function metal layer is in contact with the second regions.

11. The semiconductor device of claim 8, further comprising:
a dielectric layer disposed between the first region and the substrate.

12. The semiconductor device of claim 8, further comprising:
a glue layer disposed between the second work function metal layer and the metal gate, wherein the glue layer comprises a narrow portion horizontally located between the first region and a wide portion horizontally located between the second regions.

13. The semiconductor device of claim 12, wherein a part of the wide portion is vertically located between the second work function metal layer and the metal gate.

14. The semiconductor device of claim 8, further comprising:
a hard mask layer disposed above the metal gate and the spacer structures, and the hard mask layer is separated from the first work function metal layer; and
a gate contact embedded in the hard mask layer and in contact with the metal gate.

15. A semiconductor device, comprising:
a substrate;
an interlayer dielectric layer disposed above the substrate, wherein the interlayer dielectric layer has a trench;
spacer structures located in the trench;
a gate insulating layer disposed between the spacer structures, wherein the gate insulating layer comprises a first region doped with a dipole dopant and second regions without the dipole dopant, wherein the first region is located between bottom portions of the spacer structures and the second regions are located above the first region;
a first work function metal layer disposed on the first region;
a second work function metal layer covering the first work function metal layer;
a glue layer disposed above the second work function metal layer, wherein the glue layer comprises a narrow portion horizontally located between the first work function metal layer and a wide portion located above the narrow portion; and
a metal gate disposed above the glue layer and in contact with the second regions.

16. The semiconductor device of claim 15, further comprising:
an etching stop layer disposed above the substrate, wherein the interlayer dielectric layer is disposed above the etching stop layer, and a portion of the etching stop layer is located in the trench.

17. The semiconductor device of claim 16, further comprising:
a hard mask layer disposed above the metal gate and the spacer structures, and the hard mask layer is in contact with the etching stop layer; and
a gate contact embedded in the hard mask layer and in contact with the metal gate.

18. The semiconductor device of claim 15, wherein the metal gate is in contact with inner sidewalls of the second regions, two ends of the second work function metal layer and top surface of the glue layer.

19. The semiconductor device of claim 15, wherein the dipole dopant comprises lanthanum.

20. The semiconductor device of claim 15, wherein a part of the second work function metal layer is located between the wide portion and the second regions.

* * * * *